US007878385B2

(12) United States Patent
Kumar et al.

(10) Patent No.: US 7,878,385 B2
(45) Date of Patent: Feb. 1, 2011

(54) PROBE ARRAYS AND METHOD FOR MAKING

(75) Inventors: Ananda H. Kumar, Fremont, CA (US); Ezekiel J. J. Kruglick, San Diego, CA (US); Adam L. Cohen, Los Angeles, CA (US); Kieun Kim, Pasadena, CA (US); Gang Zhang, Monterey Park, CA (US); Richard T. Chen, Burbank, CA (US); Christopher A. Bang, San Diego, CA (US); Vacit Arat, La Canada Flintridge, CA (US); Michael S. Lockard, Lake Elizabeth, CA (US); Uri Frodis, Los Angeles, CA (US); Pavel B. Lembrikov, Santa Monica, CA (US); Jeffrey A. Thompson, Los Angeles, CA (US)

(73) Assignee: Microfabrica Inc., Van Nuys, CA (US)

( * ) Notice: Subject to any disclaimer, the term of this patent is extended or adjusted under 35 U.S.C. 154(b) by 307 days.

(21) Appl. No.: 11/929,539

(22) Filed: Oct. 30, 2007

(65) Prior Publication Data

US 2008/0093424 A1 Apr. 24, 2008

Related U.S. Application Data

(63) Continuation of application No. 11/173,241, filed on Jun. 30, 2005, now abandoned, which is a continuation-in-part of application No. 11/028,958, filed on Jan. 3, 2005, now abandoned, and a continuation-in-part of application No. 10/434,493, filed on May 7, 2003, now Pat. No. 7,250,101, and a continuation-in-part of application No. 11/029,217, filed on Jan. 3, 2005.

(51) Int. Cl.
*B23K 31/02* (2006.01)

(52) U.S. Cl. .................................. 228/180.22; 228/215

(58) Field of Classification Search ........................ None
See application file for complete search history.

(56) References Cited

U.S. PATENT DOCUMENTS 3,909,332 A 9/1975 Yerman ....................... 156/309

(Continued)

FOREIGN PATENT DOCUMENTS

| GB | 792920 | | 4/1958 |
| JP | 56-160048 A | * | 12/1981 |
| JP | 07-323654 | | 12/1995 |
| JP | 09-279365 | | 10/1997 |

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Kiley Stoner
(74) *Attorney, Agent, or Firm*—Dennis R. Smalley

(57) ABSTRACT

Embodiments of invention are directed to the formation of microprobes (i.e. compliant electrical or electronic contact elements) on a temporary substrate, dicing individual probe arrays, and then transferring the arrays to space transformers or other permanent substrates. Some embodiments of the invention transfer probes to permanent substrates prior to separating the probes from a temporary substrate on which the probes were formed while other embodiments do the opposite. Some embodiments, remove sacrificial material prior to transfer while other embodiments remove sacrificial material after transfer. Some embodiments are directed to the bonding of first and second electric components together using one or more solder bumps with enhanced aspect ratios (i.e. height to width ratios) obtained as a result of surrounding the bumps at least in part with rings of a retention material. The retention material may act be a solder mask material.

17 Claims, 50 Drawing Sheets

U.S. PATENT DOCUMENTS

| | | | |
|---|---|---|---|
| 4,306,925 A | 12/1981 | Lebow et al. | 156/150 |
| 4,495,385 A * | 1/1985 | Roberts et al. | 381/174 |
| 4,610,062 A * | 9/1986 | Roberts et al. | 29/25.41 |
| 5,048,747 A | 9/1991 | Clark et al. | 238/180.21 |
| 5,106,461 A | 4/1992 | Volfson et al. | 205/125 |
| 5,190,637 A | 3/1993 | Guckel | 205/118 |
| 5,347,086 A * | 9/1994 | Potter et al. | 174/261 |
| 5,433,911 A | 7/1995 | Ozimek et al. | 29/831 |
| 5,829,128 A | 11/1998 | Eldridge et al. | 29/855 |
| 5,891,285 A | 4/1999 | Nakayama | 156/150 |
| 5,917,707 A | 6/1999 | Khandros et al. | 361/776 |
| 5,989,994 A | 11/1999 | Khoury et al. | 438/615 |
| 6,002,179 A | 12/1999 | Chan et al. | 257/781 |
| 6,027,630 A | 2/2000 | Cohen | 205/135 |
| 6,043,563 A | 3/2000 | Eldridge et al. | 257/784 |
| 6,085,968 A * | 7/2000 | Swindlehurst et al. | 228/254 |
| 6,150,186 A | 11/2000 | Chen et al. | 438/14 |
| 6,166,915 A | 12/2000 | Lake et al. | 361/748 |
| 6,239,385 B1 * | 5/2001 | Schwiebert et al. | 174/261 |
| 6,255,126 B1 | 7/2001 | Mathieu et al. | 438/15 |
| 6,268,015 B1 | 7/2001 | Mathieu et al. | 427/96 |
| 6,287,891 B1 | 9/2001 | Sayyah | 438/106 |
| 6,288,198 B1 * | 9/2001 | Mechtel et al. | 528/28 |
| 6,294,840 B1 * | 9/2001 | McCormick | 257/778 |
| 6,359,454 B1 | 3/2002 | Khoury | 324/754 |
| 6,491,968 B1 | 12/2002 | Mathieu et al. | 427/96 |
| 6,572,742 B1 | 6/2003 | Cohen | 204/297.5 |
| 6,586,955 B2 | 7/2003 | Fjelstad et al. | 324/754 |
| 6,627,980 B2 | 9/2003 | Eldridge | 257/678 |
| 6,672,875 B1 | 1/2004 | Mathieu et al. | 439/66 |
| 6,678,948 B1 * | 1/2004 | Benzler et al. | 29/840 |
| 6,727,579 B1 | 4/2004 | Eldridge et al. | 257/692 |
| 6,734,566 B2 * | 5/2004 | Honda | 257/778 |
| 6,827,584 B2 | 12/2004 | Mathieu et al. | 439/66 |
| 6,849,170 B2 | 2/2005 | Jerominek et al. | 205/71 |
| 7,047,638 B2 | 5/2006 | Eldridge et al. | 29/884 |
| 7,074,650 B2 * | 7/2006 | Honda | 438/108 |
| 7,098,540 B1 * | 8/2006 | Mohan et al. | 257/773 |
| 7,160,429 B2 | 1/2007 | Cohen et al. | 205/220 |
| 7,516,879 B1 * | 4/2009 | Buchwalter et al. | 228/180.22 |
| 7,569,164 B2 * | 8/2009 | Sakurai et al. | 252/514 |
| 2003/0127336 A1 | 7/2003 | Cohen et al. | 205/118 |
| 2003/0221968 A1 | 12/2003 | Cohen et al. | 205/118 |
| 2003/0222738 A1 | 12/2003 | Brown et al. | 333/160 |
| 2003/0234179 A1 | 12/2003 | Bang | 205/118 |
| 2004/0000489 A1 | 1/2004 | Zhang et al. | 205/118 |
| 2004/0004001 A1 | 1/2004 | Cohen et al. | 205/118 |
| 2004/0004002 A1 | 1/2004 | Thompson et al. | 205/118 |
| 2004/0007468 A1 | 1/2004 | Cohen et al. | 205/118 |
| 2004/0007470 A1 | 1/2004 | Smalley | 205/118 |
| 2004/0065550 A1 | 4/2004 | Zhang | 205/135 |
| 2004/0065555 A1 | 4/2004 | Zhang | 205/118 |
| 2005/0067292 A1 | 3/2005 | Thompson et al. | 205/118 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

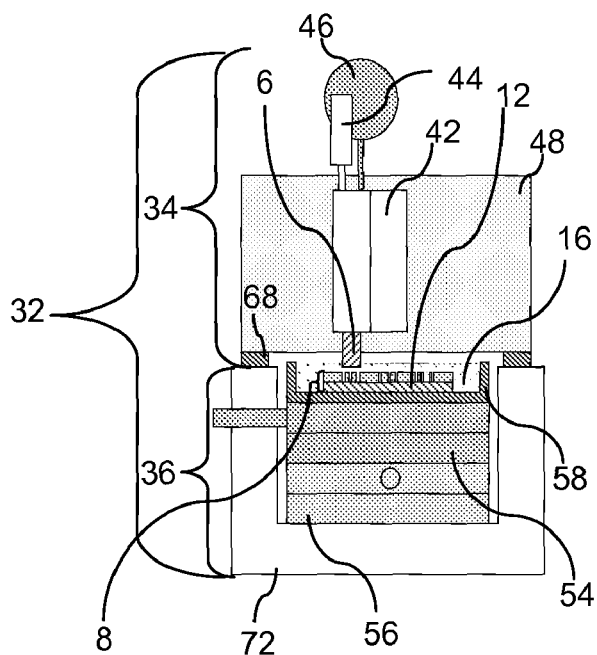
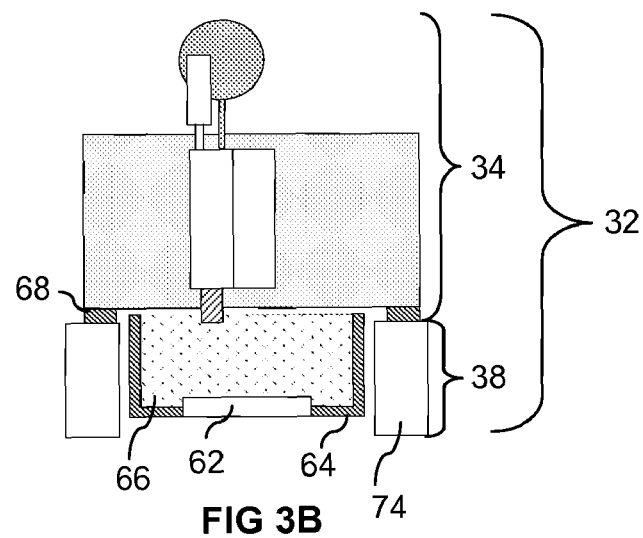
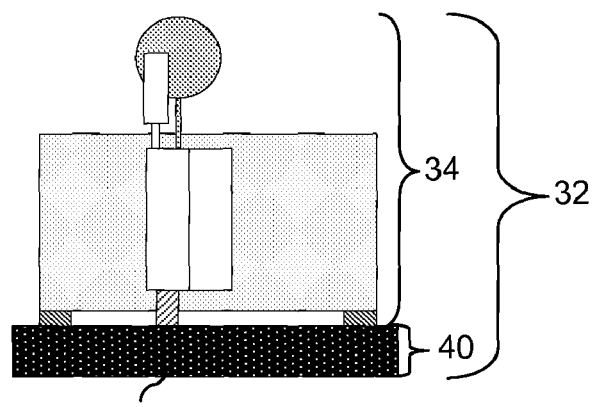

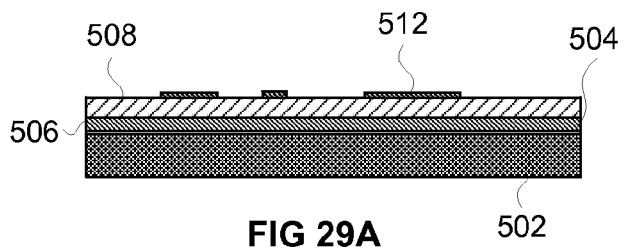
FIG 29A  FIG 29B
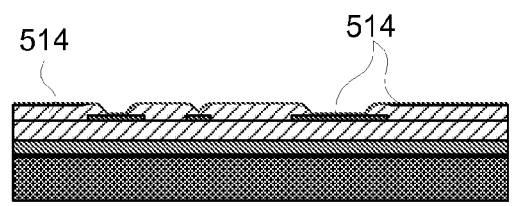
FIG 29C  FIG 29D
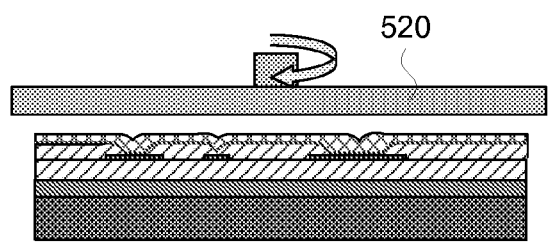
FIG 29E  FIG 29F
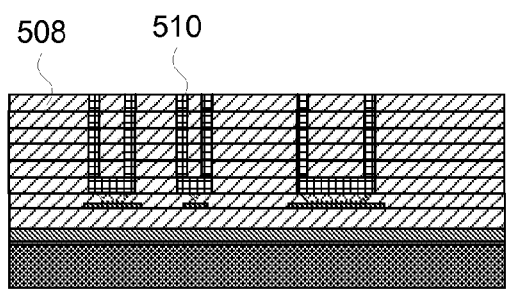
FIG 29G  FIG 29H

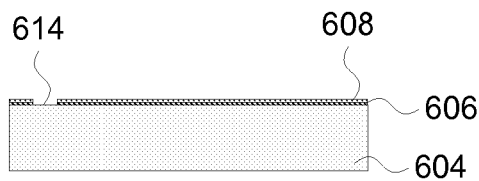
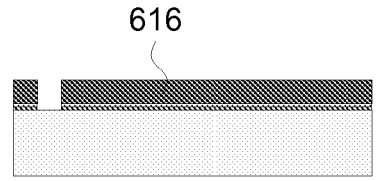
FIG 31A            FIG 31B
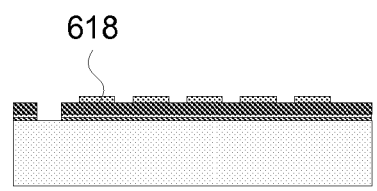
FIG 31C            FIG 31D
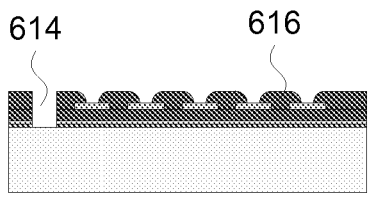
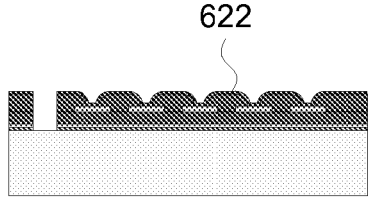
FIG 31E            FIG 31F
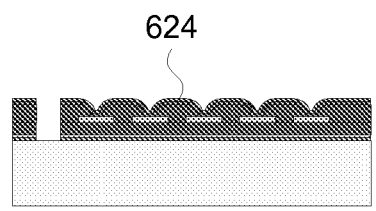
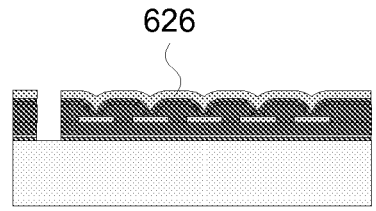
FIG 31G            FIG 31H
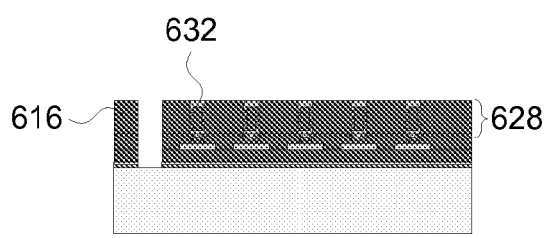
FIG 31I            FIG 31J

616

618

616

622

626

632  628
616       672

634

PROBE ARRAYS AND METHOD FOR MAKING

RELATED APPLICATIONS

This application is a continuation of U.S. patent application Ser. No. 11/173,241, filed Jun. 30, 2005 now abandoned-which is a continuation-in-part of U.S. patent application Ser. Nos. 11/028,958, filed Jan. 3, 2005 now abandoned; Ser. No. 10/434,493, filed May 7, 2003 now U.S. Pat. No. 7,250,101; and Ser. No. 11/029,217, filed Jan. 3, 2005. The '958 application in turn claims benefit of U.S. App. Nos. 60/533,947, filed Dec. 31, 2003; 60/533,933, filed Dec. 31, 2003; 60/536, 865, filed Jan. 15, 2004; and 60/540,511, filed Jan. 29, 2004 and is a continuation in part of U.S. application Ser. No. 10/772,943, filed Feb. 4, 2004; Ser. No. 10/949,738, filed Sep. 24, 2004; and Ser. No. 10/434,493, filed May 7, 2003. The '738 application claims benefit of U.S. App. Nos.: 60/506, 015, filed Sep. 24, 2003; 60/533,933, filed Dec. 31, 2003; and 60/536,865, filed Jan. 15, 2004. Furthermore the '738 application is a CIP of U.S. application Ser. No. 10/772,943, filed Feb. 4, 2004, which in turn claims benefit to U.S. App. Nos.: 60/445,186, filed Feb. 4, 2003; 60/506,015, filed Sep. 24, 2003; 60/533,933, filed Dec. 31, 2003; and 60/536,865, filed Jan. 15, 2004. The '493 application claims benefit of U.S. App. Nos. 60/379,177, filed May 7, 2002, and 60/442,656, filed Jan. 23, 2003. The '217 application claims benefit of U.S. App. Nos. 60/533,975, filed Dec. 31, 2003; 60/540,510, filed Jan. 29, 2004; 60/533,933, filed Dec. 31, 2003; 60/536, 865, filed Jan. 15, 2004; and 60/540,511, filed Jan. 29, 2004, and is a continuation in part of U.S. application Ser. No. 10/949,738, filed Sep. 24, 2004. Each of the above applications is incorporated herein by reference as if set forth in full herein.

FIELD OF THE INVENTION

The present invention relates generally to the field of microelectronic probes (e.g. a microscale or mesoscale interface structures for transferring electric signals between a first circuit or circuit element and a second circuit or circuit element) and electrochemical fabrication processes for producing such probes.

BACKGROUND OF THE INVENTION

Electrochemical Fabrication

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, California such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, Aug. 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., Apr. 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature (i.e. mesoscale and microscale) device fabrication for improved fabrication methods and apparatus.

A need also exists in the electrochemical fabrication field for enhanced techniques that supplement those already known in the field to allow even greater versatility in device design, improved selection of materials, improved material properties, more cost effective and less risky production of such devices, and the like.

Electrical Contact Element Designs, Assembly, and Fabrication:

Compliant electrical contact elements (e.g. probes) can be used to make permanent or temporary electrical contact between electronic components. For example such contacts may be used to convey electrical signals between printed circuit boards, between space transformers and semiconductor devices under test, from probe cards to space transformers via an interposer, between sockets and semiconductors or other electrical/electronic components mounted thereto, and the like.

Various techniques for forming electrical contact elements, various designs for such contact element, and various assemblies using such elements have been taught previously. Examples of such teachings may be found in U.S. Pat. Nos. 5,476,211; 5,917,707; 6,336,269; 5,772,451; 5,974,662; 5,829,128; 5,820,014; 6,023,103; 6,064,213; 5,994,152; 5,806,181; 6,482,013; 6,184,053; 6,043,563; 6,520,778; 6,838,893; 6,705,876; 6,441,315; 6,690,185; 6,483,328; 6,268,015; 6,456,099; 6,208,225; 6,218,910; 6,627,483; 6,640,415; 6,713,374; 6,672,875; 6,509,751; 6,539,531; 6,729,019; and 6,817,052. Each of these patents is incorporated herein by reference as if set forth in full. Various teachings set forth explicitly in this application may be supplemented by teachings set forth in these incorporated applications to define enhanced embodiments and aspects of the invention.

SUMMARY OF THE INVENTION

It is an object of some aspects of the invention to provide an electrochemical fabrication technique capable of fabricating improved probe array or electrical contact structures.

It is an object of some aspects of the invention to provide an improved electrochemical fabrication technique capable of fabricating probe arrays or electrical contact structures.

It is an object of some aspects of the invention to fabricate probe arrays on one substrate and then to transfer them to another substrate.

It is an object so some aspects of the invention to probe probes which are fabricated from a plurality of adhered layers and then to over coat them with a material that provides desired electrical properties. In some variations of this objective the coatings also provide desired wear resistant properties.

It is an object of some embodiments of the invention to provide solder bumps of enhanced height via the use of rings or collars of retention material.

It is an object of some embodiments to provide coating over the main portions of probes while providing a different contact tip material.

Other objects and advantages of various aspects and embodiments of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

A first aspect of the invention provides a method for fabricating a microprobe array, including: fabricating at least a portion of each of a plurality of probes on a temporary substrate; transferring the probes from the temporary substrate to a permanent substrate.

A second aspect of the invention provides a method for fabricating a microprobe, including: fabricating at least a portion of the microprobe on a temporary substrate; transferring the microprobe from the temporary substrate to a permanent substrate.

A third aspect of the invention provides a method for fabricating a compliant electrical contact element array, including: fabricating at least a portion of the compliant electrical contact elements on a temporary substrate; transferring the compliant electrical contact elements from the temporary substrate to a permanent substrate.

A fourth aspect of the invention provides a method for fabricating a compliant electrical contact element adhered to a permanent substrate, including: fabricating at least a portion of the compliant electrical contact element on a temporary substrate; transferring the compliant electrical contact element from the temporary substrate to a permanent substrate.

A fifth aspect of the invention provides a method for bonding a first electric component to a second electric component, including: forming a plurality of solder bumps on a first electric component, wherein the solder bumps are surrounded, at least in part by rings of a retention material; bringing the solder bumps on the first component into contact with bonding locations on a second electric component; and heating the solder to cause melting and cooling the solder to bond the first and second components together, wherein the separation between the first and second components is larger than would have been achieved in similar circumstances in the absence of the columns of retention material.

In a sixth aspect of the invention, a method for bonding a first electric component to a second electric component, includes: forming a plurality of solder bumps on a first electric component, wherein the solder bumps are surrounded, at least in part by rings of a retention material; reflowing the solder material such that the height of the reflowed solder is greater than it would be in absence of the retention material; bringing the solder bumps on the first component into contact with bonding locations on a second electric component; and heating the solder to cause melting and cooling the solder to bond the first and second components together.

Other aspects of the invention will be understood by those of skill in the art upon review of the teachings herein. Other aspects of the invention may involve combinations of the above noted aspects of the invention. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 3A-3C schematically depict side views of various example subassemblies that may be used in manually implementing the electrochemical fabrication method depicted in FIGS. 2A-2F.

FIGS. 29A-29L depict schematic side views of various states of an example of a process for forming multilayer, multi-element probe arrays on a temporary substrate and then transferring and bonding the formed structures to a permanent substrate where the probe tips are shaped via a mold formed from sacrificial material, where the probe elements are separated from the temporary substrate by a meltable material, and where the process includes elements exemplified in the block diagrams of FIGS. 9, 15, and 22.

FIGS. 56A-56F depict various states of a process for re-establishing planarity of probe tip locations after initial work in.

DETAILED DESCRIPTION OF PREFERRED EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
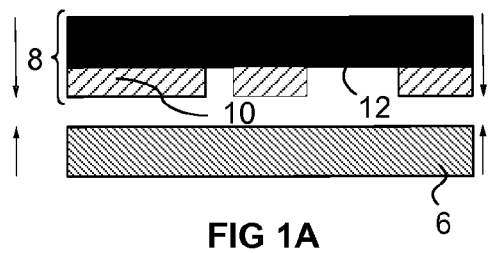
FIGS. 1A-1C schematically depict side views of various stages of a CC mask plating process, while FIGS. 1D-1G schematically depict a side views of various stages of a CC mask plating process using a different type of CC mask.
Figure 1B:
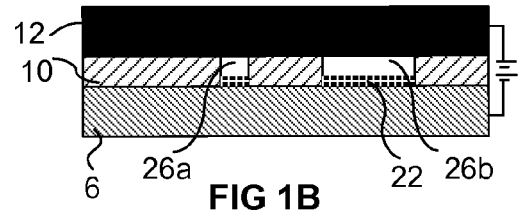
Figure 1C:
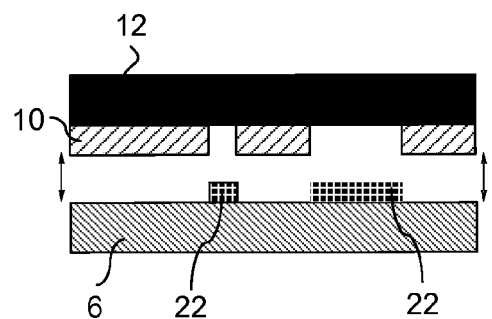
Figure 1D:
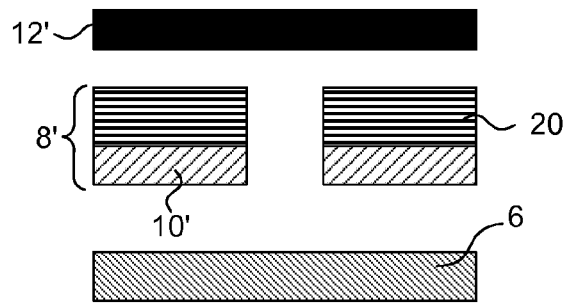
Figure 1E:
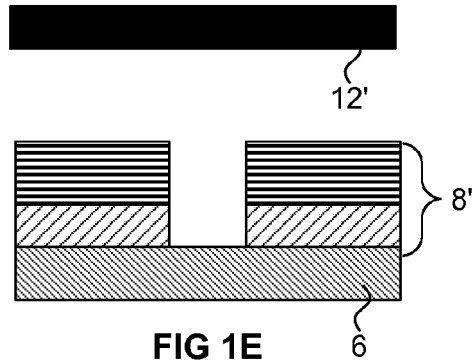
Figure 1F:
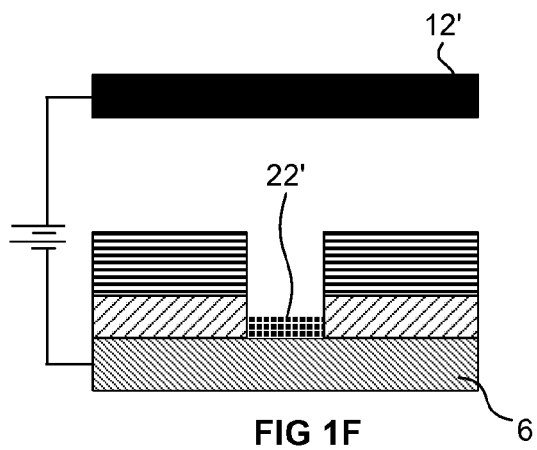
Figure 1G:
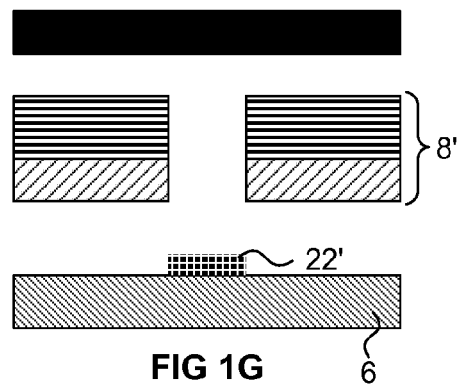
Figure 2A:
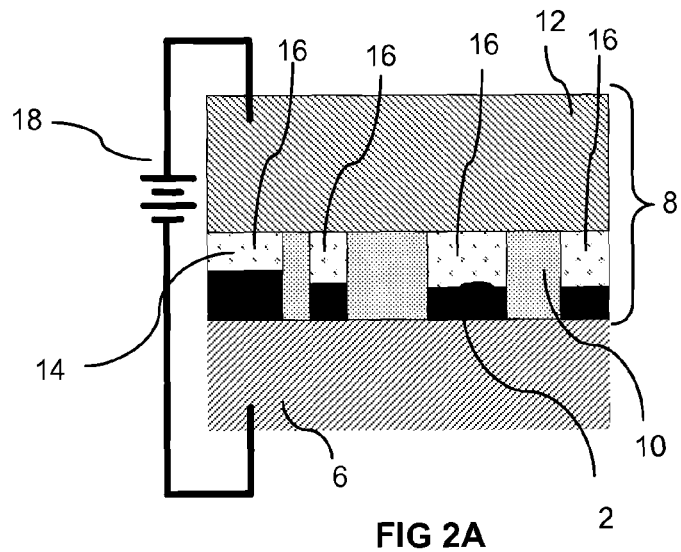
FIGS. 2A-2F schematically depict side views of various stages of an electrochemical fabrication process as applied to the formation of a particular structure where a sacrificial material is selectively deposited while a structural material is blanket deposited.
Figure 2B:
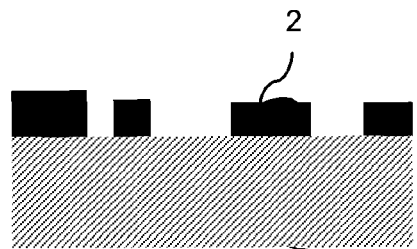
Figure 2C:
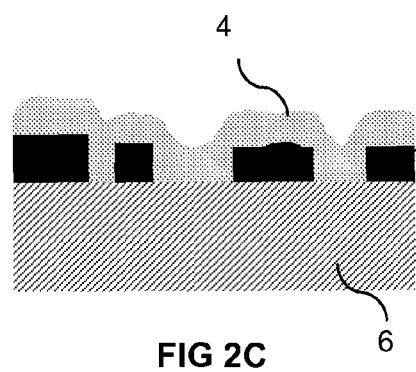
Figure 2D:
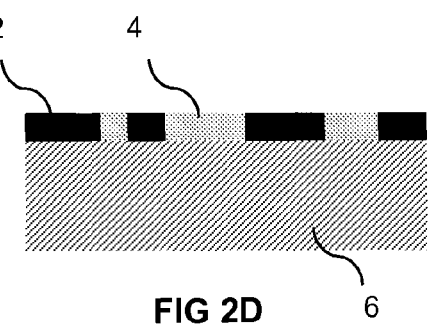
Figure 2E:
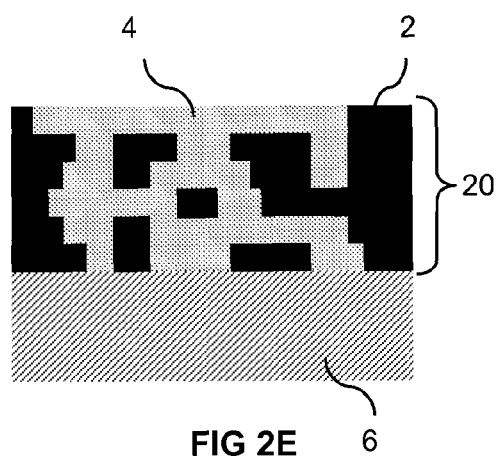
Figure 2F:
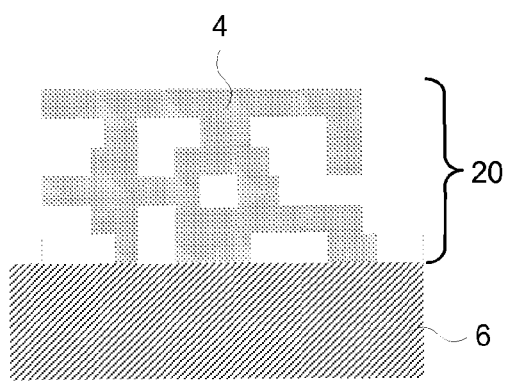
Figure 4A:
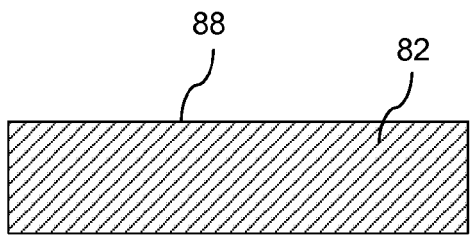
FIGS. 4A-4I schematically depict the formation of a first layer of a structure using adhered mask plating where the blanket deposition of a second material overlays both the openings between deposition locations of a first material and the first material itself.
Figure 4B:
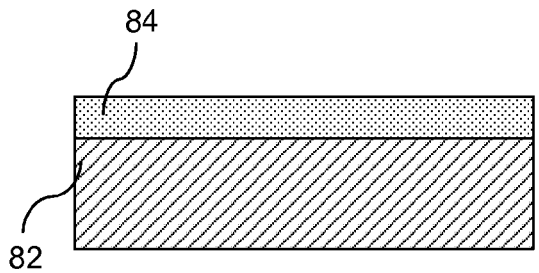
Figure 4C:
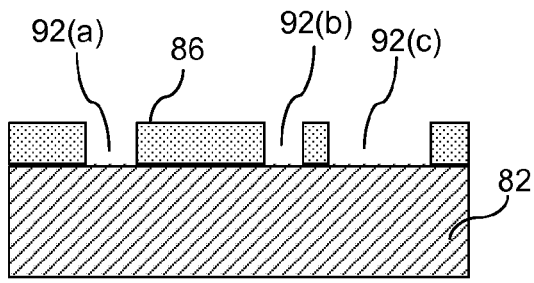
Figure 4D:
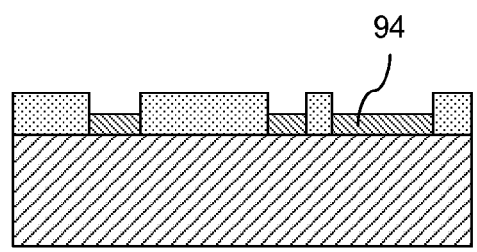
Figure 4E:
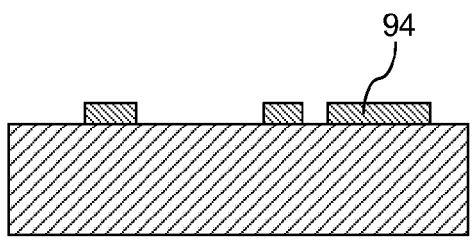
Figure 4F:
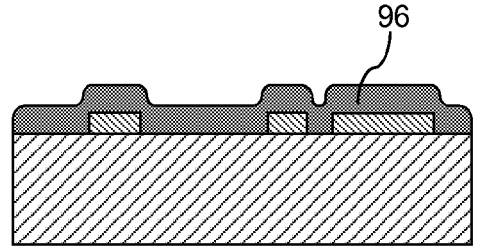
Figure 4G:
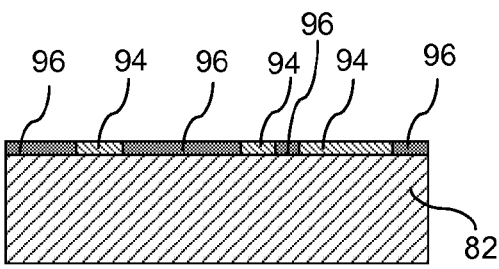
Figure 4H:
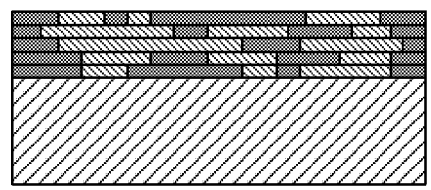
Figure 4I:
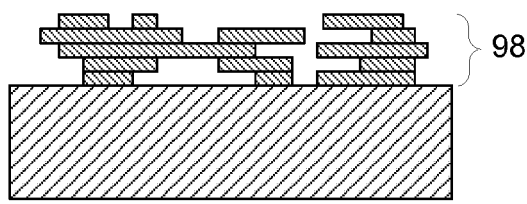

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(*a*)-92(*c*) extending from a surface 86 of the photoresist through the thickness of the photoresist to surface 88 of the substrate 82. In FIG. 4D, a metal 94 (e.g. nickel) is shown as having been electroplated into the openings 92(*a*)-92(*c*). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some of which may be electrodeposited or electroless deposited. Some of these structures may be formed form a single layer of one or more deposited materials while others are formed from a plurality of layers of deposited materials (e.g. 2 or more layers, more preferably five or more layers, and most preferably ten or more layers). In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations, proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Adhered mask may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels. Such use of selective etching and interlaced material deposited in association with multiple layers is described in U.S. patent application Ser. No. 10/434,519, by Smalley, and entitled "Methods of and Apparatus for Electrochemically Fabricating Structures Via Interlaced Layers or Via Selective Etching and Filling of Voids" which is hereby incorporated herein by reference as if set forth in full.

Figure 5:
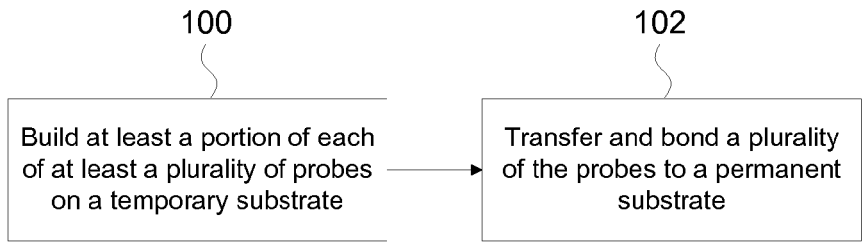
FIG. 5 provides a block diagram of a process of a first generalized embodiment of an aspect of the invention calling for the formation of at least a portion of plurality of probes on a temporary substrate then transferring them to a permanent substrate.

FIG. 5 provides a block diagram of a process of a first generalized embodiment of an aspect of the invention calling for the formation of at least a portion of plurality of probes on a temporary substrate then transferring them to a permanent substrate.

Block 100 calls for the building of at least a portion of each of at least a plurality of probes on a temporary substrate. The building operations of block 100 may be implemented in a variety of different ways. For example, the building operations may include electrochemical fabrication operations such as those described herein earlier as well as those described in the various patents and patent applications incorporated herein by reference. For example, the building operations may include the use of more then one structural material on some layers and or the use of more then one sacrificial material on some layers.

Building techniques may include the use of more then one planarization operation per layer and in some cases no planarization operations may be used on some layers. Deposition operations may be of the selective and/or blanket type. Selective patterning may be performed by selective etching operations (i.e. etching with a mask applied to control etching locations) and/or blanket etching operations (i.e. etching without a mask in place where patterned etching of selected materials may occur based on susceptibly of different materials to the type of etching operation used and the etchant used). Depositions may include electroplating operations, electrophoretic deposition operations, electroless plating operations, various physical and chemical vapor deposition operations (e.g. sputtering), thermal spray metal deposition operations, and the like. Materials deposited may be conductive, semiconductive, or dielectric. Alternative deposition techniques may include flowing over, spreading, spraying, ink jet dispensing, and the like. Sacrificial materials may be separable from structural materials by selective chemical etching operations, planarization operations, melting operations, and the like. Temporary substrates on which structures are formed may be of the sacrificial-type (i.e. destroyed or damaged during separation of deposited materials to the extent they can not be reused), non-sacrificial-type (i.e. not destroyed or excessively damaged, i.e. damaged to the extent they may not be reused, with a sacrificial or release layer located between the substrate and the initial layers of a structure that is formed. Non-sacrificial substrates may be considered reuseable, with little or no rework (e.g. replanarizing one or more selected surfaces or applying a release layer, and the like) though they may or may not be reused for a variety of reasons.

Block 102 calls for the transfer and bonding of a plurality of the probes (e.g. completed probes or partially completed probes) to a permanent substrate.

The permanent substrate may be, for example, a space transformer, other electrical or electronic components, an MLC, a printed circuit board, other dielectric material with selected conductive paths extending through it or on its surface and connecting to the plurality of probes in a desired manner, or to a dielectric material without conductive paths to which conductive paths (e.g. bond wires) may be added after transfer of probes. A substrate is considered permanent if it is the substrate on which the probes are located during their intended functional life. The permanent substrate may or may not be the substrate on which probe testing occurs. Various alternatives for implementing the transfer and bonding process are possible, some examples of which will be discussed hereinafter.

The probes formed may take on a variety of configurations, some of which are described in U.S. Patent Application No. 60/533,933, which was filed Dec. 31, 2003 by Arat et al, and which is entitled "Electrochemically Fabricated Microprobes"; U.S. patent application Ser. No. 10/949,738, filed Sep. 24, 2004 by Kruglick et al., and which is entitled "Electrochemically Fabricated Microprobes"; U.S. Patent Application No. 60/641,341, filed Jan. 3, 2005 by Chen, et al., and which is entitled "Electrochemically Fabricated Microprobes"; and U.S. patent application Ser. No. 11/029,180, filed Jan. 3, 2005 by Chen, et al., and which is entitled "Pin-Type Probes for Contacting Electronic Circuits and Methods for Making Such Probes"; and U.S. patent application Ser. No. 11/028,960, filed Jan. 3, 2005 by Chen, et al., and which is entitled "Cantilever Microprobes For Contacting Electronic Components and Methods for Making Such Probes". Each of these applications is incorporated herein by reference as if set forth in full.

The probes may include tips which are formed in any of a variety of different ways and which may take on a variety of different shapes. Examples of such tip configurations and formation methods are included in U.S. Patent Application No. 60/533,975, which was filed Dec. 31, 2003 by Kim et al. and which is entitled "Microprobe Tips and Methods for Making"; and U.S. patent application Ser. No. 11/029,217, filed Jan. 3, 2005 by Kim, et al., and which is entitled "Microprobe Tips and Methods for Making". Each of these applications is incorporated herein by reference as if set forth in full.

In some embodiments, it may be desirable to form probes from multiple materials. Examples of techniques for forming such multiple material probes are provided in U.S. Patent Application No. 60/533,897 filed Dec. 31, 2003 by Cohen et al. and which is entitled "Electrochemical Fabrication Process for Forming Multilayer Multimaterial Microprobe structures"; and U.S. patent application Ser. No. 11/029,221, filed Jan. 3, 2005 by Cohen, et al., and which is entitled "Electrochemical Fabrication Process for Forming Multilayer Multimaterial Microprobe Structures". Each of these applications is incorporated herein by reference as if set forth in full.

In some embodiments the formation of the probes may include various post layer formation operations which may occur before or after transfer and bonding to the permanent substrate. Some such operations may include diffusion bonding techniques which tend to enhance interlayer adhesion. Some embodiments may employ diffusion bonding or the like to enhance adhesion between successive layers of material. Various teachings concerning the use of diffusion bonding in electrochemical fabrication process is set forth in U.S. Patent Application No. 60/534,204 which was filed Dec. 31, 2003 by Cohen et al. which is entitled "Method for Fabricating Three-Dimensional Structures Including Surface Treatment of a First Material in Preparation for Deposition of a Second Material"; U.S. patent application Ser. No. 10/841,382, filed May 7, 2004 by Zhang, et al., and which is entitled "Method of Electrochemically Fabricating Multilayer Structures Having Improved Interlayer Adhesion"; U.S. patent application Ser. No. 10/841,384, filed May 7, 2004 by Zhang, et al., and which is entitled "Method of Electrochemically Fabricating Multilayer Structures Having Improved Interlayer Adhesion". Each of these applications is incorporated herein by reference as if set forth in full.

As noted above the formation of the probes may involve a use of structural or sacrificial dielectric materials which may be incorporated into embodiments of the present invention in a variety of different ways. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005 by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., and which is entitled "Electrochemical Fabrication Methods Incorporating Dielectric Materials and/or Using Dielectric Substrates". These patent filings are each hereby incorporated herein by reference as if set forth in full herein.

Further teachings about planarizing layers and setting layers thicknesses and the like are set forth in the following US Patent Applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". An additional filings providing teachings related to planarization are found in U.S. patent application Ser. No. 11/029,220, filed Jan. 3, 2005 by Frodis, et al., and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

Figure 6:
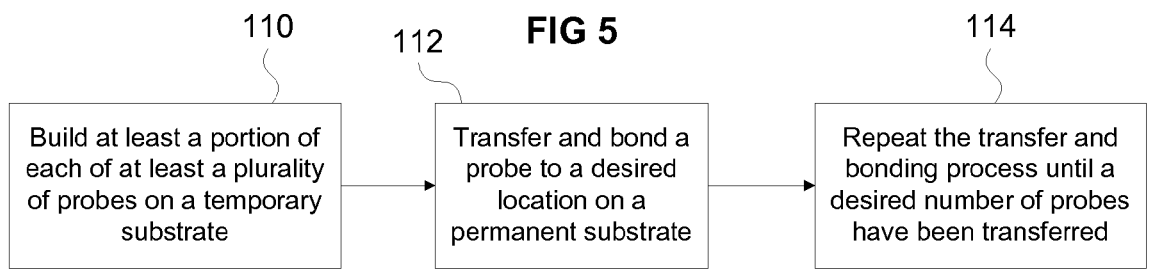
FIG. 6 provides a block diagram of a process of a first variation of the first generalized embodiment where the probes are transferred to the permanent substrate one at a time.

FIG. 6 provides a block diagram of a process of a first variation of the first generalized embodiment of FIG. 5 where the probes are transferred to the permanent substrate one at a time.

Block 110 of FIG. 6 is similar to block 100 of FIG. 5 as it calls for the building of at least a portion of a plurality of probes on a temporary substrate.

Block 112 of FIG. 6 calls for the transfer and bonding of a single probe to a desired location on a permanent substrate while block 114 calls for the repeating of the transfer and bonding operation a plurality of times until a desired number of probes have been transferred.

Figure 7:
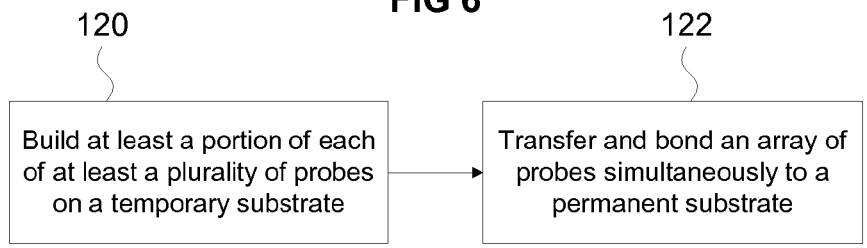
FIG. 7 provides a block diagram of a process of a second variation of the first generalized embodiment where the probes are transferred to the permanent substrate simultaneously as an array.

FIG. 7 provides a block diagram of a process of a second variation of the first generalized embodiment where the probes are transferred to the permanent substrate simultaneously as an array.

Block 120 of FIG. 7 is similar to blocks 110 and 100 of FIGS. 6 and 5 respectively in that it calls for the building of at least a portion of at least a plurality of probes on a temporary substrate.

Block 122 calls for the transfer and bonding of an array of probes simultaneously to a permanent substrate.

Figure 8:
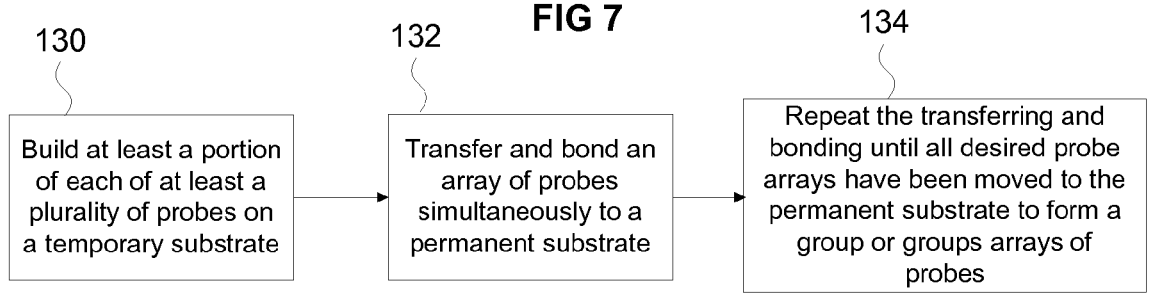
FIG. 8 provides a block diagram of a process of a third variation of the first generalized embodiment where the probes are transferred to the permanent substrate as a series of separately placed arrays.

FIG. 8 provides a block diagram of a process of a third variation of the first generalized embodiment where the probes are transferred to the permanent substrate as a series of separately placed arrays.

Block 130 of FIG. 8 calls for the building of at least a portion of each of at least a plurality of probes on a temporary substrate. Block 132 of FIG. 8 calls for operations similar to those called for by block 122 of FIG. 7 which calls for the transfer and bonding of an array of probes simultaneously to a permanent substrate.

The process of FIG. 8 then continues to block 134 which calls for repeating the transferring and bonding operations of block 132 one or more times until all desired probe arrays have been moved to the permanent substrate to form a group or groups of arrays of probes.

In some alternative embodiments to the processes of FIGS. 5-8, the transfer of individual probes or arrays may occur in series but an initial bonding or at least final bonding of the individual probes or arrays to the permanent substrate (if there is more than one bonding) may occur in parallel. In some alternative embodiments, testing of individual probes or probe arrays may, at least preliminarily, occur prior to transfer while in other alternative embodiments all testing may be delayed until after transfer and bonding is completed. In some embodiments, release of probes from any surrounding sacrificial material may occurred before transfer, or before final adhesion, after final adhesion. Separation of the probes from the temporary substrate may occur before transfer, before final adhesion, after final adhesion, before separation of the probes from surrounding sacrificial material, or after separation of the probes from surrounding sacrificial material. Similarly, separation of probes from any release layer or material (i.e. material located between the probes and the temporary substrate that is intended to allow or aid in separation of probes from the substrate) may occur before transfer, before final adhesion, after final adhesion, before separation of the probes from surrounding sacrificial material, or after separation of the probes from surrounding sacrificial material. Of course in some alternative embodiments the sacrificial material and/or release material may be partially removed at one point in the process while the remainder is removed at a different point in the process. In some embodiments, arrays of probes transferred simultaneously may correspond to only a portion of the probes necessary to contact a single device (e.g. a single semiconductor device under test, DUT), a portion of probes necessary to contact each of a plurality of devices, all the probes necessary to contact a single device, or all the probes necessary to contact more than one device. It should be understood that the various alternatives set forth herein have application to various other embodiments, mutatis mutandis, set forth herein before and herein after.

Figure 9:
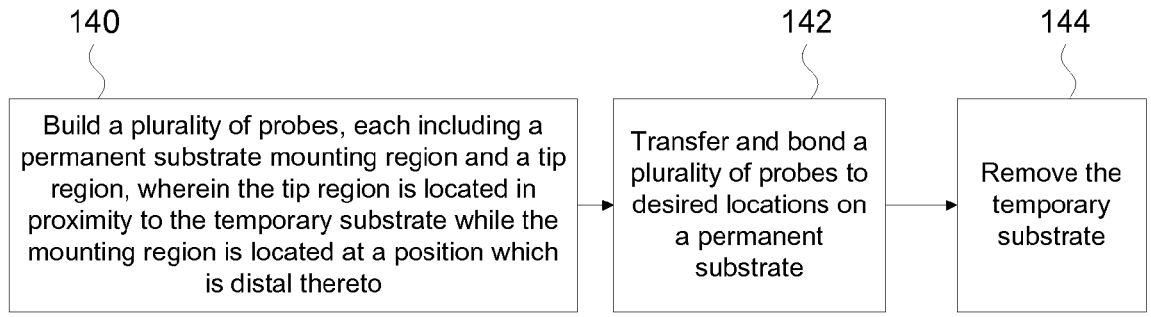
FIG. 9 provides a block diagram of a process of a fourth variation of the first generalized embodiment where the probes are formed tips first and mounting regions last and thereafter transfer to the permanent substrate occurs, and then the temporary substrate is removed.

FIG. 9 provides a block diagram of a process of a fourth variation of the first generalized embodiment where the probes are formed tips first and mounting regions last and thereafter transfer to the permanent substrate occurs, and then the temporary substrate is removed.

Block 140 of FIG. 9 calls for the formation of a plurality of probes where each probe includes a permanent substrate mounting region (i.e. a region which will be mounted to or in proximity to the permanent substrate) and a tip region (i.e. a region which will act as an area for making contact with other electrical/electronic devices when the probe is mounted on the permanent substrate or alternative the region which is most distal from the permanent substrate when the probe is mounted to the permanent substrate). The tip region, during probe formation, is located in proximity to a temporary substrate on which the probes are formed and the mounting region is located at a position which is distal to the temporary substrate. After formation of the probes the process moves forward to block 142 which calls for the transfer and bonding of a plurality of the probes to desired locations on a permanent substrate after which the process moves forward to block 144 which calls for the removal of the temporary substrate.

In some preferred embodiments, the probes are formed (via a series of deposition operations) directly on the tips portions that are formed first while in other preferred embodiments, the probes may be formed separately from the tips and then transferred and bonded to the tips while they are on, or in proximity, to the temporary substrate and thereafter the probe with tip combination, or assembly, may be transferred to the permanent substrate. In some embodiments, the various features and alternatives presented above in association with the processes of FIGS. 5-8, mutatis mutandis, may be applied to form variations to the process of FIG. 9 and vice-a-versa.

Figure 10:
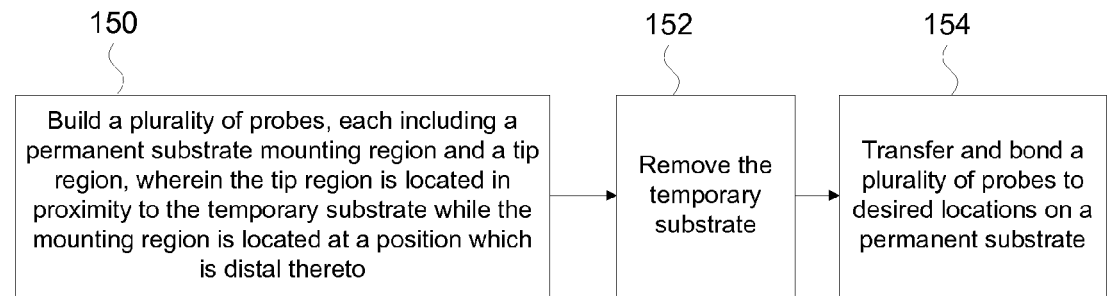
FIG. 10 provides a block diagram of a process of a fifth variation of the first generalized embodiment where the probes are formed tips first and mounting regions last and thereafter the temporary substrate is removed, and then transfer to the permanent substrate occurs.

FIG. 10 provides a block diagram of a process of a fifth variation of the first generalized embodiment where the probes are formed tips first and mounting regions last and thereafter the temporary substrate is removed, and then transfer to the permanent substrate occurs.

The process of FIG. 10 is similar to that of FIG. 9 with the exception that the removal of the temporary substrate (block 152) occurs prior to the transfer and bonding of the plurality of probes to the permanent substrate (block 154).

In some embodiments, the various features and alternatives presented above in association with the processes of FIGS. 5-9, mutatis mutandis, may be applied to form variations to the process of FIG. 10 and vice-a-versa. For example, sacrificial material and/or any release material may be removed at different points in the process. In some embodiments, for example, the tips by themselves or along with some portion of the remaining portion of the probes may be formed separately from the mounting region of the probes and then the various portions of the probes bonded together.

Figure 11:
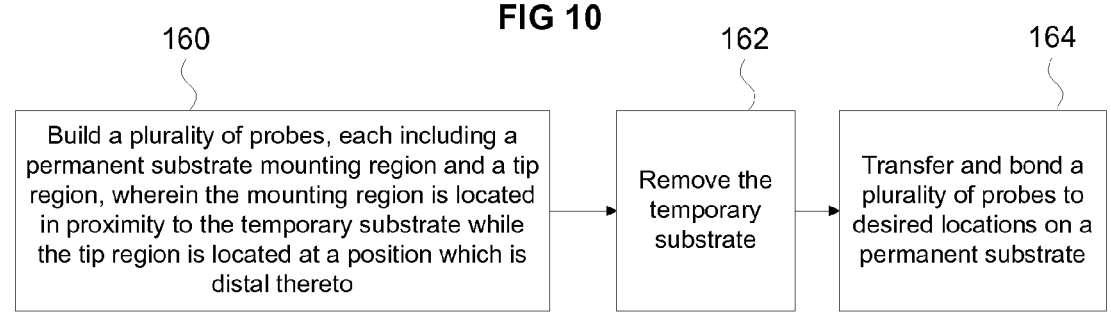
FIG. 11 provides a block diagram of a process of a sixth variation of the first generalized embodiment where the probes are formed mounting regions first and tips last, thereafter the temporary substrate is removed, and then the permanent substrate attached.

FIG. 11 provides a block diagram of a process of a sixth variation of the first generalized embodiment where the probes are formed mounting regions first and tips last, thereafter the temporary substrate is removed, and then the permanent substrate attached.

The process of FIG. 11 is similar in many respects to that of FIG. 10 as bonding to the permanent substrate (block 164) follows removal of the probes from the temporary substrate (block 162) which occurs after formation of the probes (block 160). The difference between the process of FIG. 10 and that of FIG. 11 is in the process of building the probes (block 160) where the process of FIG. 11 involves forming the permanent substrate mounting region portion of the probes in proximity to the temporary substrate while the tips of the probes are formed at locations which are distal to the temporary substrate whereas the reverse is true in the process of FIG. 10.

Of course in further variations of the processes of FIGS. 10 and 11 it will be understood that other differences between the processes may also exist. For example, in some embodiments, the various features and alternatives presented above in association with the processes of FIGS. 5-10, mutatis mutandis, may be applied to form variations to the process of FIG. 11 and vice-a-versa.

Figure 12:
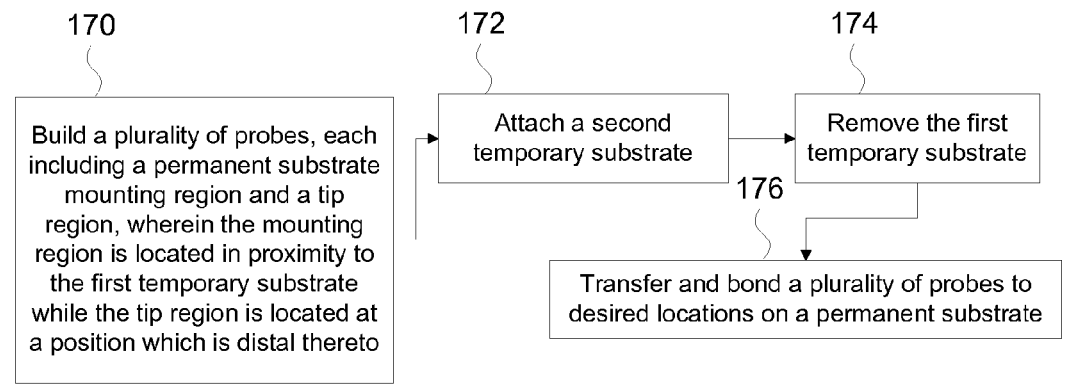
FIG. 12 provides a block diagram of a process of a seventh variation of the first generalized embodiment where the probes are formed mounting regions first and tips last, thereafter a second temporary substrate is attached, and then the first temporary substrate is removed and the permanent substrate attached in its place.

FIG. 12 provides a block diagram of a process of a seventh variation of the first generalized embodiment where the probes are formed mounting regions first and tips last, thereafter a second temporary substrate is attached, bonded, or otherwise made to hold the probes and then the first temporary substrate is removed and the permanent substrate attached in its place. In fact this embodiment may be considered to be one specific implementation of the process of FIG. 11.

The process of FIG. 12 begins with block 170 which calls for the building of a plurality of probes where each probe includes a permanent substrate mounting region and a tip region and where the mounting region is located in proximity to a first temporary substrate on which the probes are formed while the tip region is located at a distal position.

After formation of the probes the process moves forward to block 172 which calls for the attachment of a second temporary substrate. In some implementations of this process the second temporary substrate may be attached to the probes in a plane that is substantially parallel to and opposing the mounting plane of the first temporary substrate. In other implementations the secondary substrate may be mounted to one or more sides of the material or materials that make up the individual layers that formed the probes (e.g. the second temporary substrate is oriented in a plane which is perpendicular to the plane of the first temporary substrate).

From block 172 the process moves forward to block 174 which calls for the removal of the first temporary substrate. And thereafter the process moves forward to block 176 which calls for the transfer and bonding of a plurality of probes to desired locations on a permanent substrate. The removal of the first temporary substrate (block 174) must occur prior to the transfer and bonding to the permanent substrate as there is at least some overlap in positioning of the first temporary substrate and the locations where the permanent substrate is to be attached.

In an alternative embodiment, the first temporary substrate may be removed prior to securing the built probes to the second temporary substrate. In some embodiments, the various features and alternatives presented above in association with the processes of FIGS. 5-11, mutatis mutandis, may be applied to form variations to the process of FIG. 12 and vice-a-versa.

Figure 13:
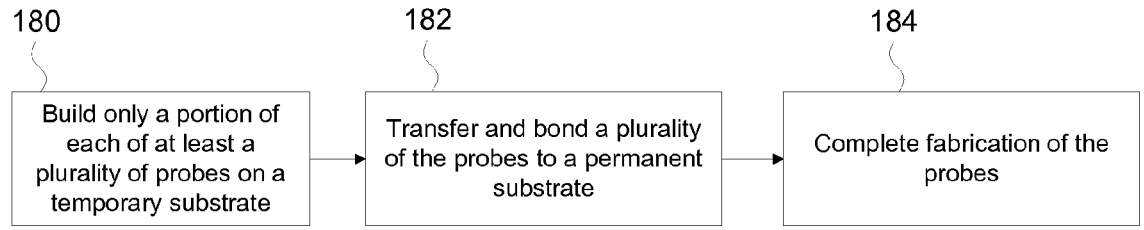
FIG. 13 provides a block diagram of a process of a eighth variation of the first generalized embodiment where the probes are formed only in part prior to transfer to the permanent substrate and thereafter fabrication of the probes is completed.

FIG. 13 provides a block diagram of a process of an eighth variation of the first generalized embodiment where the probes are formed only in part prior to transfer to the permanent substrate and thereafter fabrication of the probes is completed.

The process of FIG. 13 begins with block 180 which calls for the building of only a portion of each of at least a plurality of probes on a temporary substrate. After partial completion of the build the process moves forward to block 182 which calls for the transfer and bonding of a plurality of probes to a permanent substrate.

After completion of transfer, the process moves forward to block 184 which calls for the completion of fabrication of the probes.

In some embodiments, the various features and alternatives presented above in association with the processes of FIGS. 5-12, mutatis mutandis, may be applied to form variations to the process of FIG. 13 and vice-a-versa.

Figure 14:
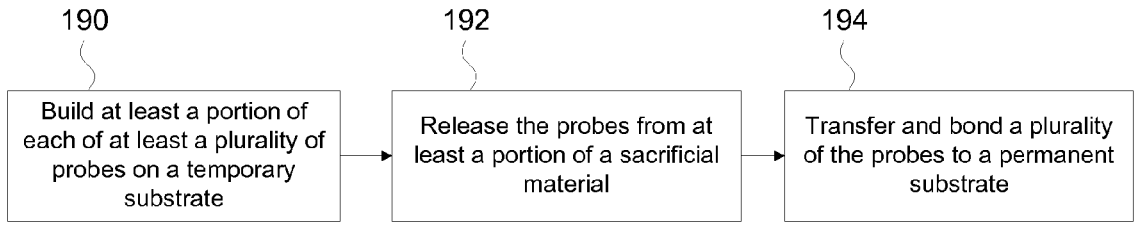
FIG. 14 provides a block diagram of a process of a ninth variation of the first generalized embodiment where the probes are released at least in part from a sacrificial material prior to transfer to the permanent substrate.

FIG. 14 provides a block diagram of a process of a ninth variation of the first generalized embodiment where the probes are released at least in part from a sacrificial material prior to transfer to the permanent substrate.

The process of FIG. 14 begins with block 190 which calls for the building of at least a portion of each of at least a plurality of probes on a temporary substrate.

After build up has proceeded to a desired level the process moves forward to block 192 which calls for the release of the probes from at least a portion of the sacrificial material that was used during the formation of the probes.

Next the process moves forward to block 194 which calls for transferring and bonding a plurality of the probes to a permanent substrate.

In some alternative embodiments, all sacrificial material may be removed prior to transfer. In other embodiments some sacrificial material may intentionally be left with the probes at the time of transfer. In such cases, the remaining sacrificial material may be retained or removed in whole or in part after transfer and/or bonding. In some embodiments, the various features and alternatives presented above in association with the processes of FIGS. 5-13, mutatis mutandis, may be applied to form variations to the process of FIG. 14 and vice-a-versa.

Figure 15:
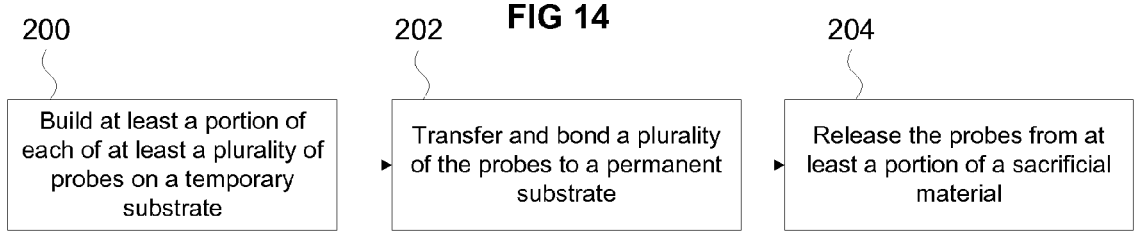
FIG. 15 provides a block diagram of a process of an tenth variation of the first generalized embodiment where the probes are not released from at least one sacrificial material prior to transfer to the permanent substrate and thereafter the probes are released from the at least one sacrificial material.

FIG. 15 provides a block diagram of a process of an tenth variation of the first generalized embodiment where the probes are not released from at least one sacrificial material prior to transfer to the permanent substrate but thereafter the probes are released from the at least a portion of the sacrificial material.

The process of FIG. 15 begins with the building of at least a portion of each of at least a plurality of probes on a temporary substrate as indicated in block 200. After the building has reached a desired level the probes are transferred and bonded to a permanent substrate as indicated by block 202.

After transfer and bonding, the probes are released from at least a portion of a sacrificial material that was used during the build operation as indicated by block 204.

In some alternative embodiments, the probes may be released from all the sacrificial material. In still other alternative embodiments, multiple sacrificial materials may be used and the probes may be released from only a subset of the sacrificial materials after transfer and then from one or more sacrificial materials after bonding. In still other embodiments, structural material forming probes may encapsulate some sacrificial material (i.e. material that would be removed but for the encasement) which will form a permanent part of the probes while other sacrificial material is removed because it is accessible to etchants and/or other removal operations (e.g. melting). In some embodiments, the various features and alternatives presented above in association with the processes of FIGS. 5-14, mutatis mutandis, may be applied to form variations to the process of FIG. 15 and vice-a-versa.

Figure 16:
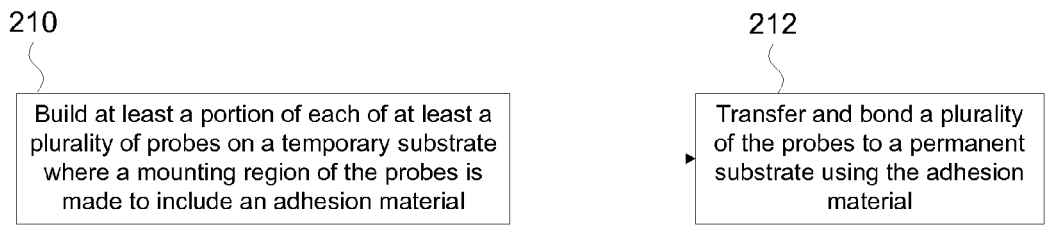
FIG. 16 provides a block diagram of a process of a eleventh variation of the first generalized embodiment where formation of the probes includes the placement of a conductive adhesion material at selected locations on the mounting regions of the probes prior to contacting the probes to the permanent substrate.

FIG. 16 provides a block diagram of a process of an eleventh variation of the first generalized embodiment where formation of the probes includes the placement of a conductive adhesion material at selected locations on the mounting regions of the probes prior to contacting the probes to the permanent substrate.

The process of FIG. 16 begins, as indicated in block 210, with the formation of at least a portion of each of at least a plurality of probes on a temporary substrate where the formation of the probes includes the formation of a mounting region which includes an adhesion material (e.g. solder in the form of a solder bump, gold, conductive epoxy, or the like) that will be used for bonding the probes to a permanent substrate. After formation of the probes, including the placement of adhesion material, the process moves forward to block 212 which calls for the transfer and bonding of a plurality of the probes to a permanent substrate using the adhesion material.

In some embodiments, the various features and alternatives presented above in association with the processes of FIGS. 5-15, mutatis mutandis, may be applied to form variations to the process of FIG. 16 and vice-a-versa.

Figure 17:
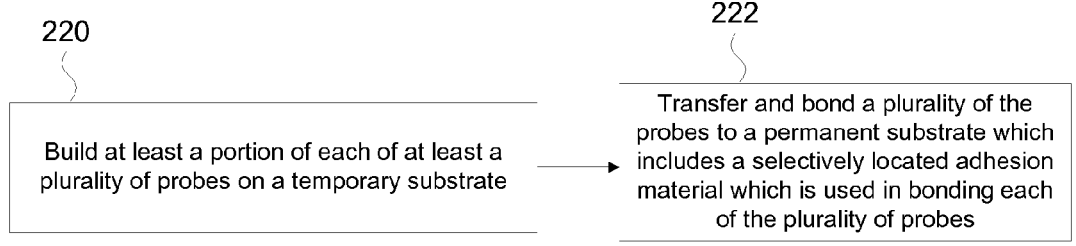
FIG. 17 provides a block diagram of a process of an twelfth variation of the first generalized embodiment wherein a conductive adhesion material is selectively placed at locations on the permanent substrate where attachment to probes is to be made and thereafter the probes and the permanent substrate are attached.

FIG. 17 provides a block diagram of a process of an twelfth variation of the first generalized embodiment wherein a conductive adhesion material is selectively placed at locations on the permanent substrate where attachment to probes is to be made and thereafter the probes and the permanent substrate are attached.

The process of FIG. 17 begins with block 220 which calls for the building of at least a portion of each of at least a plurality of probes on a temporary substrate after which the process moves forward to block 222 which calls for the transfer and bonding of a plurality of the probes to a permanent substrate where the permanent substrate includes selectively located adhesion material which is used in bonding the plurality of probes to the permanent substrate.

In some embodiments, the various features and alternatives presented above in association with the processes of FIGS. 5-16, mutatis mutandis, may be applied to form variations to the process of FIG. 17 and vice-a-versa.

Figure 18:
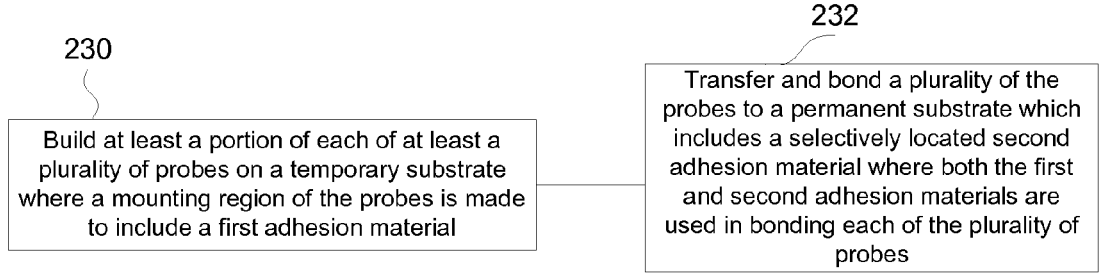
FIG. 18 provides a block diagram of a process of an thirteenth variation of the first generalized where formation of the probes includes the selective placement of a first conductive adhesion material on the mounting regions of the probes prior to contacting the probes to the permanent substrate and wherein a second conductive adhesion material is selectively placed at locations on the permanent substrate where attachment to probes is to be made and thereafter the probes and the permanent substrate are attached using the first and second adhesion materials.

FIG. 18 provides a block diagram of a process of an thirteenth variation of the first generalized embodiment where formation of the probes includes the selective placement of a first conductive adhesion material on the mounting regions of the probes prior to contacting the probes to the permanent substrate and wherein a second conductive adhesion material is selectively placed at locations on the permanent substrate where attachment to probes is to be made and thereafter the probes and the permanent substrate are attached using the first and second adhesion materials.

The process of FIG. 18 is in fact a merging of the processes set forth in FIGS. 16 and 17. The process of FIG. 18 begins with block 230 which calls for the building of at least a portion of each of at least a plurality of probes where a mounting region for the probes is also formed and which includes a first adhesion material.

Next, the process moves forward to block 232 which calls for the transferring and bonding of a plurality of the probes to a permanent substrate where the permanent substrate was made to include selectively located regions of a second adhesion material wherein both the first and second adhesion materials are used in bonding the probes and the permanent substrate together.

In some implementations of this variation the first and second adhesion materials may be the same while in other implementations they may be different materials. For example, in some variations the bonding material may be solder. In other variations the bonding material may be gold. In other variations other materials may be used (e.g. brazing materials, diffusion bonding materials, and the like). In some embodiments, the various features and alternatives presented above in association with the processes of FIGS. 5-17, mutatis mutandis, may be applied to form variations to the process of FIG. 18 and vice-a-versa.

Figure 19:
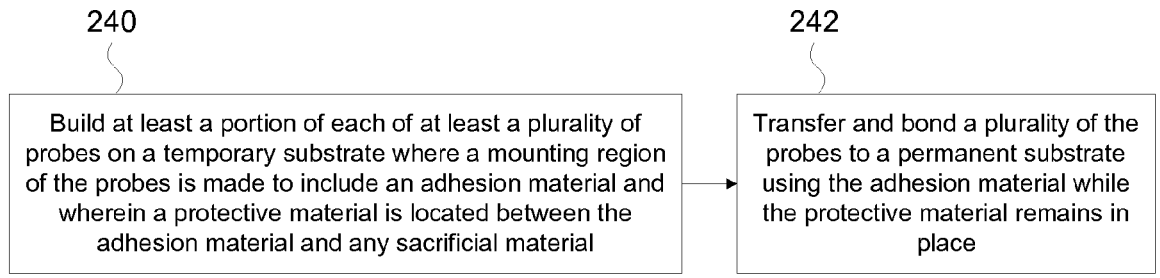
FIG. 19 provides a block diagram of a process of a fourteenth variation of the first generalized embodiment where at least a portion of the sacrificial material is not removed prior to transfer and wherein a protective material is located between the adhesion material and any sacrificial material during the bonding of the permanent substrate and the probes.

FIG. 19 provides a block diagram of a process of a fourteenth variation of the first generalized embodiment where at least a portion of the sacrificial material is not removed prior to transfer and wherein a protective material is located between the adhesion material and any sacrificial material during the bonding of the permanent substrate and the probes.

The process of FIG. 19 begins with block 240 which calls for the building of a plurality of probes on a temporary substrate where a mounting region of the probes is made to include an adhesion material and wherein a protective material is located between the adhesion material and any sacrificial material. After formation of the probes including the associated adhesion material and protective material the process moves forward to block 242 which calls for the transfer and bonding of a plurality of the probes to a permanent substrate and where the bonding is based at least in part on the use of the adhesion material and where the protective material remains in place at least during the bonding process.

Figure 20:
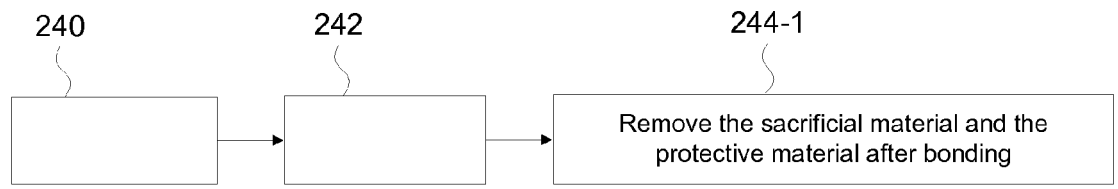
FIG. 20 provides a block diagram of a process of first extension of the fourteenth variation of the first generalized embodiment which includes the removal of the sacrificial material and the protective material after bonding.

FIG. 20 provides a block diagram of a process of a first extension of the fourteenth variation of the first generalized embodiment which includes the removal of the sacrificial material and the protective material after bonding.

The process of FIG. 20 begins with the operations associated with blocks 240 and 242 as discussed above with regard to FIG. 19 and thereafter moves forward to block 244-1.

Block 244-1 calls for the removal of the sacrificial material and the removal of the protective material in some implementations of this variation. The protective material may be removed prior to the removal of the sacrificial material.

In still other implementations the sacrificial material may be removed prior to the removal of the protective material.

In still further implementations the sacrificial material and the protective material may be removed simultaneously.

Figure 21:
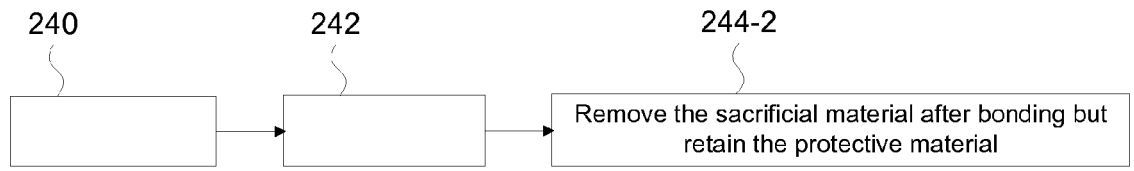
FIG. 21 provides a block diagram of a process of second extension of the fourteenth variation of the first generalized embodiment which includes the removal of the sacrificial material but the retention of the protective material after bonding.

FIG. 21 provides a block diagram of a process of a second extension of the fourteenth variation of the first generalized embodiment which includes the removal of the sacrificial material but the retention of the protective material after bonding.

The process of FIG. 21 begins with the operations of block 240 and 242 as discussed above and thereafter proceeds to block 244-2.

Block 244-2 calls for the removal of the sacrificial material and the retention of the protective material. This retained protective material may be useful in one or more ways, for example, it may be useful in stabilizing the positions of the probes relative to one another and it may also be useful in enhancing the adhesion between the probe array and the substrate.

In other variations of the embodiments of FIGS. 19-21, the adhesion material may be located on the permanent substrate. In still other embodiments, the adhesion material may be in part located on the permanent substrate and in part located with the mounting region of the probes prior to transfer to the permanent substrate. In further variations, the protective material may be located on the permanent substrate or a portion may be located on each of the permanent substrate and in proximity to the mounting region of the probes prior to transfer. In even further embodiments, the various features and alternatives presented above in association with the processes of FIGS. 5-18, mutatis mutandis, may be applied to form variations to the processes of FIGS. 19-21 and vice-a-versa.

Figure 22:
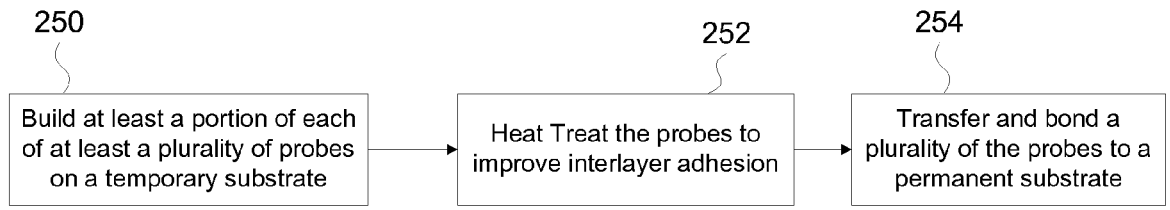
FIG. 22 provides a block diagram of a process of a fifteenth variation of the first generalized embodiment where the probes are heat treated prior to bonding to improve adhesion between layers of a structural material from which the probes have been formed.

FIG. 22 provides a block diagram of a process of a fifteenth variation of the first generalized embodiment where the probes are heat treated prior to bonding to improve adhesion between layers of a structural material from which the probes have been formed.

The process of FIG. 22 begins with block 250 which calls for the building of a plurality of probes on a temporary substrate. After the building of the probes, the process moves forward to block 252 which calls for the heat treatment of the probes to improve adhesion between the layers of material from which the probes have been formed.

After heat treatment the process moves forward to block 254 which calls for the transfer and bonding of the plurality of probes to a permanent substrate.

In some implementations of the process of FIG. 22 the heat treatment may occur prior to removal of a sacrificial material and/or prior to separation of the probes from the temporary substrate. In other implementations separation of the probes from the sacrificial material and/or the substrate may occur after heat treatment but before transfer and bonding while in still other implementations the separation from the sacrificial material and/or the temporary substrate may occur after transfer and bonding. In other implementations, the heat treatment may occur after removal of the sacrificial material and/or after removal of the temporary substrate. In even further embodiments, the various features and alternatives presented above in association with the processes of FIGS. 5-21, mutatis mutandis, may be applied to form variations to the processes of FIG. 22 and vice-a-versa.

Figure 23:
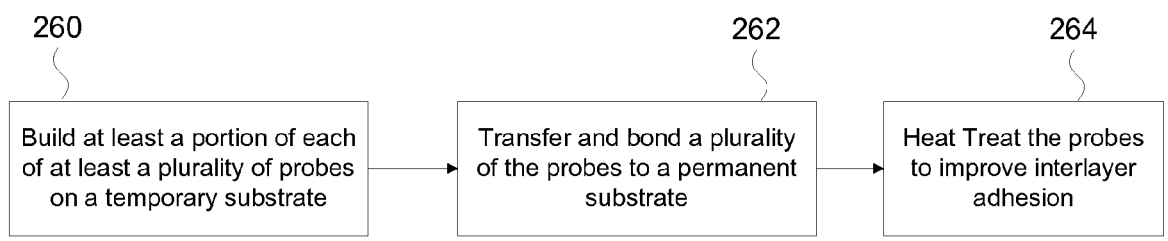
FIG. 23 provides a block diagram of a process of a sixteenth variation of the first generalized embodiment where the probes are heat treated after bonding to improve adhesion between layers of a structural material from which the probes have been formed.

FIG. 23 provides a block diagram of a process of a sixteenth variation of the first generalized embodiment where the probes are heat treated after bonding to improve adhesion between layers of a structural material from which the probes have been formed.

The process of FIG. 23 begins with the formation of a plurality of probes on a temporary substrate as indicated by block 260 and thereafter moves forward to block 262 which calls for the transfer and bonding of the plurality of probes to a permanent substrate.

After transfer and bonding the process moves forward to block 264 which calls for the heat treatment of the probes to improve interlayer adhesion. In some implementations of the process of FIG. 23 separation of the probes from a sacrificial material and/or the temporary substrate may occur intermediate to the operations called for by blocks 260 and 262, intermediate to the operations called for by blocks 262 and 264 or after the operation called for by block 264. In a variation of the process of FIG. 23, heat treatment and bonding may occur simultaneously. In even further embodiments, the various features and alternatives presented above in association with the processes of FIGS. 5-22, mutatis mutandis, may be applied to form variations to the processes of FIG. 23 and vice-a-versa.

Figure 24A:
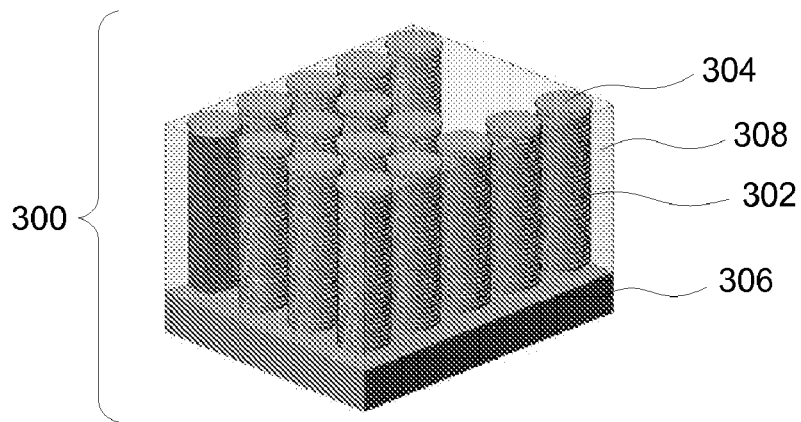
FIGS. 24A-24C depict schematic perspective views of three stages of an example of a process where multiple probe arrays are formed upside down, diced, and then transferred to a permanent substrate to form larger array groups as was exemplified in the block diagram of FIG. 8.
Figure 24B:
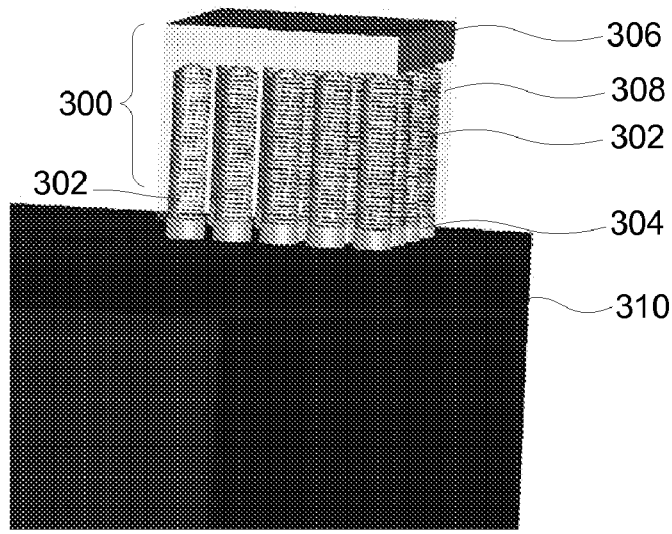
Figure 24C:
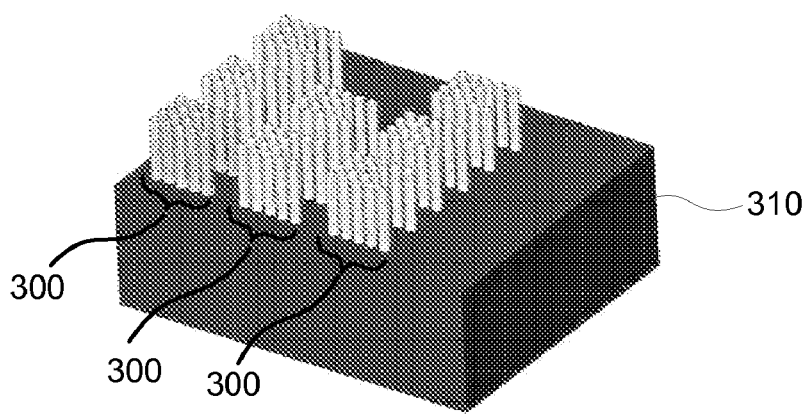

FIGS. 24A-24C depict schematic perspective views of three stages of an example of a process where multiple probe arrays are formed upside down, diced, and then transferred to a permanent substrate to form larger array groups as was exemplified in the block diagram of FIG. 8.

FIG. 24A depicts a state of the process after a plurality of probes 302 including adhesion materials 304 have been built from a plurality of adhered layers on a temporary substrate 306 and then diced into die or arrays 300. FIG. 24A also indicates that the probes 302 remain embedded in sacrificial material 308.

FIG. 24B depicts a state of the process after an individual die 300 has been transferred to a permanent substrate 310 and contact made between probes 302 and substrate 310 via adhesion material 304. As indicated, in this embodiment, the temporary substrate 306 remains attached at the time of transfer and sacrificial material 308 remains in place at the time of transfer.

FIG. 24C depicts a state of the process after a number of operations have been performed. These operations include the release of probes 302 from sacrificial material 308, separation of the probes from temporary substrate 306, and the adhesion of a plurality of probe arrays 300 to permanent substrate 310. In variations of this embodiment, the order of the operations may be varied, for example: (1) adhesion or bonding to the substrate may occur with the transfer of each array or it may be delayed until all arrays or at least a plurality of arrays have been transferred, (2) removal of temporary substrates may occur with the transfer of each array or it may be delayed until all arrays or at least a plurality of arrays have been transferred, (3) removal of sacrificial material may occur with the transfer of each array or it may be delayed until all arrays or at least a plurality of arrays have been transferred, (4) adhesion (or bonding) may occur, then temporary substrates may be removed followed by the removal of sacrificial material, (5) adhesion may occur, then temporary substrates and sacrificial material may be removed simultaneously, (6) adhesion may occur, sacrificial material may be removed, and then the temporary substrates may be removed, (7) temporary substrates may be removed prior to adhesion while removal of sacrificial material may occur thereafter, (8) sacrificial material may be removed prior to adhesion while removal of temporary substrates may be removed thereafter, (9) though some form of initial bonding may occur prior to removal of sacrificial material and/or the temporary substrate, final adhesion may occur after removal of the sacrificial material and/or the substrate. In some alternative embodiments, in addition to an adhesion material, a protective material may be included which separates the adhesion material from the sacrificial material. In some alternative embodiments, adhesion material and or protective material may be located on the permanent substrate initially as opposed to, or in addition to, it being located on the untransferred probe arrays. In still other embodiments, a distinct tip material may be included on the probes prior to transfer or added to the probes after transfer.

In some alternative embodiments, the temporary substrates may be removed prior to transfer and/or sacrificial material may be removed prior to transfer. Other variations of this embodiment will be apparent to those of skill in the art upon review of the teachings herein.

FIGS. 25A-25J depict schematic side views of various states of an example of a process for forming a multilayer two element probe array on a temporary substrate and then transferring and bonding the formed structures to a permanent substrate where the temporary substrate is composed of the sacrificial material and where the process includes elements exemplified in the block diagrams of FIGS. 9 and 15.

Figure 25A:
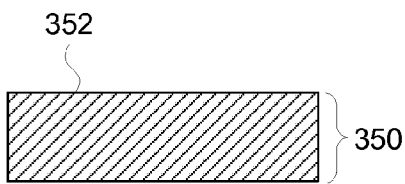
FIGS. 25A-25J depict schematic side views of various states of an example of a process for forming a multilayer two element probe array on a temporary substrate and then transferring and bonding the formed structures to a permanent substrate where the substrate is composed of a sacrificial material and where the probes are surrounded by a sacrificial material which is deposited during formation of the probes and where the process includes elements exemplified in the block diagrams of FIGS. 9 and 15.

FIG. 25A shows the state of the process after a substrate 352 is provided. The substrate 352 preferably is made of the same material 350 as the sacrificial material 350 that will be used during the formation of the structure. In some embodiments, for example, the substrate may be copper.

Figure 25B:
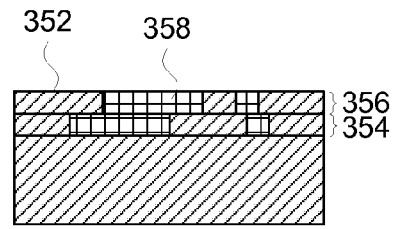

FIG. 25B shows the state of the process after formation of the layers of a multi-layer probe is completed. In FIG. 25B the probe is shown to be formed from a first layer 354 and a second layer 356. Each layer is made up from a structural material 358 and a sacrificial material 352. It will be understood by those of skill in the art that in practice probes may consist of more than the two layers exemplified in this figure.

Figure 25C:
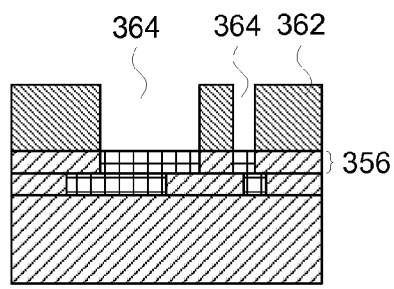

FIG. 25C shows the state of the process after a masking material 362 has been contacted to or adhered to layer 356 with openings 364 formed therein. The openings 364 correspond to locations where a last layer of structural material will be located along with an adhesion material. In some variations of this embodiment, it may not be necessary to deposit a last layer of structural material into the openings in the masking material that will receive the adhesion material.

Figure 25D:
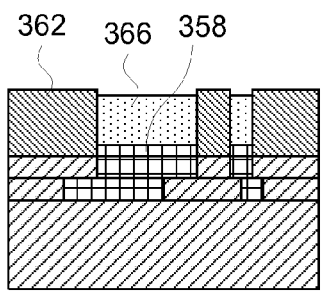

FIG. 25D depicts a state of the process after openings 364 and mask 362 have received a deposition of structural material 358 and a deposition of adhesion material 366. In some variations of this process the structural material may, for example, be nickel, a nickel alloy (e.g. NiP or NiCo) and the adhesion material may be, for example; tin or silver.

Figure 25E:
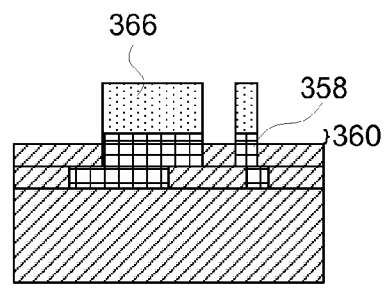

FIG. 25E shows the state of the process after masking material 362 has been removed to reveal the third layer 360 of structural material 358 over which adhesion material 366 has been deposited. In some variations of this process, for example, the masking material may be a liquid photoresist or a dry film photoresist which may be of the positive or negative type.

Figure 25F:
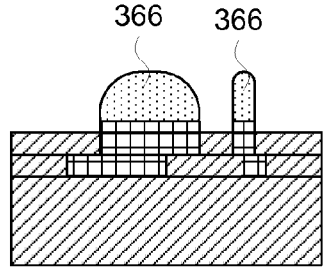

FIG. 25F shows the state of the process after adhesion material 366 (e.g. solder) has been reflowed to give it a rounded or balled shape.

Figure 25G:
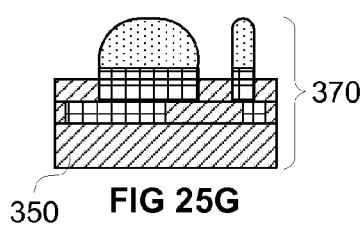

FIG. 25G shows the state of the process after dicing has occurred to isolate individual die and after slicing has occurred to trim down the thickness of the substrate 350. In variations of this process, prior to dicing and slicing the exposed portions of the probes and adhesion material may be covered with a protective material (e.g. a photoresist, wax, a polymer, and the like) which may be readily separated from the formed structure. In such a case, after slicing and dicing, the protective material would be removed (as shown in FIG. 25G).

Figure 25H:
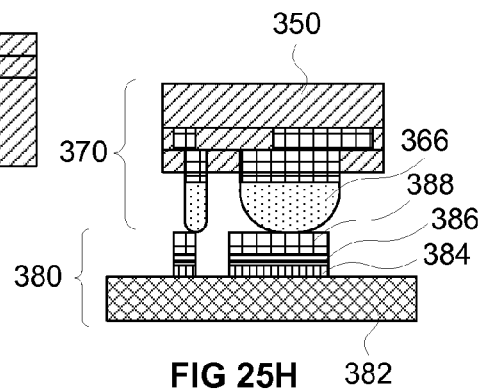

FIG. 25H shows the state of the process after the overall structure and diced substrate 370 has been inverted and made to contact a permanent substrate laminate 380 which includes a permanent substrate 382, an adhesion layer material 384, a seed layer material 386, and a pad material 388.

In some variations of the embodiments pad material 388 may be the same as structural material 358. In other variations of the embodiment pad material 386 may be over-coated with an adhesion material prior to bringing laminate 380 and structure 370 into contact. In still other embodiments, the permanent substrate laminate may have different materials, more materials, or fewer materials (e.g. it may not be necessary to include a seed layer material 386 or an adhesion layer material).

The locations of adhesion layer, seed layer, and pad material on permanent substrate 382 are selected to correspond to locations where contact with adhesion material on probe and substrate structure 370 is to occur. The alignment between structure 370 and pad locations 380 may initially be a rough alignment.

Figure 25I:
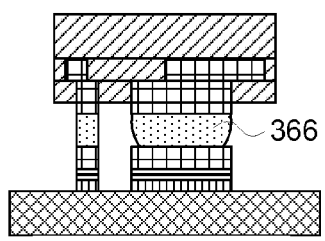

FIG. 25I shows the state of the process after adhesion material 366 is reflowed a second time which may result in further alignment of the probes with the pad locations and also will result in the adhesion of the probes to the permanent substrate.

Figure 25J:
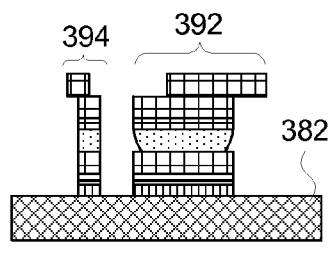

FIG. 25J shows the state of the process after the temporary substrate is removed along with the removal of the sacrificial material making up a portion of the layers forming the probes. FIG. 25J shows the completed state of the process where probe element 392 and probe element 394 are located on and adhered to permanent substrate 382. As can be seen in FIG. 25J not all probe structures in an array need to be of the same size or even of identical structuring or orientation.

FIGS. 26A-26E depict schematic side views of various states of an example of a process for forming multiple, multilayer, multi-element probe arrays on a temporary substrate and then transferring and bonding at least a portion of the formed structures to a permanent substrate where the tips of the probe elements are molded in a patterned substrate, and diffusion bonding occurs prior to release but after transfer and bonding and where the process includes elements exemplified in the block diagrams of FIGS. 9, 15, and 23.

The process exemplified in FIGS. 26A-26E, includes the following primary operations:

1. Production of multiple probe arrays in an upside-down orientation on a suitable substrate (i.e. tips facing toward a temporary substrate). In some implementations of the process, the substrate may be a ceramic material, silicon, a metal, or even a polymer material. The probe arrays may be formed using electrochemical fabrication processes or the like.

2. Selective deposition of a bonding pad material on to proximal (i.e. ends of the probes that will be located in proximity to a permanent substrate or non-tip ends). The bonding pad material for example may consist of gold, gold and nickel, or other metals or metal combinations. These bonding or joining pads may, for example, be formed by electroplating through openings in a patterned photoresist resist layer and will typically correspond, in number and to location, to the probe base or bonding locations in the probe array and will also corresponding to joining pads on a permanent substrate to which the probe arrays will be transferred.

3. Dicing to separate probes into individual probe arrays.

4. Flip-chip bonding of the probe arrays to the permanent substrate. The substrate may be, for example, a polymeric or ceramic package with internal and/or external wiring structures that may be used to route signals from a component that the probe tips contact to other components that connect to the substrate. This operation typically involves the alignment and placement of the probe arrays onto selected locations on the permanent substrate. Methods for bonding of the pads on the probe and permanent substrate are well known to those of skill in the art and may for example, include gold-to-gold diffusion bonding, bonding with gold-tin eutectic alloys, or with lead-tin solder. Diffusion bonding may, for example, occur with moderate heat (e.g. ~400° C.) and pressure (e.g. ~100 lbs/pad). In some embodiments, bonding may occur in such a way so as to allow diffusion bonding to occur between layers of the probes.

5. Dissolving or otherwise removing a sacrificial material component (e.g. copper) of the layers of the forming the probe array structure, for example, using enchants that are selective to sacrificial metal. During this operation, the temporary substrate may also be removed. This operation completes formation the fully assembled probe package.

Figure 26A:
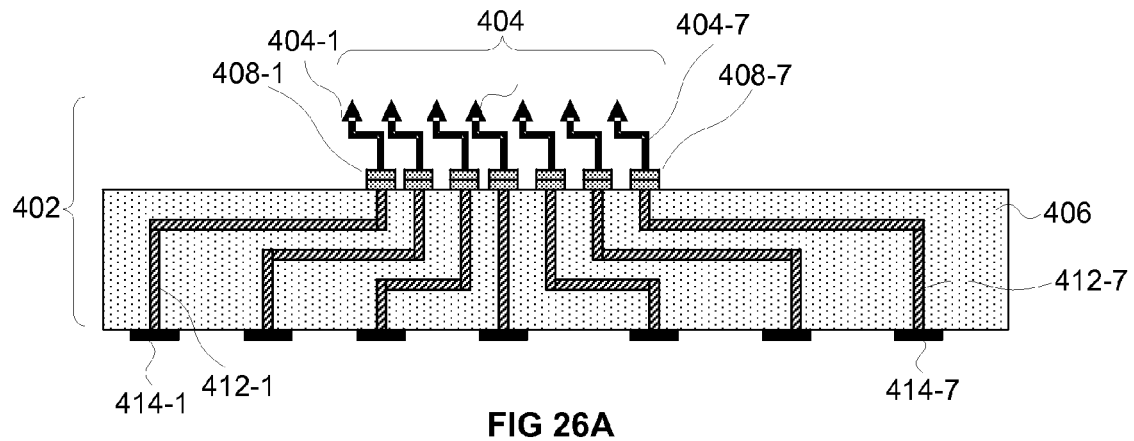
FIGS. 26A-26E depict schematic side views of various states of an example of a process for forming multiple, multilayer, multi-element probe arrays on a temporary substrate and then transferring and bonding the formed structures to a permanent substrate where the tips of the probe elements are molded in a patterned substrate, and diffusion bonding occurs prior to release but after transfer and bonding and where the process includes elements exemplified in the block diagrams of FIGS. 9, 15, and 23.

FIG. 26A shows the state of the process after formation of a probe array package has been completed. The completed package 402 includes one or more electrochemically formed probe arrays 404 comprised of a plurality of probes 404-1 to 404-7. Each of the probe elements is bonded to a permanent substrate 406, which is also a functional substrate (as shown the substrate is a space transformer), by bonding pads 408-1 to 408-7. The substrate includes electrical lead lines 412-1 to 412-7 which in the present example extend to contact pads 414-1 to 414-7 which are located on the backside of the substrate.

In alternative embodiments, the substrate may include additional components such as capacitors, resistors, and inductors and/or shielding conductors that appropriately surround or bound leads 412 so as to reduce signal loss and improve signal integrity.

Figure 26B:
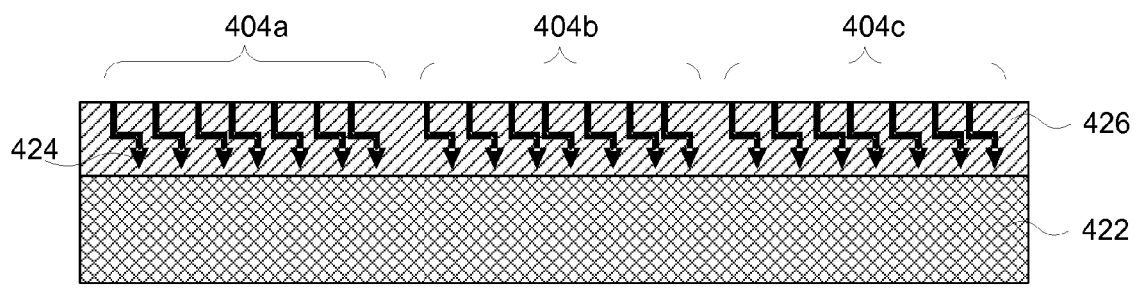

FIG. 26B shows the state of the process after a temporary substrate 422 carrying multiple probe arrays 404a, 404b, and 404c are supplied. In some variations of this embodiment, the probe arrays are electrochemically formed with the tips 424 of the probes facing toward but not contacting the temporary substrate 422. In some alternative embodiments, if the temporary substrate is made from a sacrificial material the probe tips may directly contact the substrate otherwise it is preferred that the tips be separated from the substrate by a release material which may be the same material as a sacrificial material 426 that surrounds the probe structures. The sacrificial material may for example be copper or silver which is deposited during the layer-by-layer build up that was used to form the probe arrays. In some implementations the probe structures may be formed from nickel or a nickel alloy.

Figure 26C:
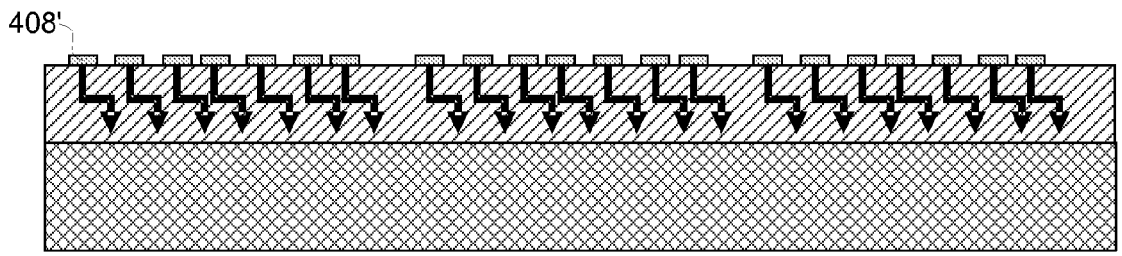

FIG. 26C shows the state of the process after bonding pads 408' have been formed on the backsides of each of the probes in the probe arrays 404.

Figure 26D:
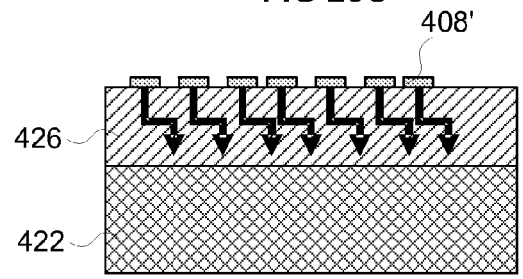

FIG. 26D shows the state of the process after probe arrays 404a, 404b, and 404c have been diced into individual array sections which include part of the temporary substrate 422, sacrificial material 426 along with the probes and bonding pads 408'.

Figure 26E:
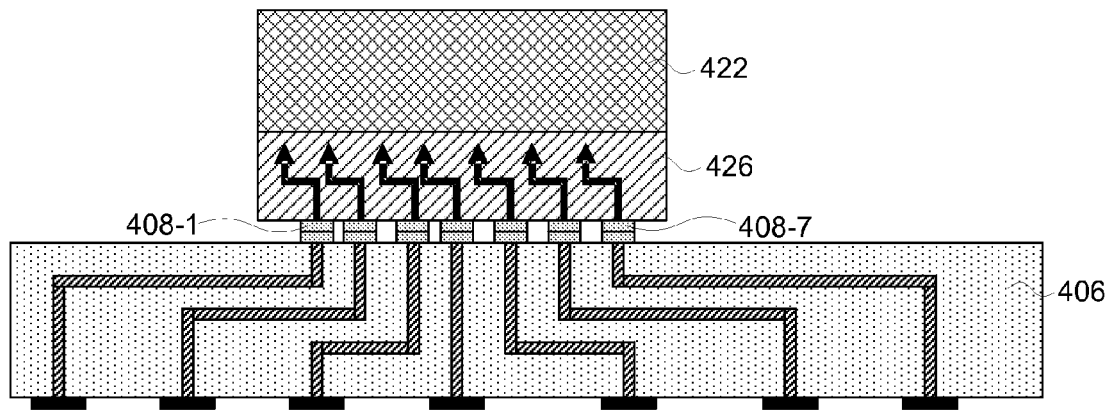

FIG. 26E shows the state of the process after an unreleased diced probe array (i.e. a probe array that is still encapsulated in sacrificial material and/or attached to the temporary substrate) as shown in FIG. 26D is bonded to a permanent substrate 406 via bonding pads 408-1 to 408-7 formed of bonding material 408'. To complete the process the sacrificial material 426 is etched from the structures which causes removal of the sacrificial material as well as the diced portion of temporary substrate 422. The final probe array package that results from such a release is shown in FIG. 26A.

Figure 27A:
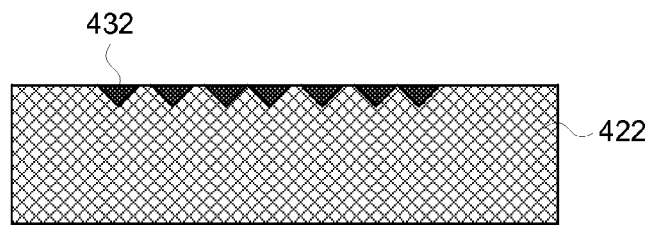
FIGS. 27A-27C depict schematic side views of various states of an example of a process that forms enhanced probe tips for the probes of FIGS. 26A-26E.
Figure 27B:
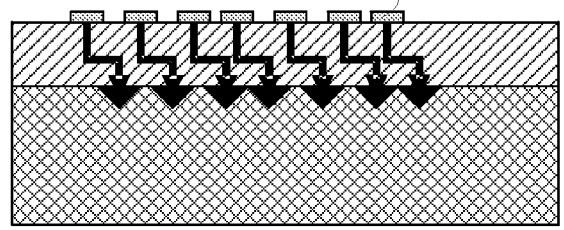
Figure 27C:
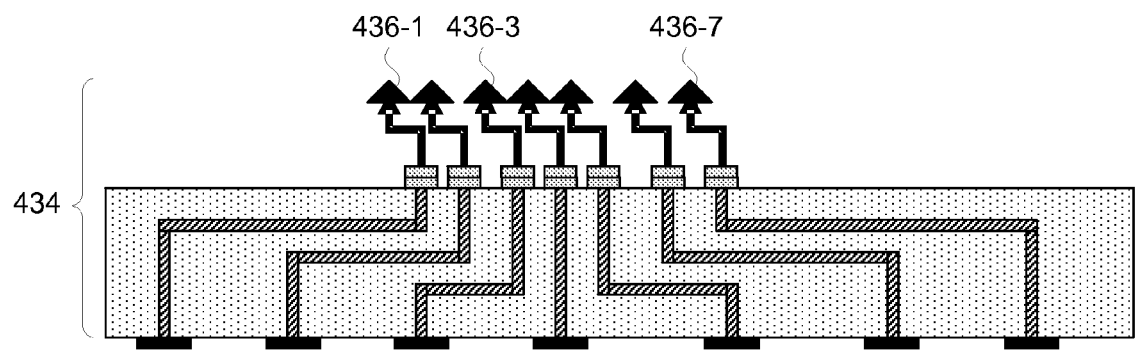

FIGS. 27A-27C depict schematic side views of various states of a process that may be used to form enhanced probe tips on the probes of FIGS. 26A-26E.

If special probe tip configurations or materials are desired it may be possible to enhance the process discussed above in association with FIGS. 26A-26E by adding an initial operation. This initial operation involves the patterning of the temporary substrate with a pattern of holes having locations corresponding to the locations of the probes to be formed and having shapes corresponding to the desired shapes of the probe tips. If the temporary substrate is not formed of a sacrificial material or a material from which the probe tip material can be readily released, the holes or openings may be coated with a release material prior to depositing any tip material into the holes. These openings may then receive a desired probe tip material after which production of the probes via electrochemical fabrication operations may continue such that probes are formed directly onto the deposits of tip material. In some alternative embodiments, the probe portions exclusive of tips may be transferred to the tips after formation and there after the entire probe arrays may be transferred to the permanent substrate.

FIG. 27A shows the state of a process where holes in a temporary substrate 422 have been filled with a desired probe tip material 432 and the surface planarized.

FIG. 27B shows the state of the process after formation of the probes has been completed and bonding pad material 408' added. The state of the process in FIG. 27B is analogous to the state of the process shown in FIG. 26D.

FIG. 27C shows the state of the process after probe array package 434 has been completed where the resulting probes have enhanced tips 436-1 to 436-7.

In some variations of the embodiments of FIGS. 26 and 27, the sacrificial material may include in whole or in part a polymeric material, such as a photo-resist or polyimide. In such cases, the polymeric material may be removed after bonding, for example, via plasma etching, chemical stripping, or the like. In still other variations if the polymeric material has been selectively located it may be retained as part of the final structure.

FIGS. 28A-28I depict schematic side views of various states of an example of a process for forming multilayer, multi-element probe arrays on a temporary substrate and then transferring and bonding the formed structures to a permanent substrate where the tips of the probe elements are formed in a patterned substrate from a tip material which may be different from a structural material, where prior to transfer individual probe arrays are analyzed for high yield probability and thereafter selected for use or non-use, and where the process includes elements exemplified in the block diagrams of FIGS. 9, 15, and 23.

Figure 28A:
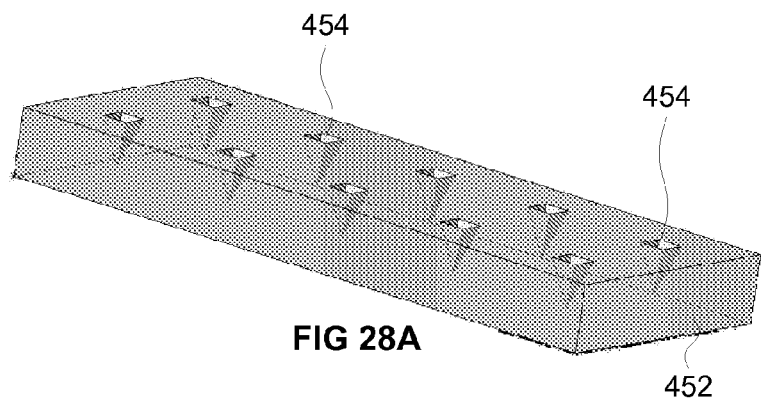
FIGS. 28A-28I depict schematic side views of various states of an example of a process for forming multilayer, multi-element probe arrays on a temporary substrate and then transferring and bonding the formed structures to a permanent substrate where the tips of the probe elements are molded in a patterned substrate of a tip material which may be different from a structural material, where prior to transfer individual probe arrays are analyzed for high yield probability and thereafter selected for use or non-use, and where the process includes elements exemplified in the block diagrams of FIGS. 9, 15, and 23.

FIG. 28A shows the state of the process after a temporary substrate 452 is selectively etched into to form voids 454 at locations where probe tips are to be formed wherein the voids are patterned to have the shape complimentary to that desired for the tips. In some implementations of the present process the substrate 452 may be silicon and sharp points or wedge shapes may be obtained by anisotropic etching whereas hemispheres or other rounded shapes may be obtained by isotropic etching.

Figure 28B:
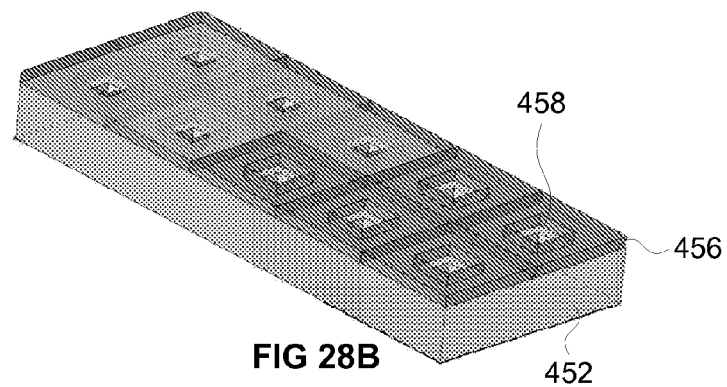

FIG. 28B depicts the state of the process after a masking material 456 is applied to substrate 452 and is patterned to create openings 458 over the void regions 454 where probe tips are to be formed. In some implementations where necessary a seed layer may be applied to the substrate surface and into voids 454 prior to application and patterning of the masking material.

Additionally or alternatively a release layer material may be applied to the substrate surface and into the voids if necessary to aid in the release of the probes and probe tips from the substrate. In still other variations, if desired, the seed layer material may be applied after application of the masking material and the patterning of the masking material. Similarly if desired a release material may be applied over the masking material and into the voids in substrate 452. In some embodiments a release material may be applied over a seed layer material while in other embodiments the application order may be reversed.

Figure 28C:
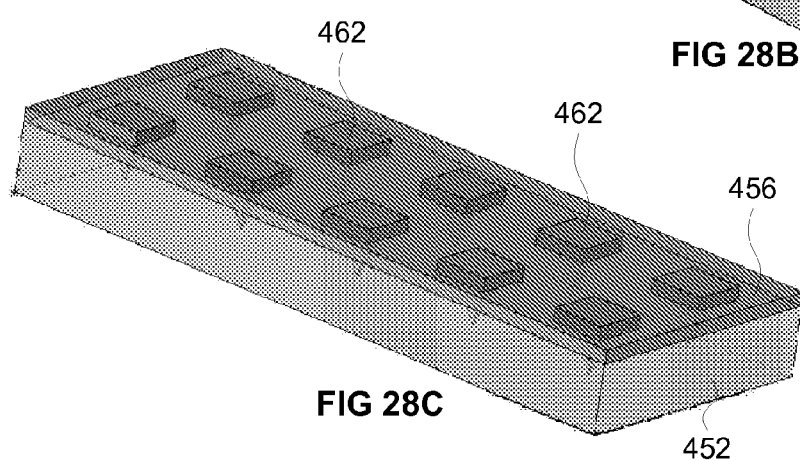

FIG. 28C depicts the state of the process after a probe tip material 462 has been deposited into openings 458 in the masking material and voids 454 in the substrate. If necessary (for example, in embodiments where a seed layer or release layer overlays the masking material) the surface of tip material 462 and masking material 456 may be planarized to a height greater than that of the first layer thickness (i.e. at level which is above a top level of the first layer). In some embodiments, it may be desirable to planarize the deposited materials at the layer thickness but due to planarization tolerances this may cause difficulties when additional planarization operations will be used during formation of the first layer. If the planarization operation is used to remove seed layer or release layer material located above sacrificial material 456 then the height of planarization is still preferably greater then the layer thickness (or equal to the layer thickness) but less then the thickness of the deposited masking material. This will ensure appropriate removal of unneeded portions of the release material or seed layer material.

Figure 28D:
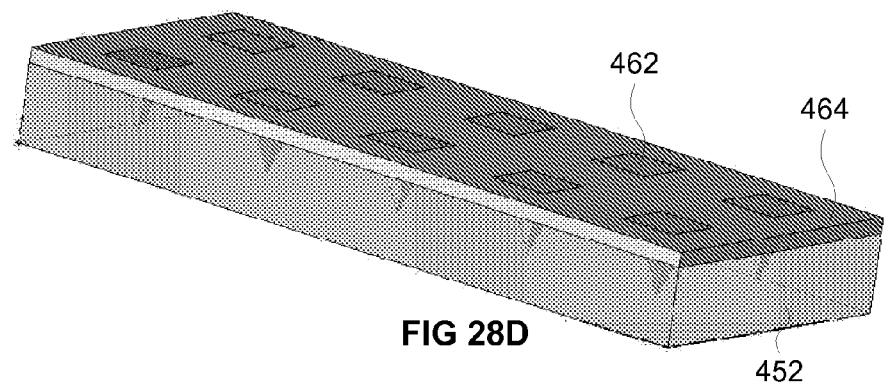

FIG. 28D depicts the state of the process after masking material 456 has been removed and a sacrificial material 464 has been deposited and the deposits of tip material and sacrificial material planed to a height of the first layer thickness (i.e. planed to a level corresponding to the upper level of the first layer). In a variation of the present process the masking material initially used may have overlaid voids 454 and sacrificial material may have been selectively deposited, the masking material may then have been removed and tip material deposited (e.g. via plating, sputtering, or the like), whereby the same result depicted in FIG. 28D would be obtained.

Figure 28E:
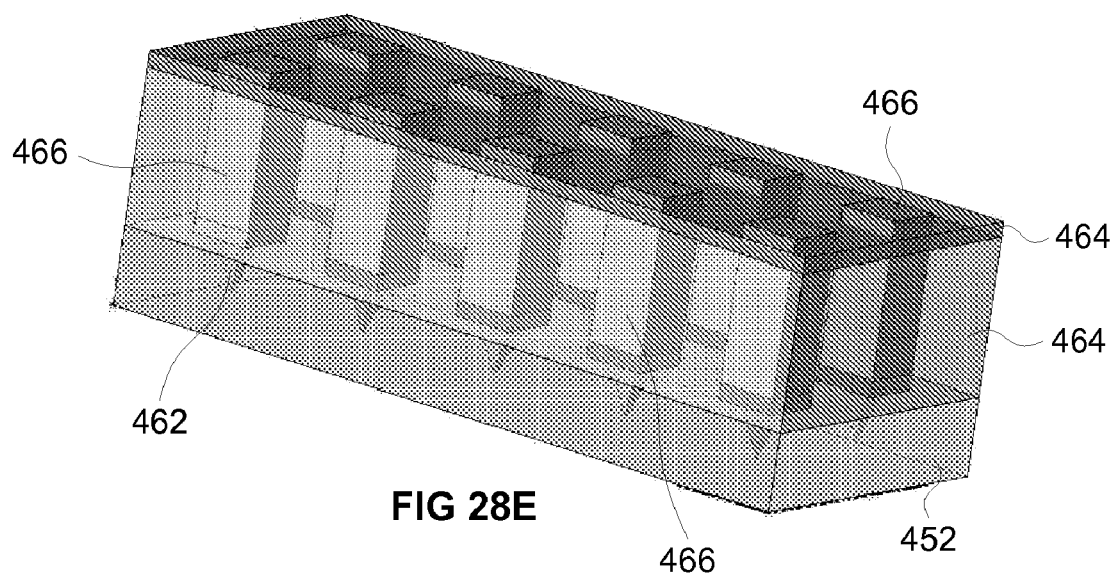

FIG. 28E depicts the state of the process after multiple layers of the probes have been formed out of sacrificial material 464 and structural material 466 (e.g. nickel or a nickel alloy). In some implementations of the process, probe tip material 462 (e.g. nickel, nickel-cobalt, nickel phosphor, rhodium, rhenium, gold, or the like) and structural material 466 may be one and the same material while in other implementations they may be different materials.

Figure 28F:
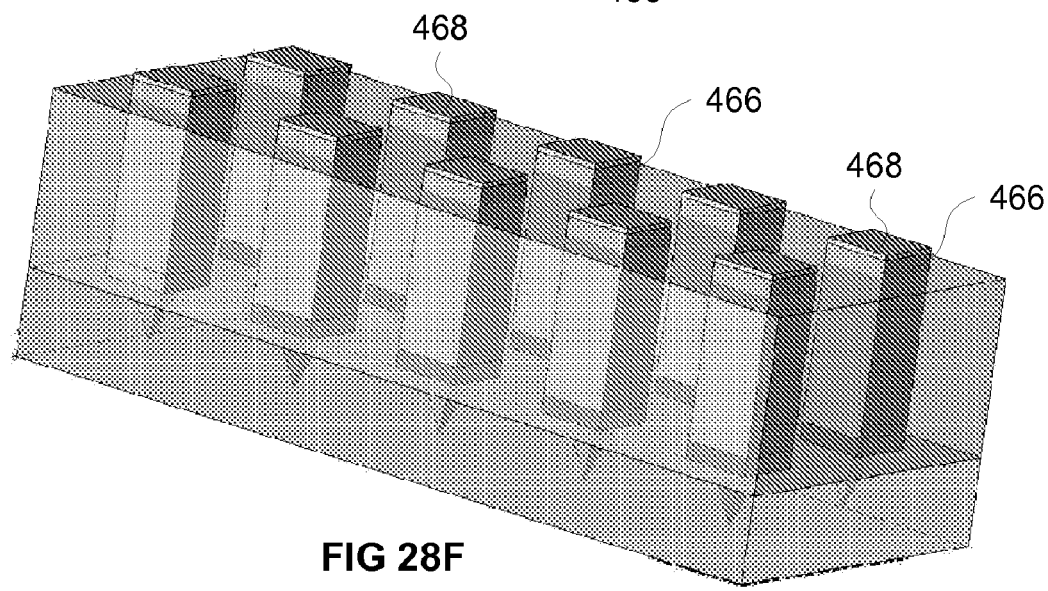

FIG. 28F depicts the state of the process after selective deposition of an additional layer of structural material 466 adds to the height of the probes and after a bonding pad material 468 is selectively deposited onto structural material 466. The selective deposition of the structural material and the bonding pad material may occur via a patterned mask. After deposition, the masking material is removed. In variations of the present process, instead of depositing the bonding material on an additional layer of structural material, bonding material (e.g. solder bumps) may have been applied directly to the structural material deposited in conjunction with the previously completed layer (i.e. the layer formed completely of structural material and sacrificial material).

Figure 28G:
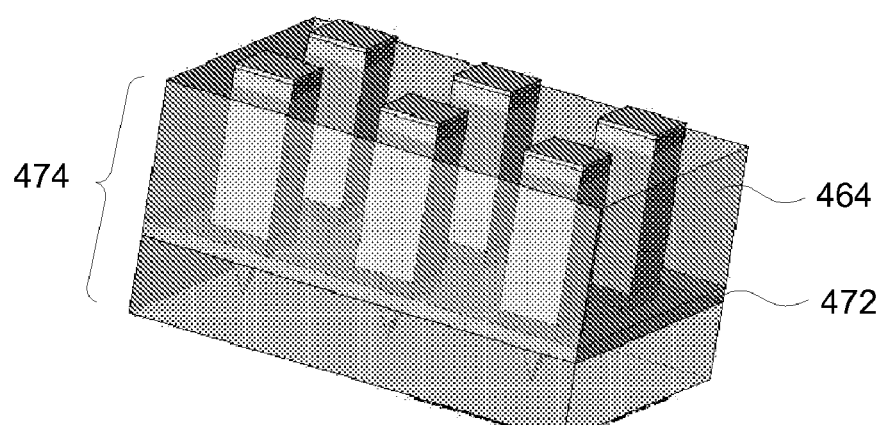

FIG. 28G shows the state of the process after dicing of individual array sections occur which results in array patterns 474 of desired configuration that may be transferred to a permanent substrate. FIG. 28G also depicts a possible variation of the process as it indicates that one or more of the first layers 472 of sacrificial material 464 may be different from the sacrificial material used on subsequent layers.

Figure 28H:
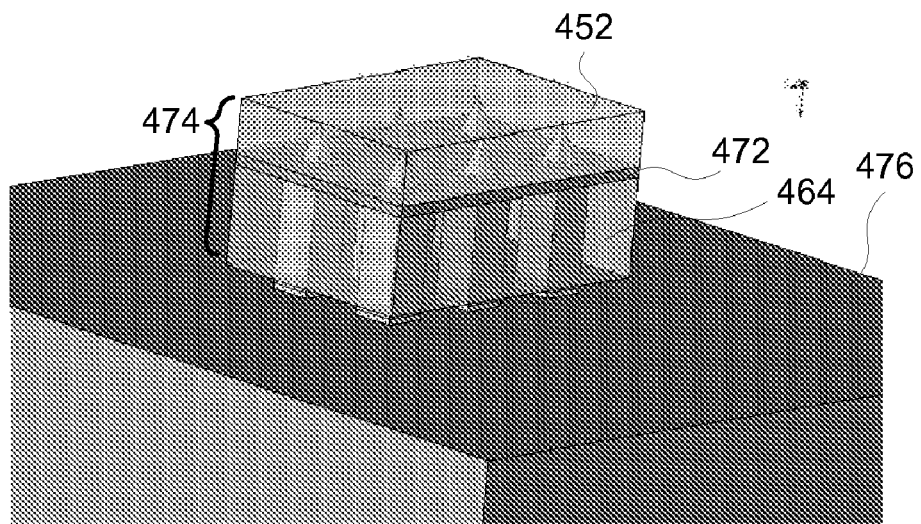

FIG. 28H depicts the state of the process after the unreleased probe array 474 has been transferred and bonded to a permanent substrate 476.

Figure 28I:
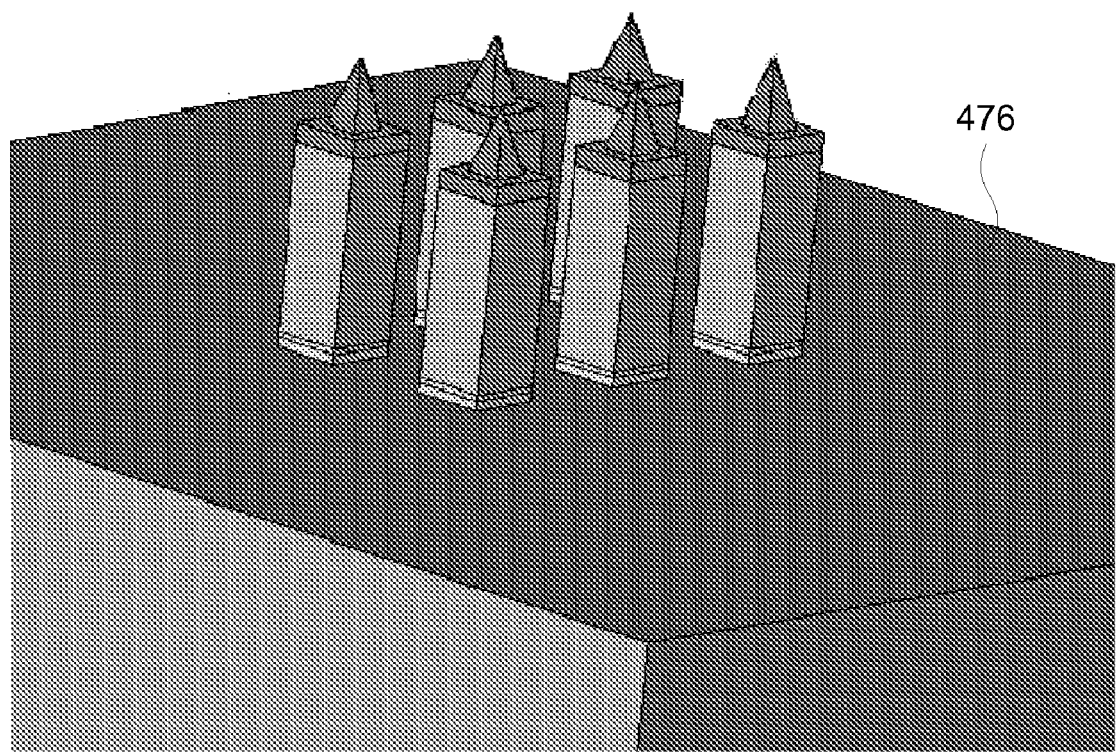

FIG. 28I depicts the state of the process after temporary substrate 452, first formed layers 472 of sacrificial material 464, and remaining layers of sacrificial material 464 have been removed from the substrate to yield a final probe array attached to a permanent substrate. The released probe arrays attached to the permanent substrate may be considered a probe array package. It should be understood that though no specific probe structure configuration has been indicated in the present example as well as in the other examples set forth herein, a variety of probe configurations are possible including helical configurations, cantilever configurations and other possible configurations. Examples of such configurations are set forth in several of the previously referenced and US patent filings. It should also be understood that in variations of this process other probe tip configurations are possible and other probe tip formation processes may be used. Examples of other configurations and formation processes have been set forth in a number of previously referenced patent filings.

In still other variations of the present process the final probe array package may include multiple arrays of probe elements which may be separately or simultaneously attached to permanent substrate 476 and which in the event of a failure of a probe element may be replaced as an entire group, as individual probe arrays, or as individual probes.

In some variations of the present process the permanent substrate may be a space transformer, a circuit board, a semiconductor device, or even a programmable gate array. After formation of the package or more specifically after release of the probe tips from temporary substrate 452 it may be possible to modify the probe tip configurations to either sharpen them or to flatten them by, for example, use of chemical or electrochemical etching, electrostatic discharge, deposition processes, or the like.

FIGS. 29A-29L depict schematic side views of various states of an example of a process for forming multilayer, multi-element probe arrays on a temporary substrate and then transferring and bonding the formed structures to a permanent substrate where the probe tips are shaped via a mold formed from sacrificial material, where the probe elements are separated from the temporary substrate by a meltable material, and where the process includes elements exemplified in the block diagrams of FIGS. 9, 15, and 22.

The process exemplified in FIGS. 29A-29L includes the following operations:

(1) Before the fabrication of the probes begins, a layer of a first metal is deposited and planarized on the substrate surface. The first metal is chosen to have a melting point that is higher than the temperatures used in the various build operations (i.e. photolithography processes, deposition processes, etc.) but lower than the temperature required for any melt based bonding or adhesion material that is used (e.g. solder or tin). In some implementations, for example, the first material may be Indium.

(2) Once the first metal is deposited, a thick layer of a sacrificial material (e.g. copper) is deposited and planarized also.

(3) On the planarized surface, the building of a plurality of layers proceeds beginning with the formation of the tip, subsequent formation of probe bodies (e.g. helical spring structures, and the like) where the formation of each layer may include a structural material (e.g. nickel or a nickel alloy) and a sacrificial material (e.g. copper) or more than one of each.

(4) After formation of the last complete layer, additional structural material, of the same or of a different type, is selectively deposited to form bonding pads and above the bonding pads an adhesion or bonding material is added (e.g. tin or solder).

(5) Next the temporary substrate, on which the first material was deposited and on which the build was made, is sliced to thin it out to give it more of a wafer-like form, and individual dies are singulated. In some alternative embodiments, the temporary substrate may be completely removed either by removing the release layer or by slicing the substrate completely away in one or more slicing operations.

(6) Next the dies are heat treated to enhance interlayer adhesion (e.g. by promoting low temperature diffusion bonding). During this process, the temperature may or may not rise to a point above the melting point of the first metal but if the melting point is reached it is believed that the surface tension of the molten first metal will keep the die-backing in place (assuming it has not been completely removed by choice). In variations of the process, the diffusion bonding operation may be delayed until after transfer to the permanent substrate has occurred either before, during, or after bonding to the permanent substrate and before or after removal of the temporary substrate and before or after removal of the sacrificial material.

(7) Next, individual probe die are located on (i.e. transferred to) the permanent substrate and bonded thereto. In some variations of the process, an under fill material may be inserted between the permanent substrate and the probe elements prior to release of the sacrificial material. Use of such back fill may aid in protecting an adhesion material from negative interactions with the sacrificial material or etchants involved in removing the sacrificial material. In still other variations an intermediate material may have been added in place of the last layer or two of sacrificial material used during formation of the probes.

(8) Next the die/package is treated to a thermal cycle in which the temperature is raised high enough to melt the first metal but nothing else. While at this temperature the temporary substrate is removed potentially along with some or all of the first metal. If necessary, another operation may be used to remove any residual first material (e.g. a planarization operation, a selective etching operation, or the like). These operations result in the exposing of the sacrificial material (e.g. Cu) on the built die that is now bonded to the permanent substrate. In some alternative embodiments, the heat treatment may provide all or part of the heat necessary to perform a low temperature diffusion bonding. This may be done in order to improve adhesion between the layers of structural material deposited during formation of the probes. In other alternative embodiments, instead of melting an adhesion material to cause adhesion, diffusion bonding (e.g. a gold-gold bond) may be used to attach probes to the permanent substrate. In still other alternative embodiments, other bonding techniques may be used (e.g. epoxy bonding, brazing, ultrasonic bonding, or the like)

(9) Finally, the sacrificial material is etched in a release process, so as to yield the completed probe package.

FIG. 29A shows the state of the process after a substrate 502 is covered with a seed layer 504 (if necessary), plated with a first metal 506, planarized, plated with a sacrificial material 508 (e.g. copper), planarized, then coated with a photoresist 512. which is patterned to form plating stops and regions where probe tips are to be located. In some alternative embodiments, the plating stops may be made from different materials, e.g. different dielectric materials or even metallic materials on which electroplating is difficult.

FIG. 29B shows the state of the process after deposition of additional sacrificial material 508 which plates up from the previously deposited sacrificial material and also mushrooms over the patterned photoresist 512.

FIG. 29C shows the state of the process after a thin film of seed layer material 514 is deposited to bridge the dielectric portions of the photoresist 512 plating stops. The seed layer material may be deposited, for example, by physical vapor deposition, electroless plating, or the like. In some variations of this process the deposition of the seed layer material may be preceded by deposition of an adhesion layer material. In some embodiments, the seed layer material may form part of the tips of the probes while in other embodiments it may be a sacrificial material that is separated from the probe tips. In some embodiments, it may not be necessary to use a seed layer material if the tip material will not be electrochemically deposited (e.g. it could be deposited by electroless deposition or sputtering).

FIG. 29D shows the state of the process after a blanket deposition of a tip material 518 occurs. In variations of the present process, the tip material may be selectively deposited using an appropriately patterned mask and it may be the same material as a structural material 516 to be discussed shortly and/or the same material as that used as a seed layer. In various embodiments, the tip material may be deposited in various ways, including (1) electrodeposition, (2) electroless deposition, (3) sputtering, (4) electrophoretic deposition, (5) spray metal deposition, (6) selectively via ink jets, or the like.

In still further variations of the present process, after deposition of seed layer 514 and prior to deposition of tip material 518 a blanket or selective deposition of a tip coating material or contact material may occur. This tip coating or contact material may be very thin compared to the overall height of the tip.

FIG. 29E shows the state of the process after a lapping plate 520 has been moved into place in order to lap and then possibly polish the blanket deposited tip material. The planarization process trims the height of the deposited material to a desired level. The appropriate level will result in the tips having a desired height and may result in removal of any seed layer material or other materials located on the sacrificial material. In some alternative embodiments, other planarization techniques may be used instead of lapping (e.g. CMP, diamond fly cutting, and the like).

FIG. 29F shows the state of the process after planarization is completed thereby yielding a surface which consists of regions of sacrificial material 508, tip material 518, and seed layer material 514.

FIG. 29G shows the state of the process after a plurality of layers of sacrificial material 508 and structural material 510 have been formed to build up the bulk of the probe structures. The fabrication of each of the plurality of layers may occur using an electrochemical deposition technique described herein elsewhere, using an electrochemical deposition technique described in one of the patents or patent applications incorporated herein by reference, or using some other technique for forming patterned layers of desired materials (e.g. electroless deposition, sputtering, electrophoretic deposition, spray metal deposition, selective deposition via ink jets, or the like).

FIG. 29H shows the state of the process after a thick layer of a photoresist 524 (e.g. a cured liquid-based photoresist or a dry film photoresist) or other masking material is applied and patterned, structural material 523 (which may be the same as or different from structural material 510) deposition occurs into the openings in the patterned photoresist to form bonding pads, and deposition of a bonding material 522 over those bonding pads occurs.

In some implementations of the present process the bonding pad material may be tin while in other embodiments a tin alloy may be used and/or some other material may be used (e.g. some other solder material, diffusion bonding material or the like).

Figure 29I:
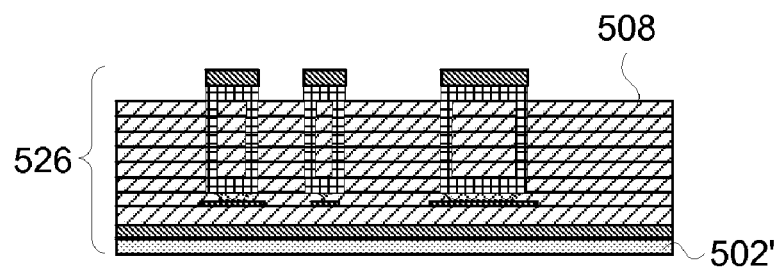

FIG. 29I shows the state of the process after the patterned photoresist material 524 of FIG. 29H has been removed and after a slicing of substrate 502 thins it out to form substrate 502' and after dicing (not distinguished) is performed to separate the structures into individual die. In some alternative embodiments complete removal of substrate 502 may occur.

Before or after dicing, the formed structures may be subjected to a heat treatment which may enhance the interlayer adhesion so as to form a structure with more uniform properties.

Figure 29J:
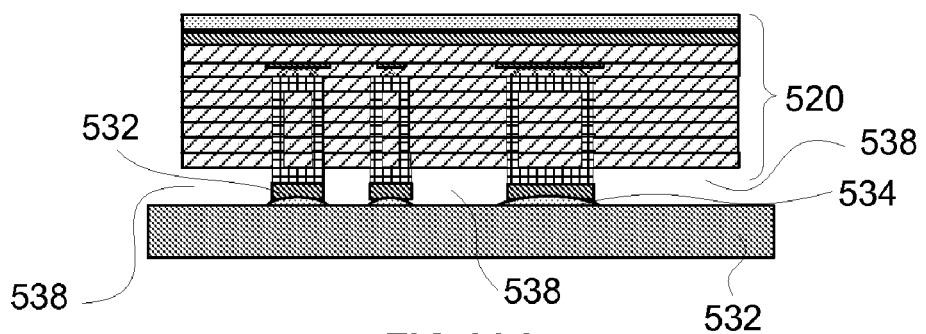

FIG. 29J shows the state of the process after the dies 526 are flip-chip bonded to a permanent substrate 532 using bonding pad material 532 and a second bonding pad material 534 located on substrate 532. In some alternative embodiments, bonding material may be initially located on only one of the permanent substrate or on the probes.

Figure 29K:
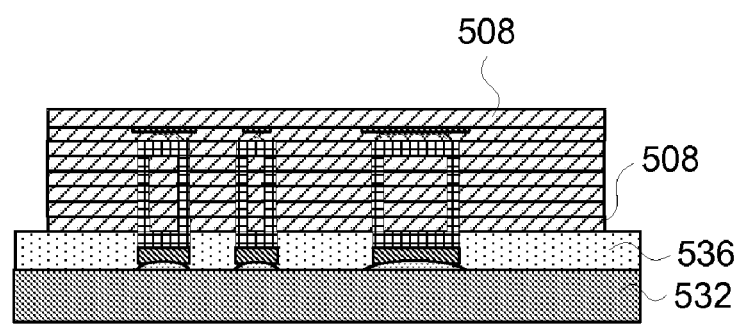

FIG. 29K shows the state of the process after a dielectric underfill material is made to fill voids 538 between the substrate 532 and sacrificial material 508 and after heating of the structures occurs to a temperature sufficient to melt the first metal 506, and separation of the structures from the temporary substrate 502' occurs. In other embodiments, the first metal may be removed in other ways (e.g. planarization, chemical dissolution, and the like).

Figure 29L:
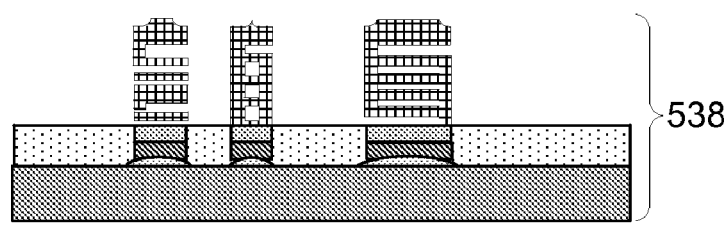

FIG. 29L shows the state of the process after sacrificial material 508 and plate stop material 512 are removed, thereby releasing the completed probes and forming probe packages 538.

Many additional variations of the above process are possible and will be understood by those of skill in the art upon review of the teachings herein and those incorporated herein by reference.

FIGS. 30A-30H depict schematic side views of various states of an example of a process for forming multilayer, multi-element probe arrays on a temporary substrate which is similar to that shown in FIGS. 29A-29L with the exception that the first metal is replaced by a dielectric material.

The process exemplified in FIGS. 30A-30H includes the following operations:

(1) Coat a temporary substrate (e.g. glass, silicon, sapphire, ceramic, or other material) with a first dielectric material. The first dielectric is selected so that it may be released from between the temporary substrate and the layers of materials deposited to build up the structures. The first dielectric material may, for example, be a polyimide material. If desired, the dielectric may be spun on, cured, and adhered to the surface on the substrate. In alternative embodiments the dielectric may be applied in other ways (as a sheet, spread, electrophoretically deposited, or the like and it may be planarized if the application does not yield a desired uniformity or thickness.

(2) Apply a seed layer over the dielectric material for electrical connection for electroplating. In some alternative embodiments this operation may be skipped if the sacrificial material in the next step will be deposited via electroless plating or via another method that does not require the presence of a seed layer.

(3) Deposit (e.g. by electroplating) a thick layer of a sacrificial material (e.g. copper) and then planarize (e.g. by lapping or fly cutting) and if desired polish it. In some alternative embodiments the deposition of a thick layer of sacrificial material may not be necessary if the dielectric material alone can act as a release layer (4) Form the tips, probe-bodies, bonding pads, and bumps in a manner similar to that described above in association with FIGS. 29A-29I.

(5) Slice and dice the structures and the temporary substrate to produce probe die.

(6) Mount and bond the probe die to a permanent substrate as described in association with FIG. 29J.

(7) Release the temporary substrate. For example, if the first dielectric is polyimide and the temporary substrate is glass, the structure and temporary substrate may be immersed in boiling water. The water will affect the adhesion of the polyimide to the glass and will cause the polyimide to delaminate. This will effectively allow removal of the glass and then the polyimide layer may be either manually peeled off or etched off using plasma or wet etch. This will result in exposure of the sacrificial material.

(8) Remove the sacrificial material, for example, by etching to complete release of the structure.

Figure 30A:
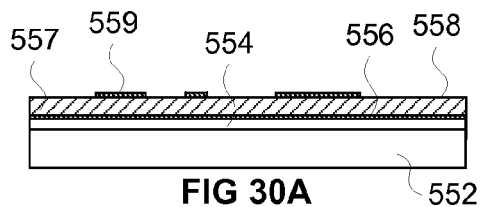
FIGS. 30A-30H depict schematic side views of various states of an example of a process for forming multilayer, multi-element probe arrays on a temporary substrate which is similar to that shown in FIGS. 29A-29L with the exception that the first metal is replaced by a dielectric material.

FIG. 30A depicts the state of the process after a temporary substrate 552 (e.g. formed of glass) is coated with a dielectric material 554 (e.g. polyimide), which is in turn coated with a seed layer material 556 and which in turn is coated with a thick layer of sacrificial material 557 (e.g. electroplated copper) which in turn is coated with a patterned photoresist material 559 in regions where probe tips are to be formed.

Figure 30B:
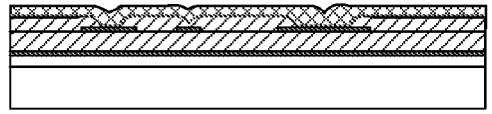

FIG. 30B depicts the state of the process which is analogous to the state depicted in FIG. 29D.

Figure 30C:
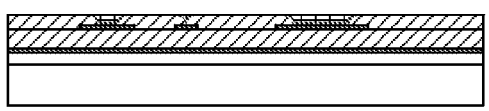

FIG. 30C depicts the state of the process which is analogous to the state depicted in FIG. 29F.

Figure 30D:
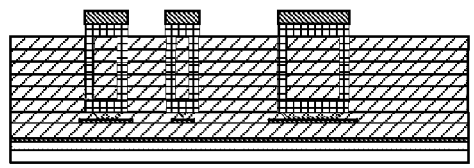
Figure 30E:
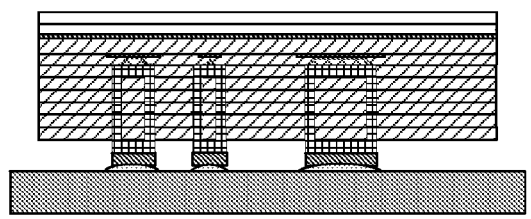

FIG. 30D depicts the state of the process which is analogous to that shown in FIG. 29I, while FIG. 30E depicts the state of the process which is analogous to that shown in FIG. 29J.

Figure 30F:
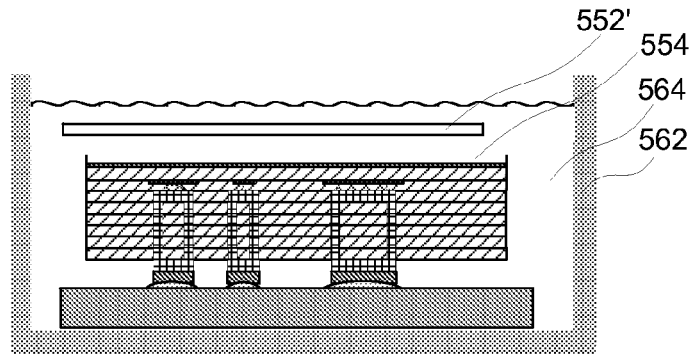

FIG. 30F depicts the state of the process after thinned temporary substrate 552' is separated from the dielectric coating 554. In the case of a glass substrate and a polyimide dielectric material, the separation may occur by immersing the structure in a tank 562 of boiling water 564 as shown.

Figure 30G:
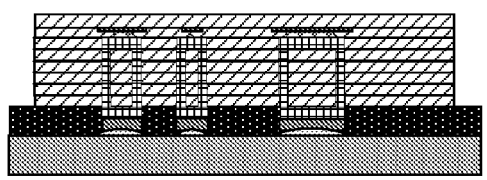

FIG. 30G depicts the state of the process after the dielectric material has been removed, for example, by peeling or plasma- or wet-etching and after an underfill material has been located between exposed portions of the permanent substrate and the sacrificial material used in forming the layers of the structure. In alternative embodiments, the order of removing the dielectric material and locating underfill material may be reversed.

Figure 30H:
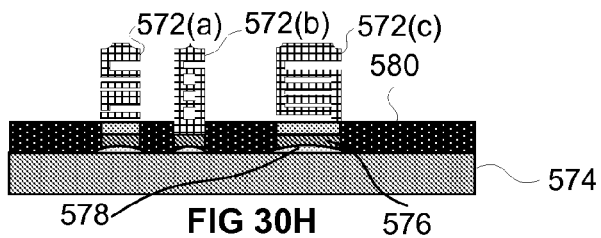

FIG. 30H shows the state of the process after removal of the sacrificial material leaving behind probe elements 572(a)-572(c) which are adhered to a permanent substrate 574 via bonding materials 576 and 578 and potentially via underfill material 580. In some embodiments, the underfill material may provide a majority of the adhesive strength while in other embodiments the bonding materials may provide a majority or even substantially all of the adhesive strength.

A next embodiment of the invention relates to methods of making microprobes using electrochemical fabrication techniques, including fabrication (with tips), transfer and bonding to a space transformer or other substrate, and (optional) coating. As discussed above, various methods for making tip geometries are available and set forth in the previously referenced patent applications. For simplicity, in the embodiment to follow a single tip fabrication approach has been selected but those of skill in the art will understand that in variations of the embodiment other fabrication techniques may be used. In particular, in the embodiment to follow an approach based on the 'mushrooming' of sacrificial material over resist features is used to define the tip geometry.

Figure 31K:
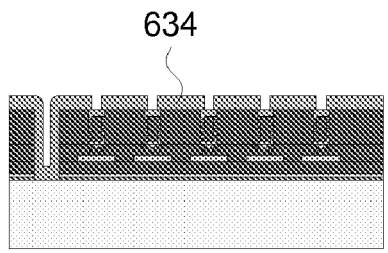
FIGS. 31A-31W depict schematic side views of various states of another example of a process for forming multilayer, multi-element probe array on a temporary substrate and then transferring the array to a permanent substrate.
Figure 31L:
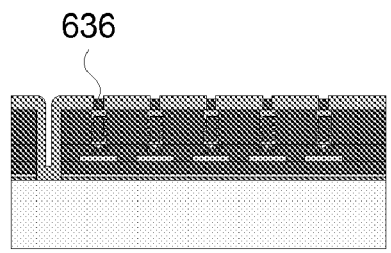
Figure 31M:
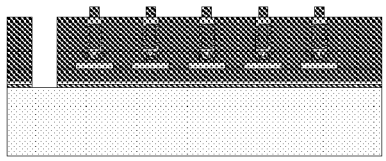
Figure 31N:
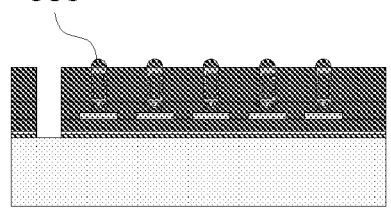
Figure 31O:
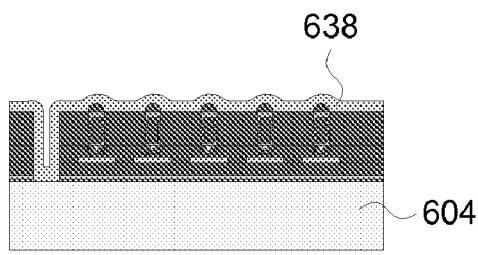
Figure 31P:
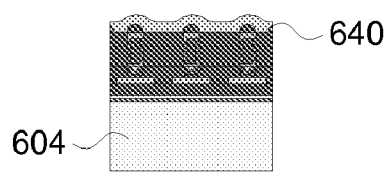
Figure 31Q:
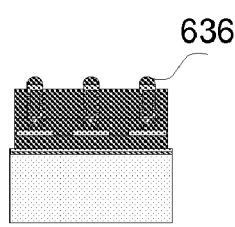
Figure 31R:
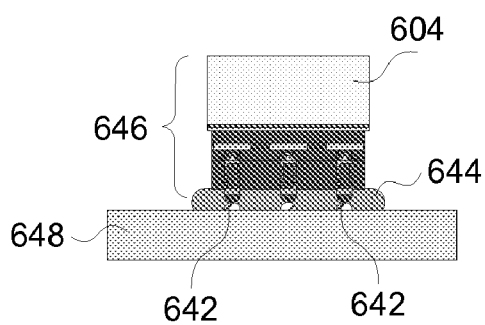
Figure 31S:
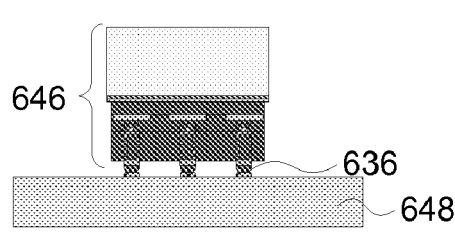
Figure 31T:
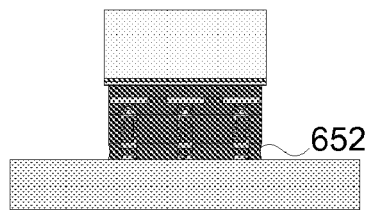
Figure 31U:
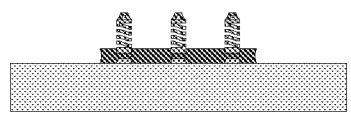
Figure 31V:
Figure 31W:

FIGS. 31A-31W outline the operations associated with a sample process which does not involve coating of probes. In FIG. 31A, a temporary wafer or substrate 604 is shown. In this embodiment, it is assumed to be dielectric such as alumina that is coated with seed layer 608 and adhesion layer 606. In this embodiment, if is preferred that three regions on the wafer or substrate remain free of depositions. As such, the metallization layers are not formed in three areas (e.g., 120° apart and located near the periphery of the wafer). One such area 614 is shown in FIG. 31A. These non-plated areas are useful for forming endpoint detection pads 614 that may be used during layer planarization operations. Such uses are discussed further in U.S. patent application Ser. No. 10/84, 272, filed May 4, 2007 by Cohen, et al., and entitled "Methods and Apparatus for Forming Multi-Layer Structures Using Adhered Masks" and U.S. patent application Ser. No. 11/029, 220 which has been previously referenced herein. Each of these applications is incorporated herein by reference as if set forth in full.

In FIG. 31B, thick sacrificial material 616 (e.g., Cu) has been plated. This sacrificial material may function as a release layer. In FIG. 31C, this sacrificial material is shown as having been planarized.

In FIG. 31D, thin photoresist 618 (or other dielectric) has been patterned to form insulating structures over which sacrificial material can mushroom to form molds for tip geometries.

In FIG. 31E, sacrificial material (e.g. Cu) has been mushroomed over the photoresist structures by plating for a controlled time to form the desired mold patterns.

In FIG. 31F, a seed layer 622 (e.g. copper) is deposited. In some alternative embodiments, prior to depositing the seed layer, an adhesion layer may be deposited (e.g. Ti—W). Both the adhesion layer and seed layer may, for example, be deposited by sputtering or evaporation. The seed layer is intended to make the exposed upper surface of the resist conductive so that additional materials may be electrodeposited. Prior to depositing the adhesion layer and seed layer, the end pointing pad regions may be shielded so that material is not deposited to those regions of the substrate. Alternatively, after deposition, a masking material may be applied with openings in the end pointing pad regions and then etching may occur to remove any deposited material.

Tip coating material 624 is shown as having been applied in FIG. 31G. In some embodiments, this material may be applied by electrodeposition while in other embodiments, for example, it may be applied by PVD such as sputtering or evaporation. The seed layer formation operation of operations shown in FIG. 31F may be omitted if tip material will be applied in a single electroplating operation under the assumption that electroplating will be of sufficient depth that the dielectric gaps over the photoresist or other masking material can be bridged by the mushrooming of the tip material from the sides of the dielectric gaps. Similarly, if build up is to occur in multiple steps, as long as the first step form a thick enough deposition, it may be possible to bridge the gap and form an appropriate coating. In other alternative embodiments, the seed layer formation operations may be omitted in favor a technique that bores, drills, or cuts openings in the dielectric material after mushrooming of sacrificial material such that underling conductive material is accessed. This alternative can allow easier bridging of any remaining dielectric gaps as they will be narrower.

Subsequent figures in this series assume that the tips are formed from two different materials. In FIG. 31G, the tip coating material 624 (e.g., rhodium (Rh), rhenium (Re), paliney 7, berilum copper (BeCU)) is deposited (e.g., by electrodeposition). This deposit may be fairly thin (e.g., 1-3 μm) to minimize stress-related delamination or cracking in the tip coating material. In some alternative embodiments, tips can be fabricated entirely of the tip coating material and no backing material may be used. However, for tip coatings that are too soft (e.g., Au) or which have too much residual stress (e.g., possibly Re or Rh) as deposited, a thin coating would preferably be used, backed by another material.

In FIG. 31H, a secondary 'backing' tip material 626 has been plated to form the bulk of the tip, and In FIG. 31I, the tip structures have been planarized.

In FIG. 31J, multiple layers 628 of structural material (e.g., Ni, NiP, NiCo, or the like) have been deposited to form the probes along with a sacrificial material that complements the structural material for each layer. It is assumed that a probe base 632 is fabricated as part of the probe (i.e., the topmost (eventually bottommost) layer(s); this might have the form of a disk whose diameter is similar to that of the probe. In other embodiments, it may not be necessary or desirable to form a probe base.

In FIG. 31K, thick photoresist 634 is deposited and patterned.

In FIG. 31L solder 636 (e.g., Sn—Pb, Sn) or similar material is plated into features of the photoresist to form solder preforms. If a probe base has not been formed previously, nickel or another structural material may be plated before depositing the solder to form a base. The base, no matter how it is formed, provides a wettable pad for the solder ball and a stable foundation for the probe.

In FIG. 31M, the photoresist is stripped.

In FIG. 31N, the solder 636 is reflowed to form a bump. In some alternative embodiments, the reflow may be performed later (once the wafer is singulated), and reflow is not strictly necessary prior to bonding (see FIGS. 1R-1S). In some embodiments, it may be desirable to perform an etch-back operation, such as that shown in FIG. 31Q, prior to reflow (or alternatively, there can be two etch-back operations) in order to recess the surface of the sacrificial material (e.g. Cu) below the surface of the base material (e.g. Ni) such that the solder cannot wick out over the surface of the sacrificial material once molten. In other alternative embodiments, it may be desirable to form a layer of solder mask material (e.g. a dielectric material such as a photoresist) around the solder performs to help ensure that upon reflow the solder balls do not wet anything more than the bases. Formation of such layers of solder mask material may occur via blanket deposition followed by planarization or by initial selective deposition with or without a follow up planarization operation. Alternatively, layers of solder mask material exist in the form of the photoresist material into which the solder was initially deposited. After deposition of the solder, the photoresist/solder combination may be thinned by planarization and if necessary additional solder may be plated (it will initially only plate above the existing solder as the rest of the surface is a dielectric). In some embodiments, it may be desirable to deposit solder mask material after an etch back of the sacrificial material occurs to a desired depth.

In FIG. 31O, a protective coating 638 has been applied to the surface of the deposited structures on wafer 604 prior to dicing. In some alternative embodiments, it may not be necessary to form this protective coating.

In FIG. 31P, the wafer 604 can been diced. The dicing operation may leave a burr 640 on the surface of the sacrificial material that can interfere with subsequent bonding. By judicious choice of protective coating material (preferably a hard material such as, for example, a wax-like material such as Crystalbond 509 made by Aremco), the size of this burr 640 can be kept small.

In FIG. 31Q, removal of the protective material and an etch-back of the sacrificial material has been performed. This etch-back may serve one or more of several purposes: a) removing the burr; b) recessing the Cu surface below that of the solder. The latter may be done for two reasons: 1) as noted above, to eliminate the risk of solder wicking out across the surface of the sacrificial material and shorting together neighboring probes; and/or 2) to separate the solder from the Cu, allowing the former to be embedded in an underfill or a solder mask material (as discussed above) that protects the solder from attack during release of the probes from the sacrificial material (e.g. by etching).

If a permanent underfill or solder mask will be used, the etch-back is preferably done to an extent that leaves the surface of the sacrificial material no lower than the bottom of the probe base, since the surface of the sacrificial material will define the top of the underfill (see FIG. 31T). In embodiments where no underfill or solder mask, or only a temporary underfill or solder mask, will be used, the sacrificial material may be etched further, which facilitates and reduces the time required for the full release later; in this regard, the release may be continued much further than shown here. Factors to consider when deciding on the amount of etching to perform and the timing of etching include: (a) ensuring that the probes are held in good alignment until they are bonded to the permanent substrate; (b) minimizing the risk of damaging the probes until and through the bonding process; (c) preventing underfill polymer or solder masking material (if used) from enveloping compliant portions of the probes and thereby excessively interfering with overall compliance, i.e. spring constant and available elastic travel length; and (d) depending on the technique chosen for inserting the underfill, it may be desirable to limit the height of the gap that is to be filled as wicking may not be properly performed if gap size is too large due to the possible reduction in capillary pressure). In lieu of, or in addition to, etch-back to remove the burr, in some embodiments, electropolishing or mechanical processing (sanding, lapping, polishing, sandblasting) may be employed.

In addition to the etch-back in FIG. 31Q, diffusion bonding has been performed (not shown), either before or after etch-back. The latter is preferable since there is less Cu and thus less risk of stress due to differences in CTE between Cu and other materials. Moreover, with the Cu already recessed relative to the Ni due to the etch, the solder bumps on the surface are more likely to remain in place during the reflow that will occur during diffusion bonding. It should be noted that since the bumps will likely reflow during diffusion bonding (e.g., at 250° C.) anyway, the earlier step to reflow them (FIG. 31N) may be bypassed. It should also be noted that it may be possible and desirable to diffusion bond at the wafer level (e.g., after FIG. 31J), though the stresses may be too large to allow this unless the wafer and/or fabricated layers are first scored (e.g., cutting through all deposited layers but only slightly into the temporary wafer of substrate). It should also be noted that if the space transformer can tolerate the temperature, it may be possible to do diffusion bonding after the step of FIG. 31S or simultaneous with it or even after the step of FIG. 31U.

In FIG. 31R, the die 646 has been flipped and aligned roughly (e.g., to +/−5 μm) to the bumps 642 on a space transformer, IC package, or other substrate 648 (e.g., a PC board). The alignment may be performed by equipment known to the art for die bonding such as that manufactured by Palomar Technologies (e.g., model 6500) or Semiconductor Equipment Corporation (e.g., System 850 with a hot gas heater stage). Such equipment may use multiple cameras, for example, to image the die and space transformer when face-to-face, align them together, and heat them to perform a bond. The space transformer is assumed to include bumps or other isolated metallic contacts as shown. If these contacts are composed of solder, it may not be necessary to apply additional solder to the probe base as already described, in that the solder from the space transformer 648 can directly bond to the probe base. A liquid or paste flux 644 has been applied to either or both the die 646 or the space transformer 648 to a) temporarily adhere the two together well enough to retain alignment until bonded; and/or b) minimize oxide formation which can interfere with good bonding. To help with the latter, an 'active' flux may be preferable.

The transferring of pluralities of probes on a group by group basis may allow more efficient fabrication of probes than would be allowed if all probes for a given space transformer, or permanent substrate, were transferred simultaneously as it may be possible to fabricate the probes on a tighter pitch than desired for their final distribution onto a space transformer or permanent substrate. If such efficiencies do not exist in a given final layout or if such efficiencies are not believed necessary, all probes for an entire final substrate may be fabricated in their respective positions on a single temporary substrate and then transferred in a single operation. It will be apparent to those of skill in the art that other transfer schemes are possible.

In FIG. 31S, the solder 636 has been reflowed, self-aligning the die 646, and the flux 644 has been removed by an appropriate solvent.

In FIG. 31T, an underfill material 652 has been wicked in to fill the space under the die. This could be a material such as an epoxy or flip-chip underfill material if a permanent underfill is desired to provide additional strength to the final device. Alternatively the underfill may be a material such as a wax (e.g., Crystalbond 509 available from Electron Microscopy Sciences of Hatfield, Pa.), lacquer, etc. which is removed after release of the sacrificial material. In either case, the use of an underfill may be helpful in order to allow the etching of selected sacrificial materials (e.g. Cu) without damaging the bonding material (e.g. solder), since the bonding material may be etched by the sacrificial material etchant, possibly acting as a sacrificial anode. In some alternative embodiments, the etchback operation that yielded the state of the process shown in FIG. 31Q may be difficult to accomplish due to a tendency for the exposed bonding material (e.g. solder) to be etched instead of the sacrificial material (e.g. Cu); this may be handled by temporarily coating the solder with a protective material (e.g., by dipping the bonding material into a thin layer of polymer that has been spin coated onto a flat plate) and/or by coating the bonding material with a metal (e.g., immersion Au coating through dipping).

In some alternative embodiments, as opposed to creating the underfill as discussed above it may be possible to apply a coating (e.g., electroless or immersion Au) at the stage shown in FIG. 31S, in order to coat the solder 636, on the die 646 and/or the space transformer 648 and protect it against etching by the sacrificial material (e.g. Cu) etchant. A thin layer of this coating may also be deposited on the lower surface of the sacrificial material and then after etching, the coating may be removed (e.g., by ultrasonic agitation).

In FIG. 31U the die 646 is shown as having been fully released from the sacrificial material. In those embodiments that keep the probes embedded, at least partially, in sacrificial material until after the bonding process of FIG. 31R great robustness for handling and keeping all the probe structures in 6-axis alignment is provided. During the operations leading to the state of the process shown in FIG. 31U, the sacrificial material enveloped photoresist features elements patterned earlier will typically fall away or become dissolved. If desired, the release process can be stopped and a photoresist stripper used once the resist is exposed, then the release continued. In other alternative embodiments, after complete etching of the sacrificial material, a photoresist stripper may be used to complete the removal of any residual photoresist.

After release from the sacrificial material and the photoresist, the structural material of the probes (exclusive of any tip material) and/or the structural material of the tips may be etched (e.g., with an etchant selective to the probe or tip material) to remove any extraneous material and/or to cause further shaping of tip or probe features. For example, if the initial formation of the tips yields a flared tip shape, as seen in FIG. 31W, and a desired tip shape does not include such a flare, as seen in FIG. 31V, the etching may be useful in modifying the tip shape. Such flared tips may be unintentionally produced via the 'mushrooming' method described above. should have the appearance shown in FIG. 31V. However, tips may actually be wider at the top (FIG. 31W) than partway between top and bottom, causing a flaring effect that widens the effective contact area between tip and probed surface. Such etching operations may also round the corners of the tip if that is desirable.

In other alternative embodiments, after removal of the substrate and before or after complete or partial removal of the sacrificial material, the tips may undergo a planarization operation (e.g. lapping, fly cutting, CMP or the like) so as to further shape the tip structure (e.g. to take it form a shape shown in FIG. 31W to a shape shown in FIG. 31V).

In some alternative embodiments, instead of bonding the probe die to a permanent substrate (e.g. a space transformer) using solder or other meltable bonding material as discussed above, they may be bonded using thermocompression bonding, e.g., based on Au—Au bonding. In this case, one may plate a first bonding material (e.g. Au) on the probe bases (instead of solder) in the operations leading to the state of the process shown in FIG. 31L, and the permanent substrate (e.g. space transformer) contacts may also be also be coated with the first bonding material (e.g. Au-coated via plating, sputtering or the like). With the two bonding material coated surfaces in contact, heat and pressure may be applied to bond the probe die to the permanent substrate. In this case, it may not be necessary to use any underfill since there may be no negative interaction between the bonding material and the sacrificial material or the etchant used to remove the sacrificial material.

As an extension to what is shown in FIGS. 31A-31W, one can fabricate, transfer and bond other structures and devices which are useful in final probe card assemblies (e.g. assemblies including PCBs, space transformers, and possibly interposers). Examples of these include interconnects (traces, microstrip, coaxial transmission lines, non compliant pins), switches, capacitors, resistors, and inductors.

Figure 32A:
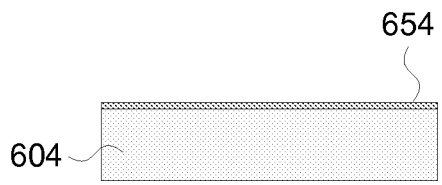
FIGS. 32A-32Z depict schematic side views of various states of an example of a process which is similar to that of FIGS. 31A-31W but which additionally involves coating the non-tip portion of the probe elements.
Figure 32B:
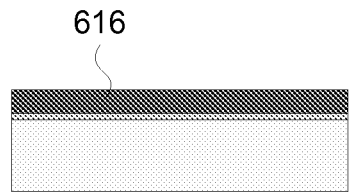
Figure 32C:
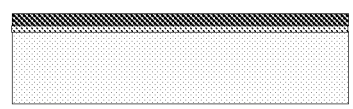
Figure 32D:
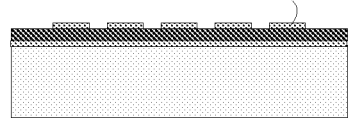
Figure 32E:
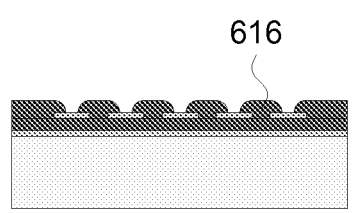
Figure 32F:
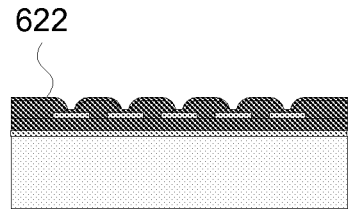
Figure 32G:
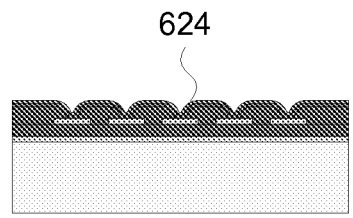
Figure 32H:
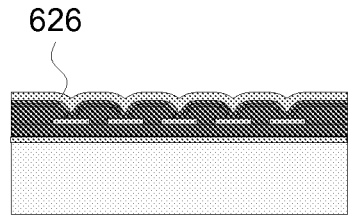
Figure 32I:
Figure 32J:
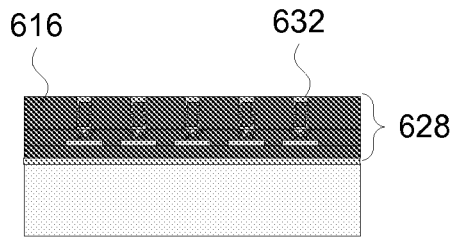
Figure 32K:
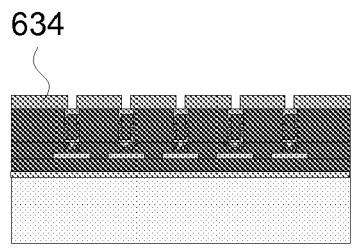
Figure 32L:
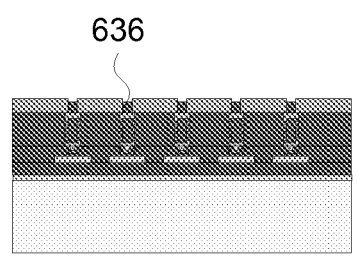
Figure 32M:
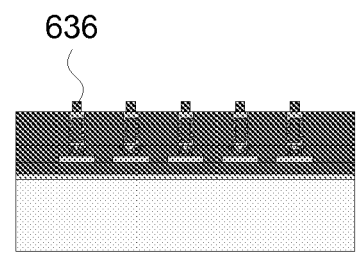
Figure 32N:
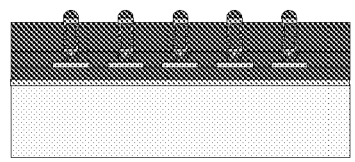
Figure 32O:
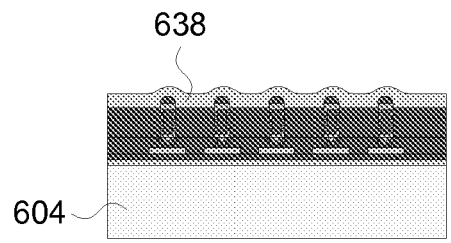
Figure 32P:
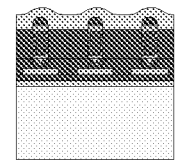
Figure 32Q:
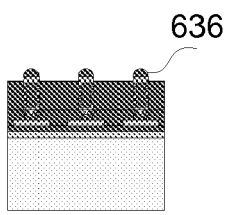
Figure 32R:
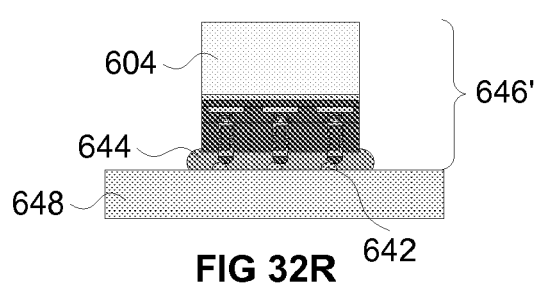
Figure 32S:
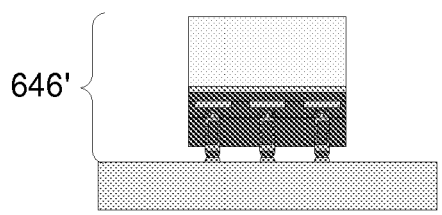
Figure 32T:
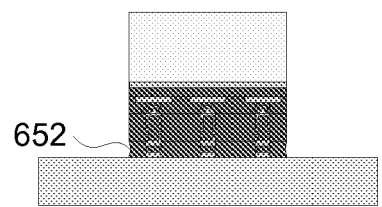
Figure 32U:
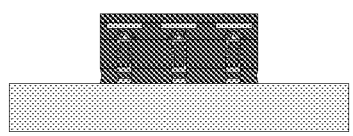
Figure 32V:
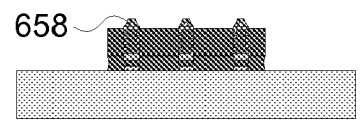
Figure 32W:
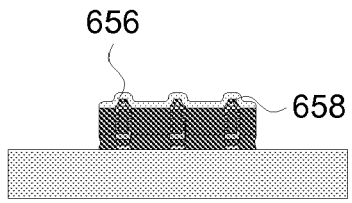
Figure 32X:
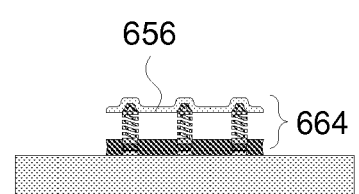
Figure 32Y:
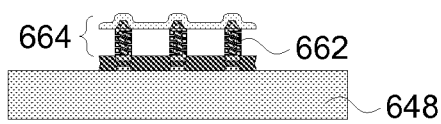
Figure 32Z:
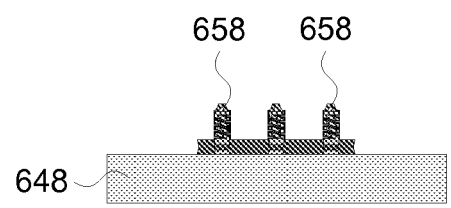

FIGS. 32A-32Z depict schematic side views of various states of an example process which is similar to that of FIGS. 31A-31W, but which additionally involves coating of the probe (e.g., Au or Cu coating to decrease probe resistance, or Ni or Ni alloy coating (e.g., of a Cu or Au probe) to increase probe mechanical stiffness. In this embodiment, it is assumed that whatever coating is applied to the probes, it is not desired to apply this same coating to the tips. Of course in alternative embodiments, the opposite assumption may be made and associated process simplifications and modifications are possible. Achieving a coating on the sides without coating the tips is challenging, but the current embodiment provides an example of such a process.

FIG. 32A depicts the state of the process which is similar to that shown in FIG. 31A with two exceptions: (1) the state of the process shown in FIG. 32A does depict an end pointing pad location, and (2) instead of starting with formation of an adhesion layer 606 and a seed layer 608, a release layer 654 is formed on substrate 604. In this embodiment, the release layer 654 is preferably a conductive material (e.g., indium) that can be melted to release the probes from the temporary substrate 604. In this embodiment, the substrate may be conductive material on which the release layer is plated or otherwise deposited, it may be a dielectric material onto which an adhesion layer and seed layer have been deposited in preparation for receiving the release layer, or it may be a dielectric that is prepared to receive the release layer by electroless plating or another process that does not require the existence of a conductive base (e.g. sputtering, evaporation, or the like).

FIGS. 32B-32T depict the same changes to the states of the process shown in FIGS. 31B-31T, respectively.

In FIG. 32U the state of the process is shown after release layer 654 has been melted and substrate 604 removed. This release may occur by melting the release layer at a relatively low temperature. In some implementations there may be a residue of the release layer material left behind. If this is the case, removal may occur, for example, by etching, polishing/lapping, fly cutting, and the like.

In FIG. 32V, the state of the process after partial etching of sacrificial material occurs whereby the photoresist features are removed and the tips 658 of the probes are exposed.

In FIG. 32W, the tips 658 shown as having been coated with a protective material 656 (e.g. a polymer, such as a photoresist that can survive sacrificial material etching, such as Shipley BPR 100 or a wax, such as Crystalbond) by, for example, dipping, spin coating, spraying, or any other suitable method. In some alternative embodiments, the tips can also be coated with a non-polymeric material so long as the coating 656 applied in FIG. 32X will either not deposit on the coating, will deposit non-adherently, or will come off when the material is removed (e.g., via a lift-off type process).

In FIG. 32X the state of the process is shown after the sacrificial material (e.g. Cu) has been etched out from around the probes 664. Due to the existence of the tip coating 656, the etching takes place only from the sides. In some alternative embodiments, the tip coating may be applied after removal of the sacrificial material (e.g via dippin). In still other embodiments, the application of tip coating material may be made in a patterned manner so as to leave openings in the coating such that removal of sacrificial material may occur not only from the sides from top (i.e. the side opposite the permanent substrate 648.

In FIG. 32Y, the state of the process is shown after the probes 664 have received coating 662. This coating, for example, may be applied by electroless plating, chemical vapor deposition, physical vapor deposition, electroplating, or the like.

Finally, in FIG. 32Z the protective tip coating material 656 is shown as having been removed to yield probes 664 on substrate 648. The main body of the probes (i.e. the portion extending from the bases to the tips) is coated by material 662 while the tips 658 themselves are not coated by material 662.

In order to improve the bonding of the coating to the probes, in some embodiments, it may be desirable to heat treat the probes after the coating is deposited (not shown). If diffusion bonding has not yet been performed prior to coating, then diffusion bonding and coating bonding may be performed simultaneously, as long as the space transformer 648 can tolerate the temperature required for diffusion bonding which may be higher than that required to enhance bonding of the coating material.

Various alternative embodiments to that of FIGS. 32A-32Z are possible. One such embodiment (not shown) may involve selective application of coating material 656 to only the probe tips, leaving polymer-free areas between probes. One way of accomplishing this is to spin coat a thin layer of polymer onto a flat plate and then carefully bring the tips into contact with this layer and then pull them away. Another way may involve the blanket application of photoresist resist to the build level containing the tips and thereafter patterning the photoresist.

In still other embodiments coating material 662 may be applied to the probe tips as well as to the rest of the probes and thereafter the coating material may be removed from the tips. This removal may occur in various ways, for example: (1) protecting the remainder of the probes (e.g., by application of a wax) and then chemically etching the coating off the tips; (2)

touching the tips to a plate covered with a thin layer of an etchant that attacks the coating material (possibly made viscous so that it does not easily wick up the sides of the probe and remove the coating there as well); (3) mechanical removal of the coating material from the tips (e.g., by polishing or lapping), (4) scrubbing the tips against a course surface which has a hardness greater than that of the coating material but less than that of the tip material, (5) tips the tips of the probes into an plating bath and anodically etching the coating material, and the like.

In another alternative embodiment, deposition of probe coating material 662 onto the tips may be prevented by depositing a shield material before the tip is formed. The shield material is selected, the tip formation material and process are selected, and the coating formation and process are selected such that the tip may be formed but the coating material cannot be formed or will be formed but only with low adhesion. For example, in lieu of the PVD seed layer material (e.g. Cu) that is deposited to yield the states of the processes shown in FIGS. 31F and 32F. A dielectric material is first deposited and then a conductive seed layer is deposited (e.g. via PVD deposits) or the tip material is PVD deposited or is otherwise deposited in a manner that does not require the existence of a seed layer. After the planarization operations of FIGS. 31I and 32I, a ring of insulating material will be associated with each tip. The ring of insulating material will separate the metal inside the ring from that outside it prior to the deposition a subsequent conductive layer; however, during formation of the first subsequent layer, material being plated should readily mushroom over the thin insulating ring bridging the metal on the inside and outside so that plating can occur in a normal manner. After release from the sacrificial material and the application of coating material 662, the dielectric tip coating material may be removed by any appropriate process (e.g. dissolving, stripping, bombardment, heating, or the like).

In a related alternative embodiment, before depositing tip material, it may be possible to deposit a sacrificial material (e.g. copper) etch barrier (e.g. nickel), followed by a thin coating of sacrificial material, followed by the tip material of interest: when the final release is performed in FIG. 32X, the thin layer of Cu coating the tip will not fully etch, since it is substantially shielded with a barrier material. Thus when the coating is applied in FIG. 32Y, the coating will overcoat the barrier material but will not contact the over tip itself. With additional sacrificial material etching, it may be possible to remove the intermediate sacrificial material over the tip which will release the shield material along with the coating material and will expose the desired tip material. In a variation of this alternative embodiment, when it is time to remove the shield material it may be possible to planarize the shield material so as to remove its tip and so that the sacrificial material and even a small amount of the tip material is exposed. After the planarization operation, sacrificial material etching may continue.

In another alternative embodiment, the temporary wafer 604 may be released from the probe build before transfer and/or bonding of the probes to the space transformer 648 (FIGS. 31R and 32R). Since the probes are encased in sacrificial material the entire structure (typically several hundreds of microns thick) may be self-supporting and the temporary wafer 604 dispensed with earlier.

Figure 33A:
FIGS. 33A-33W depict schematic side views of various states of an example process which is similar to that of FIGS. 32A-32Z except that instead of using one sacrificial material and one release material, a common release and sacrificial material are used along with a second sacrificial material.
Figure 33B:
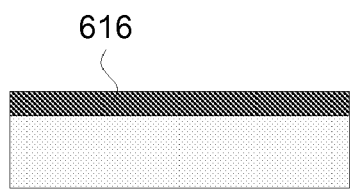
Figure 33C:
Figure 33D:
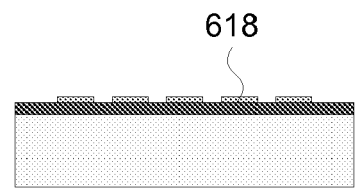
Figure 33E:
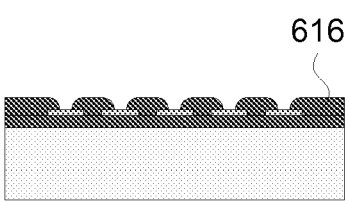
Figure 33F:
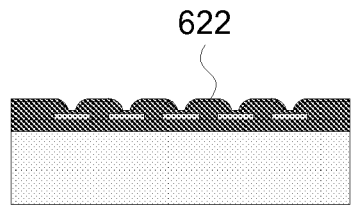
Figure 33G:
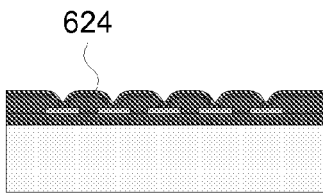
Figure 33H:
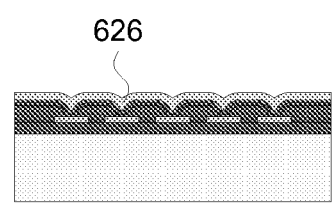
Figure 33I:
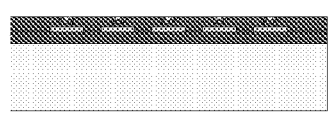
Figure 33J:
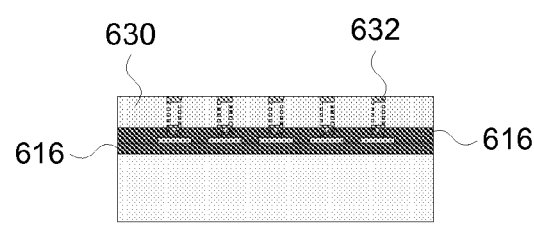
Figure 33K:
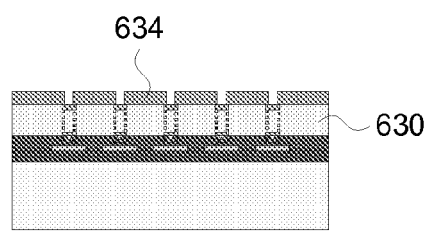
Figure 33L:
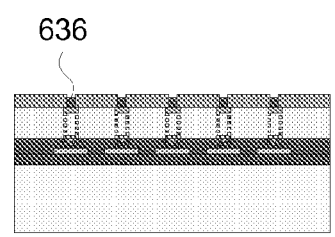
Figure 33M:
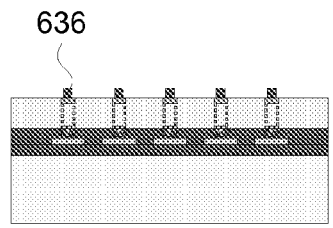
Figure 33N:
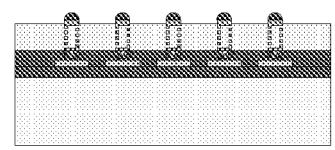
Figure 33O:
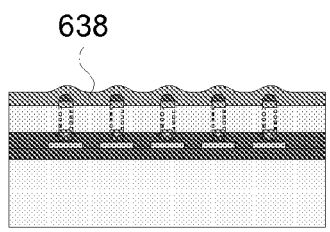
Figure 33P:
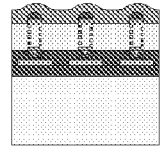
Figure 33Q:
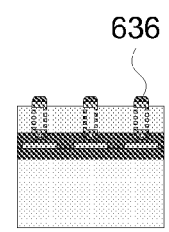
Figure 33R:
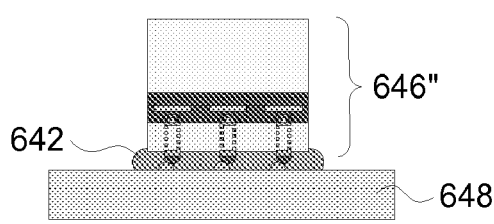
Figure 33S:
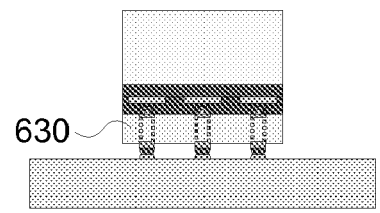
Figure 33T:
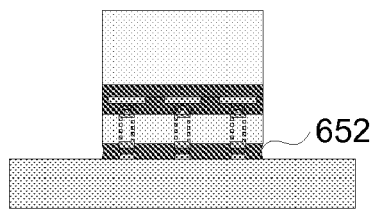

FIGS. 33A-33T depict schematic side views of various states of an alternative process which is similar to that shown in FIGS. 32A-32T except that instead of using a distinct release layer material and a single sacrificial material 616 (as used in the process of FIGS. 32A-32T), a combined release material and sacrificial material 616 are used along with a second sacrificial material 630.

Figure 33U:
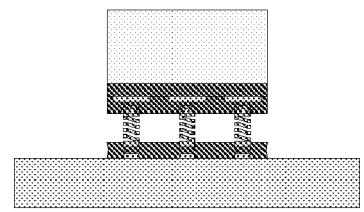
Figure 33V:
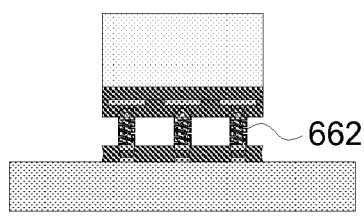

FIG. 33U illustrates the state of the process after removal of sacrificial material 630. In FIG. 33V a coating 662 is applied to the probes.

Figure 33W:
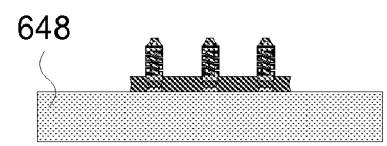

In FIG. 33W, the temporary substrate 604, the photoresist, and the first sacrificial material 616 are removed to yield the released probe array on permanent substrate in FIG. 33W.

Figure 34A:
FIGS. 34A-34Y depict schematic side views of various states of an example process which is similar to that of FIGS. 32A-32Z with the exception that tip protective material is not applied after a partial etch back of sacrificial material. But instead is applied via a transfer process.
Figure 34B:
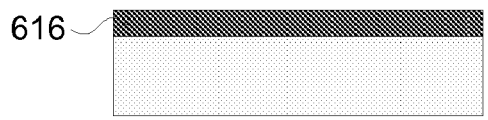
Figure 34C:
Figure 34D:
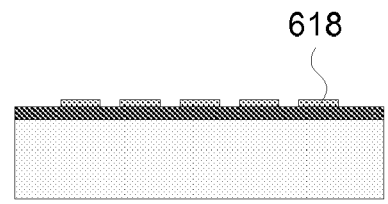
Figure 34E:
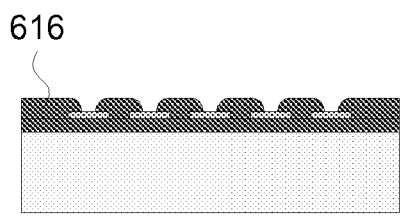
Figure 34F:
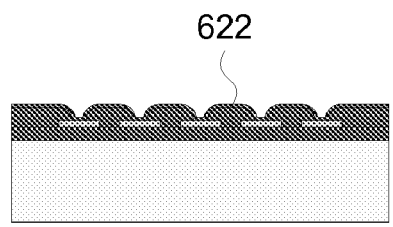
Figure 34G:
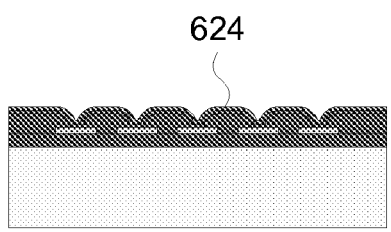
Figure 34H:
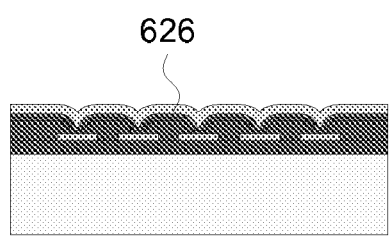
Figure 34I:
Figure 34J:
Figure 34K:
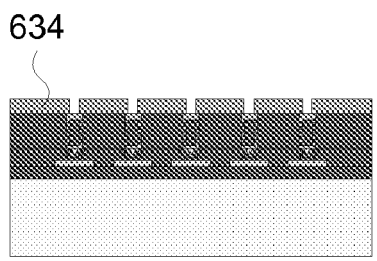
Figure 34L:
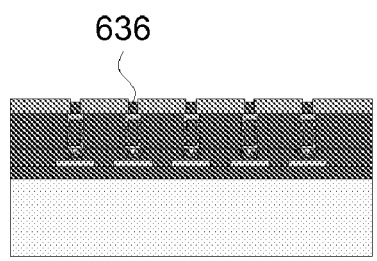
Figure 34M:
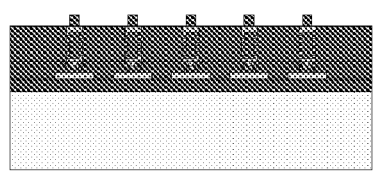
Figure 34N:
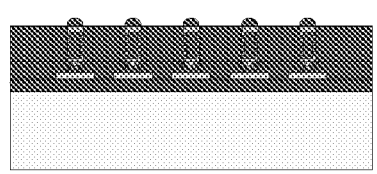
Figure 34O:
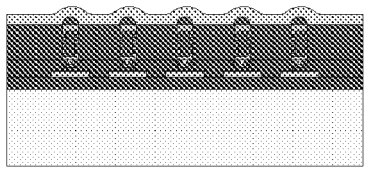
Figure 34P:
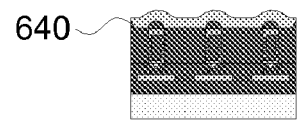
Figure 34Q:
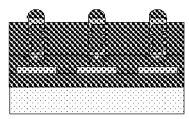
Figure 34R:
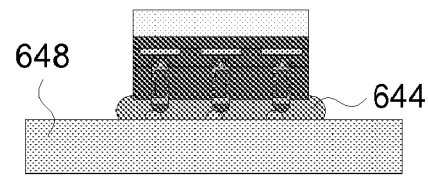
Figure 34S:
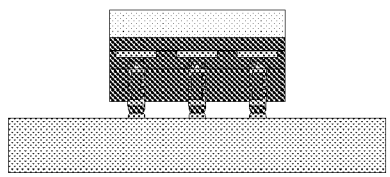
Figure 34T:
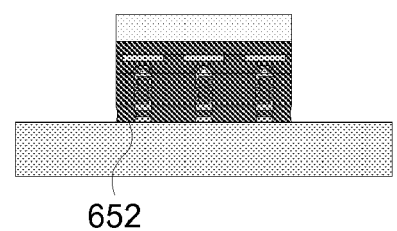
Figure 34U:
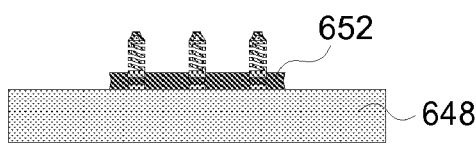
Figure 34V:
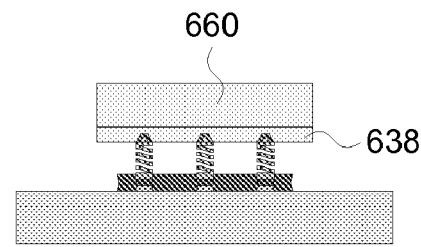
Figure 34W:
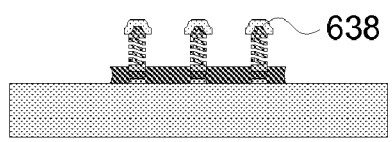
Figure 34X:
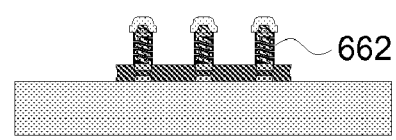
Figure 34Y:
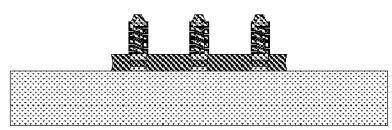

FIGS. 34A-34Y depict schematic side views of various states of an example process which is similar to that of FIGS. 32A-32Z with the exception that tip protective material is not applied after a partial etch back of sacrificial material. But instead is applied via a transfer process. The states of the processes illustrated in FIGS. 34A-34T are similar to those illustrated in FIGS. 32A-32T with the exception that an initial release layer 654 is not used in the embodiment of FIGS. 34A-34Y.

FIG. 34U depicts the state of the process after the sacrificial material 616, photoresist 618, and substrate 604 are separated from the probe array(s), the underfill material 652, and permanent substrate 648.

FIG. 34V depicts the state of the process after a substrate 660 carrying transferable protective coating material 638 is brought into contact with the probe tips.

FIG. 34W depicts the state of the process after substrate 660 and coating material 638 is lifted from the probes leaving behind selective coatings of protective material 638 on each probe tip. The protective material may be a conductive material or a dielectric and it may remain in a fluid like state or be cured to a solid state (e.g. via optical stimulus, temperature stimulus, component evaporation, inhibition removal (e.g. oxygen inhibition), or the like) if, for example, the material is a polymer precursor, via cooling if the material is a meltable material, or the like.

FIG. 34X depicts the state of the process after a coating material 622 is applied to the main body of the probes. This coating material may be applied in any of a variety of ways, including for example: (1) electroplating, (2) electroless deposition, (3) CVD, (4) PVD, or the like.

FIG. 34Y depicts the state of the process after protective material 638 is removed from the probe tips. The removal of the protective material may occur in a variety of ways depending on the type of protective material used. For example, selective etching may be used. Depending on how the coating material is applied, it may not only coat the main body of the probes but the protective material as well. In such cases it may be necessary to expose the protective material before it can be removed (e.g. via a lift off process, a planarization process, a scrubbing process, or the like).

Figure 35A:
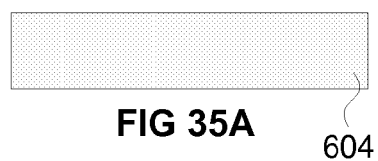
FIGS. 35A-35S depict schematic side views of various states of an example process where multiple probe die are to be transferred to a permanent substrate and where support spacers are used to help ensure co-planarity of the tips of the transferred probes within a single array and from array-to-array.

In some situations (e.g., for memory testing) it is necessary to transfer and bond not a single probe die to a space transformer, but multiple ones (potentially dozens or more), sometimes spread over a large area (e.g., an area larger than that of the wafer on which the probes are fabricated). In such a situation, to ensure good co-planarity over the entire set of probe tips may be difficult due to variations in the height of the solder bumps from die to die (causing non-coplanarity due to offset) or even within a die (causing non-coplanarity due to die-specific tilt). Other sources of non-coplanarity may also be observed. FIGS. 35A-35S illustrate an embodiment for improving co-planarity in such situations.

Figure 35B:
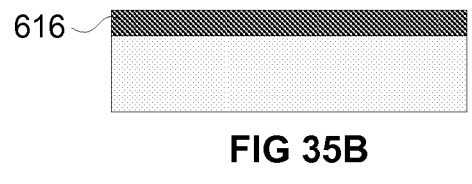
Figure 35C:
Figure 35D:
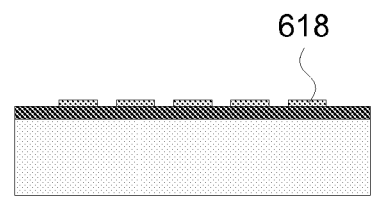
Figure 35E:
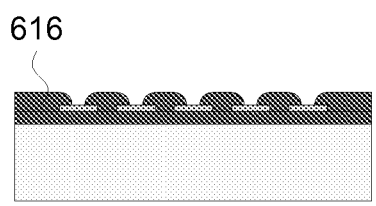
Figure 35F:
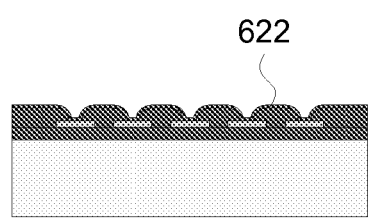

FIGS. 35A-35F depict similar states of the process to those depicted in FIGS. 34A-34F. In FIG. 35A, a die-sized portion of a temporary wafer 604 is shown. The wafer, for example, may be ceramic and coated with adhesion and seed layers such as Ti and Au. In FIG. 35B, a thick sacrificial material 616 (e.g., Cu) has been deposited (e.g. by electroplating or electroless plating). In FIG. 35C, this 'release' layer has been planarized to a desired height and uniformity. In FIG. 35D, thin photoresist 618 (or other dielectric) has been patterned to form insulating structures over which sacrificial metal 616 can mushroom to form tip mold geometries. In FIG. 35E, sacrificial material 616 has been mushroomed over these by plating for a controlled time to form the desired tip geometries. In FIG. 35F, conductive seed layer 624 (e.g. Cu) is deposited, e.g. by sputtering or evaporation, in order to make the upper surface of the exposed resist conductive. In some embodiments, it may be preferable or necessary to apply an adhesion layer (e.g. Ti—W) prior to depositing the seed layer material 622. While applying the seed layer is advantageous in order to avoid depressions or grooves in the (eventual) top surface of the tip due to 'stitching' of the tip backing material mushrooming from the mushroomed sacrificial material, it is not strictly necessary. Also, in some embodiments, this step may be omitted if an etching operation (e.g., RIE) is used to 'drill' through the resist to expose underlying sacrificial material through apertures in the photoresist and thus enabling partial or even full contact with underlying conductive material.

Starting with FIG. 35G it is assumed that tips are formed from a single material (e.g., nickel or a nickel alloy) or from a single 'backing' material (e.g., nickel or a nickel alloy) which will later be coated with a coating material such as rhodium, Rh (steps involved with the coating are not shown in the figures of this embodiment). Alternatively, a coating material may be applied to the tips as they are fabricated (e.g., subsequent to the sacrificial material deposition shown in FIG. 35F).

Figure 35G:
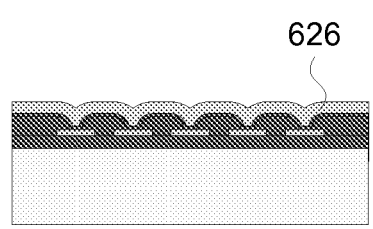

In FIG. 35G, the tip material or tip backing material is shown as having been plated to form the bulk of the tip structures. The change in the state of the process set forth in FIG. 35G is similar to that shown in FIG. 34H.

Figure 35H:

In FIG. 35H, the deposited materials have been planarized to remove excess tip material and to provide a planar surface on which fabrication of the main body of the probes may occur. The change of the state of the process shown in FIG. 35H is similar to that shown in FIG. 34I.

Figure 35I:
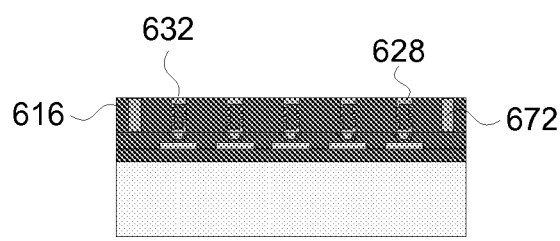

The state of the process shown in FIG. 35I, indicates that multiple layers of structural material (e.g., nickel or a nickel alloy) have been deposited to form both the main bodies of probes 628 and support columns 672. FIG. 35I also shows that a sacrificial material 616 has also been deposited during the formation of each layer. If the adhesion of a support material 674, to be applied in a subsequent step (see FIG. 35K), to sacrificial material is adequate, these columns may not be required. In this embodiment a probe base 632 is fabricated as part of the probe, i.e. as the topmost layer or layers of the probe structure. The base 632 may take the form of a disk whose diameter is similar to that of the probe.

Figure 35J:
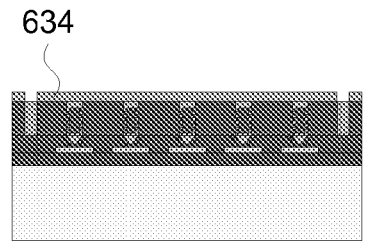

In FIG. 35J, the state of the process is shown after masking material 634 (e.g. a thick photoresist has been deposited and patterned to leave opening over support columns 672.

Figure 35K:
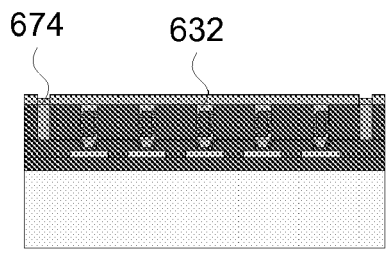

In FIG. 35K support tips formed from a support material 674 (e.g., Ni) have been plated into features of the resist and onto the support columns 672. In some variations of this embodiment, the support tips may be planarized while in other embodiments they may remain unplanarized. If planarization is to occur, it may be beneficial to have the support material surrounded by sacrificial material. If sacrificial material is to be located on the same layer or layers containing the support material. One of the support material or the sacrificial material may be deposited into opening in a masking material (e.g. photoresist) while the other material may be blanket deposited after removal of the masking material. The tips as shown are flat on their top surfaces; however, in some embodiments they may be made from a reflowable material that has (e.g. having a reflow temperature higher than the ultimate bonding temperature used to reflow solder bumps that may be used in bonding the probes to a permanent substrate), and they may be reflowed or otherwise rounded so as to present a quasi-spherical top surface.

Figure 35L:
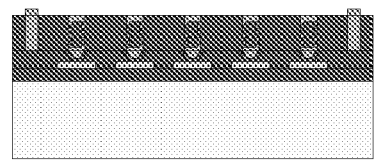

In FIG. 35L the state of the process is shown after the masking material (e.g. photoresist) has been stripped.

Figure 35M:
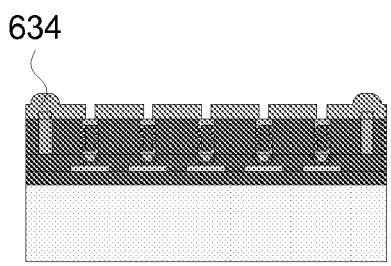

In FIG. 35M, the state of the process is shown after a masking material 634 (e.g. photoresist) has been applied again and patterned to have openings over the probe bases. The masking material may be applied to form a thicker coating than that used in the previous operations. In some alternative embodiments, it may be possible to replace the operations of FIGS. 35L and 35M with an additional application of photoresist to fill openings over the support material 674 and an operation that causes further patterning of the masking material that was deposited in the operations leading to FIG. 35J. Such further patterning may be possible when the masking material is a positive resist since it may be possible to make new openings in the masking material by application of a second exposure pattern and development.

Figure 35N:
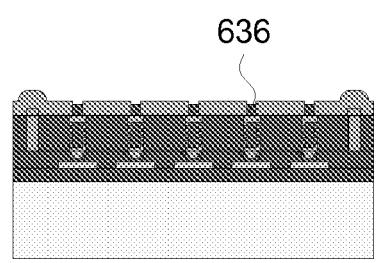

In FIG. 35N, solder 636 (e.g., Sn or Sn—Pb) or similar material is deposited into features of the resist. If a probe base was not previously formed as part of probe creation (as discussed above in association with FIG. 35I, a base material (e.g. Ni or a nickel alloy) can be deposited (e.g. via electroplating) before depositing the solder (e.g. via electroplating) to form a base. The base, no matter how it is formed, provides a wettable pad for the solder ball and a stable foundation for the probe. In some alternative embodiments, other bonding materials may be applied as discussed herein elsewhere.

Figure 35O:
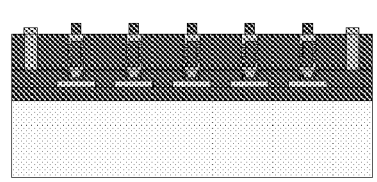

In FIG. 35O, the state of the process is shown after the masking material 634 is stripped.

Figure 35P:
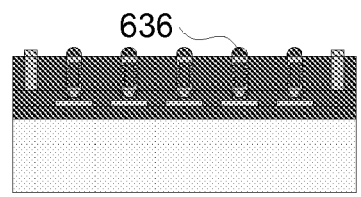

In FIG. 35P, the state of the process is shown after bonding material 636 (e.g. solder) has been reflowed to form bumps. In alternative embodiments, this reflow operation may be performed later in the process, e.g. after the probe die are singulated. In other alternative embodiments, reflow may not be performed. The sacrificial material may be etched back (not shown) prior to flipping and bonding in order to minimize the risk of bridging among solder bumps and/or to remove burrs associated with dicing, and the like. In some alternative embodiments, a solder mask material may be applied to the upper surface of the probe die (leaving openings in solder locations) and/or to the surface of the permanent substrate to help reduced unintended spreading of the solder and wetting of the surface of the permanent substrate.

Figure 35Q:
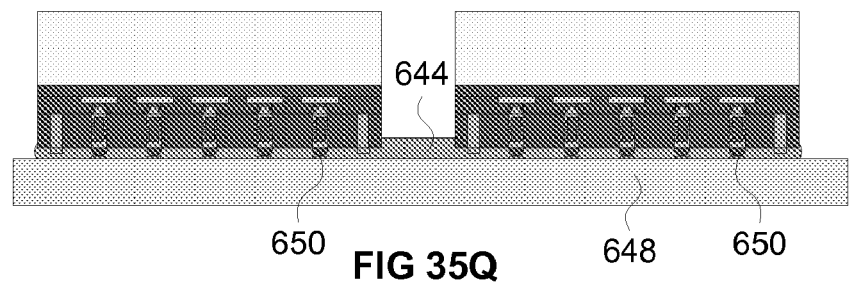

In FIG. 35Q, the state of the process is shown after a plurality (two are shown in this example) of probe die of the type previously described have been flipped and aligned roughly (e.g., to +/−5 µm) to the bumps on a space transformer, IC package, PC board, or other permanent substrate 648. Multiple die fabricated in close proximity on a temporary wafer can be dispersed widely across a much larger substrate, e.g., for making probe cards for memory testing (characterized by relatively low probe density but large area). The alignment may be performed by equipment known to the art for die bonding such as that manufactured by Palomar Technologies of Carlsbad, Calif. (e.g., model 6500) or Semiconductor Equipment Corporation of Moorpark, Calif. (e.g., System 850 with a hot gas heater stage). Such equipment may use multiple cameras or a single camera equipped with beam splitter, for example, to image the die and space transformer when face-to-face, to align them together, and to heat them to perform a bond. The permanent substrate is assumed to include bonding pads 650 of some sort as shown. If these contacts are composed of solder, it may not be necessary to apply additional solder to the probe base as previously described (i.e. it may be possible for the solder on the permanent substrate to directly bond to the probe base. A liquid or paste flux 644 has been applied to either or both of the probe die or the permanent substrate. The presence of this liquid or paste may aid in temporarily adhering the probe die and permanent substrate together well enough to retain alignment until bonding occurs and/or may minimize oxide formation which can interfere with good bonding. To help with the latter, an 'active' flux may be preferable. At this time, the relative heights of the support tips and bumps are such (based on plating each to a pre-determined height) that when the bumps lay on the bonding pads, the support tips are not in contact with the permanent substrate, thus allowing the die to approach the space transformer to achieve good bonding once the solder is reflowed. In some alternative embodiments, the support tips may be located on the permanent substrate in lieu of or in addition to them being located on the probe die. In still other alternative embodiments, support spacers (e.g. pads, discs, or the like) may be independent of the probe die and permanent substrate and simply be located in place prior to bonding and then retained or removed (if necessary) after bonding is completed. For example, removal of such spacers may occur upon removal of sacrificial material due to geometric release or due to dissolution.

Figure 35R:
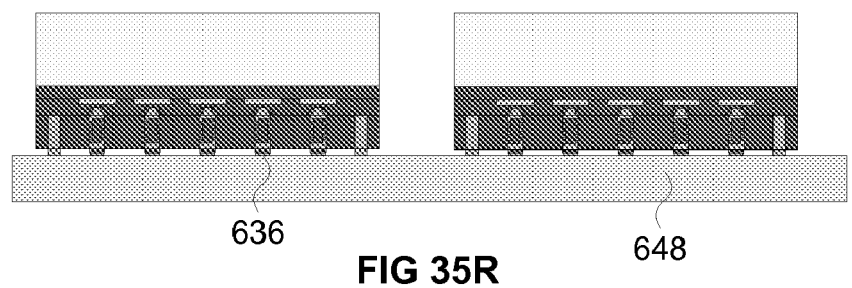
Figure 35S:

In FIG. 35R, the state of the process is shown after the solder 636 has been reflowed, flux 644 has been removed (e.g. by dissolving using an appropriate solvent), self-aligning and bonding the die has occurred. During these operations, the probe die and permanent substrate may be brought closer together (e.g. up to a limiting plane defined by the support spacers). At this time the support tips are pulled into closer contact with the permanent substrate (e.g. up to the point of contact between the support spacers with the permanent substrate) by surface tension of the solder, by the weight of the die, and/or by pressure applied between the probe die and the substrate, and thereby establishing both the height and the tip/tilt orientation of the die with respect to the surface of the permanent substrate. Thus the die is oriented in all six axes in one operation by a combination of the self-centering action of the solder bumps acting on the bonding pads and the action of the support spacers bearing against the permanent substrate. To the extent that the permanent substrate itself is flat, the tips of the probes of different die will lie nearly as coplanar as when sharing a common temporary substrate during fabrication and transfer. As such, it is not necessary that all die share a common temporary substrate during formation.

Due to other build considerations (e.g. skewing of layers during formation, in some embodiments it may be desirable that all probe arrays (or die) transferred to a particular permanent substrate come from a common temporary substrate and even that they be oriented in a consistent manner on both the temporary substrate and the permanent substrate (e.g. so that difference in skew direction to do cause probe tips from one array to another to be inappropriately positioned. In other embodiments, it may be possible to analyze these other build considerations (such as skewing), to match probe arrays (or die) formed on different temporary substrates to allow their use in association with a common single permanent substrate and potentially to determine preferential use orientations for particular probe die. In still other embodiments, skew analysis may be used to determine most favorable base bonding locations for selected probe die so that probe tips from die to die (regardless of skew) are located with a desired spacing. Once appropriate bonding locations are selected, either tailored locating or trimming of solder bumps can occur on either the probe die and/or the permanent substrate so that self-alignment will bring the probes into desired positions, or alternatively constrained bonding (e.g. X&Y direction constraint assuming that the normal to the permanent substrate is along the Z direction) may be used so that self alignment does not occur or is of a limited extent. In some additional alternative embodiments Z direction constraints (other than that offered by support spacers may be placed on the probe die and permanent substrate during bonding. In still other embodiments, tips may be made to have an extended length and after bonding, a planarization operation may be used to bring them into a common plane.

In some alternative embodiments, an underfill material (not shown) may be wicked in to fill the space under the die. This could be a material such as an epoxy or flip-chip underfill if a permanent underfill is desired to provide additional strength to the final device. Alternatively, an underfill may be a material such as a wax (e.g., Crystalbond 509), lacquer, or the like which is removed after release of the sacrificial material. In either case, the use of an underfill may be desirable in situations were an etchant (e.g. C-38 etchant) is used to remove the sacrificial material (e.g. Copper) and that etchant also attacks the solder.

In FIG. 35S the state of the process is shown after the plurality of probe die have been fully released from the sacrificial material, the photoresist, and the temporary substrates. The support columns (if used) and tips have been removed (e.g. by falling away, washing away, or the like) when the sacrificial material was dissolved or otherwise removed. In embodiments where the probes remain embedded at least partially in the sacrificial material up until bonding is complete provides great robustness for handling and keeps all the structures within a die in 6-axis alignment during bonding. Moreover, the sacrificial material was effectively used to hold the columns and support spacers in alignment until their purpose has been fulfilled (i.e. to aid in ensuring proper alignment during probe die bonding). During the sacrificial material release process, the enveloped photoresist features patterned earlier typically fall away or become dissolved. If desired, in some embodiments, the release process can be stopped and a photoresist stripper used once the resist is exposed, then the release process may be continued. At this point if desired the probes can be etched (e.g. selectively) to remove any extraneous material or to roughen them (e.g. using a dilute 'microetch') to enhance adhesion of a coating that may be later applied. Another effect of the etching might be to remove any 'flared' region as discussed herein above in association with FIGS. 31V and 31W. The etchant can also round the corners of the tip if that is desirable.

Figure 36A:
FIGS. 36A-36Q depict schematic side views of various states of an example process where multiple probe die are transferred to a permanent substrate and where an initial reflow of solder is used to cause XY alignment and a second reflow of solder, in conjunction with a vertical alignment plate, is used to set Z alignment position.
Figure 36B:
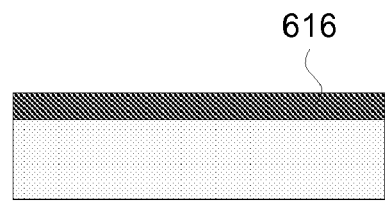
Figure 36C:
Figure 36D:
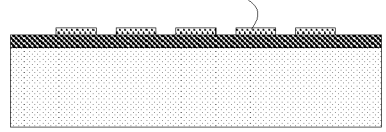
Figure 36E:
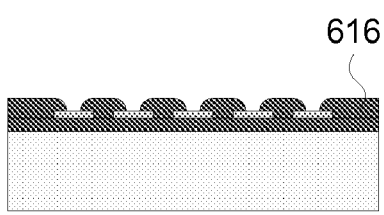
Figure 36F:
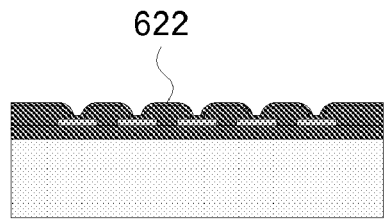
Figure 36G:
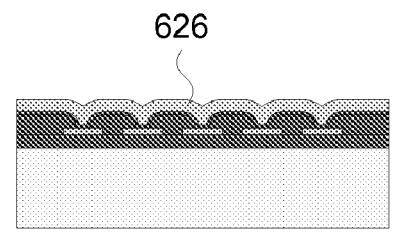
Figure 36H:
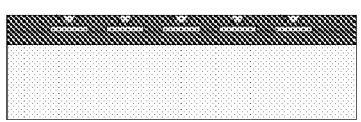
Figure 36I:
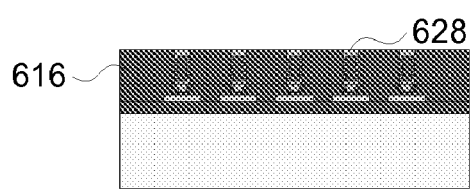
Figure 36J:
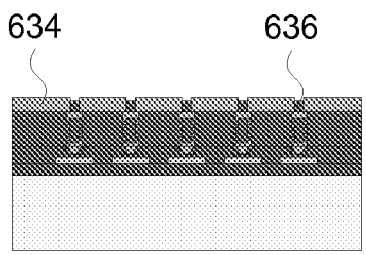
Figure 36K:
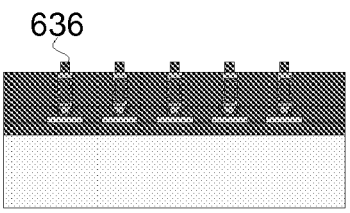
Figure 36L:
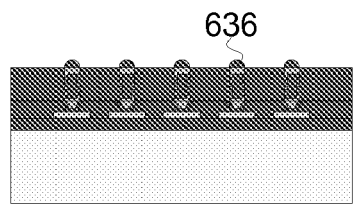
Figure 36M:
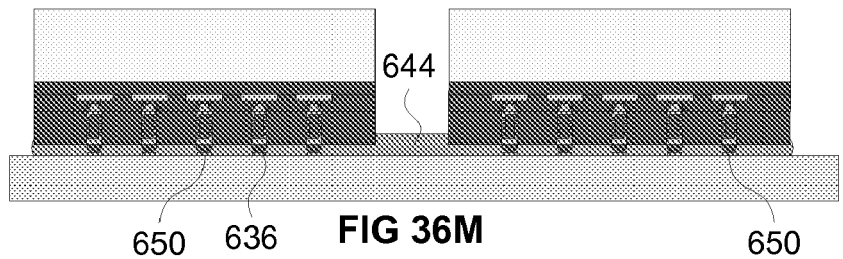
Figure 36N:
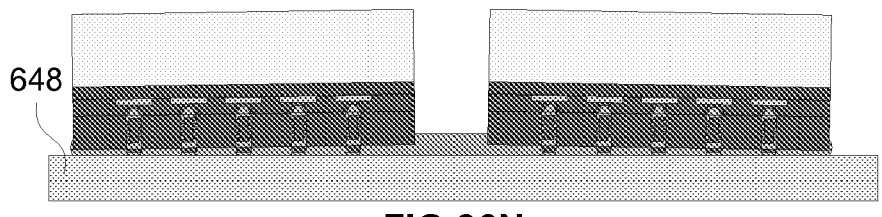
Figure 36O:
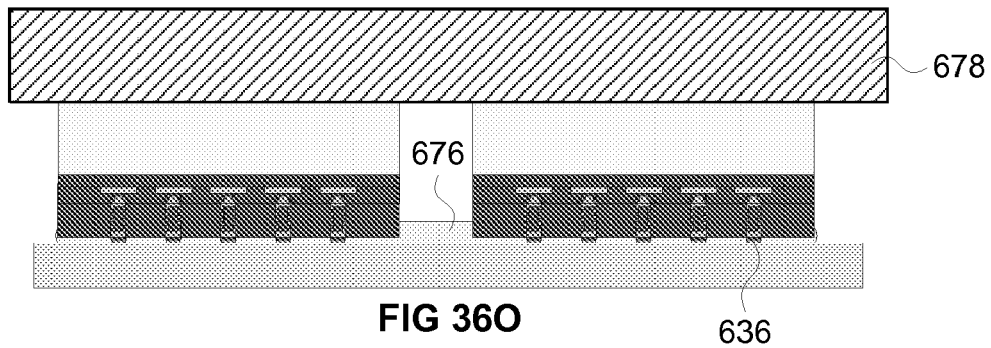
Figure 36P:
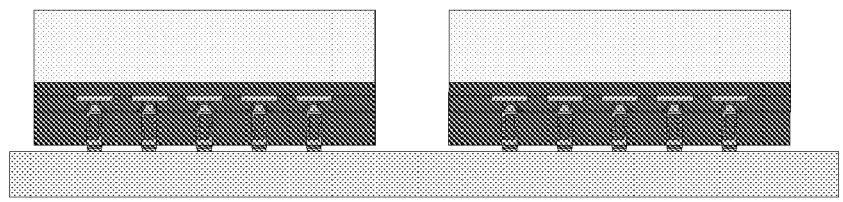
Figure 36Q:

FIGS. 36A-36Q depict schematic side views of various states of an example process where multiple probe die are transferred to a permanent substrate and where an initial reflow of solder is used to cause XY alignment and a second reflow of solder, in conjunction with a vertical alignment plate, is used to set Z alignment position. Many of the process states shown in FIGS. 36A-36Q have counterparts in FIGS. 35A-35S. In particular FIGS. 36A-36I, 36J-36M, 36O, 36P, and 36Q depict similar process states as those depicted in FIGS. 35A-35I, 35N-35Q, 35R, and 35S respectively with the exception that no support columns are formed in the FIG. 36 series. Due to the fact that in the embodiment of FIG. 36A-36Q, vertical (Z-direction) alignment will be set based on a tool that rests against the back side of the transferred probe arrays, it is important that the front and back surfaces of the temporary substrate 604 are highly parallel. Due to the similarity of the processes of FIGS. 35 and 36 only a portion of FIGS. 36A-36Q will be specifically discussed hereafter and readers are hereby directed to the discussion above concerning the corresponding figures in the FIG. 35 series for more details concerning the operations involved in this embodiment.

Alternatively, in some embodiments it may be possible to work with substrates that lack front and back surfaces that are parallel particularly when the difference between the surface normals (vectors perpendicular to each surface) are known and when the tool can be positioned at a desired orientation, and when the tool and substrate can be ensured proper rotational mating in the XY plane.

In some alternative embodiments, the support columns and/or support spaces of the embodiment of FIGS. 35A-35S may be combined with the two step alignment process of FIGS. 36A-36Q.

In FIG. 36J, the state of the process is shown after a thick resist 634 has been deposited and patterned and solder 636 (e.g. Sn or Sn—Pb solder) or similar material is plated into features of the resist. In some alternative embodiments, a probe base 628 may not have been previously formed and in such embodiments, a probe base may be formed in the openings in the photoresist prior to depositing solder. The base, no matter how it is formed, provides a wettable pad for the solder ball and a stable foundation for attaching the probe to the permanent substrate.

In FIG. 36L, the photoresist 634 has been stripped and the solder 636 has been reflowed to form bumps. As noted above with alternatives to previously presented embodiments, in some alternatives to the present embodiment, the reflow may be performed at a later stage of the process (e.g. once the probe die are singulated). In still other embodiments, reflow of the solder is not strictly necessary prior to bonding. Also as previously discussed, the sacrificial material may be etched back (not shown) prior to flipping and bonding in order to minimize the risk of bridging solder bumps, to remove burrs associated with dicing, and the like.

In FIG. 36M, the state of the process is shown after a plurality of probe die (two are shown) of the type previously described have been flipped and aligned roughly (e.g., to +/−5 µm) to the bumps 650 on a space transformer, IC package, printed circuit board, or other permanent substrate and after a liquid or paste flux 644 is located between the permanent substrate and the sacrificial material of the probe die. As before, the space transformer is assumed to include bonding pads 650. As before, if these contacts are composed of solder, it may not be necessary to apply additional solder to the probe base.

In FIG. 36N shows the state of the process after solder 636 has been reflowed, self-aligning of the probes has resulted in XY positioning alignment and potentially resulted in Z-direction misalignment. As shown, the die becomes correctly aligned in X, Y, and theta (rotational orientation in the XY plane). In other words, the bumps on the probes become well-centered over their corresponding pads. In this embodiment, this first reflow and bonding operation may cause the relative Z-positioning of the probes within individual die and between die to be different. In other words, the individual die may not be oriented parallel to the permanent substrate or parallel to each other and as such once released from their respective sacrificial materials, the probe tips from one die will not be sufficiently co-planar with those of another die. In this embodiment additional operations are used to ensure further alignment is achieved.

In FIG. 36O, the state of the process is shown after the flux 644 has been replaced with a stabilizing material 676 (e.g., a high-temperature polymer, for example a flux of another type or viscosity), an alignment plate 678 has been made to contact the back side of the probe die, a second reflow of the solder performed, and vertical alignment achieved. In some alternative embodiments, the flux itself may be left in place to serve as a stabilizing material, or no stabilizing material may be used. The purpose of the stabilizing material is to reasonably constrain the die during the second reflow operation so that small Z, tip, and tilt motions will be allowed but not any large motions that would compromise the X, Y, or theta alignment that has already occurred. Alignment plate 678 is preferably flat. In some embodiments, the vertical positioning of the alignment plate may be controlled so as to move the probe die closer or further from the permanent substrate to force vertical positioning and alignment while in other embodiments, the weight of the plate may be used to drive the probe die into a common vertical position and orientation. The plate 678 remains in place while the solder is cooled to solidify it, preserving the die locations. In some embodiments, the plate may in fact be a chuck (vacuum, magnetic, or electrostatic, depending on the substrate), such that the die are drawn to it (rather than simply pushed by it). Such drawing action may help in achieving proper orientation without excess smashing of the die against the permanent substrate. As mentioned above, in some alternative embodiments, the support spacers and possibly the support columns of the embodiment of FIG. 35 may be used.

In FIG. 36P, the state of the process is shown after solder 636 has been resolidified after the second reflow operation, the alignment plate 678 has been removed, and stabilizing material 676 has been removed. In some alternative embodiments, the stabilizing material does not necessarily need to be removed, and may perhaps serve as an underfill. In some embodiments, where the stabilizing material is removed, an underfill material (not shown) may be wicked in or otherwise made to fill the space between the probe die and the permanent substrate prior to release.

In FIG. 36Q, the sacrificial material, photoresist features, and temporary substrate have been removed (e.g. by etching).

In some alternative embodiments to that presented above in association with FIG. 36A-36Q, the two reflow operations may be combined into a single reflow operation. During the reflow operation the alignment plate may be contacted to the probe die.

In still other alternative embodiments, alignment of probe die relative to the permanent substrate may occur based on alignment marks formed in the last layer or layers of the probe die with alignment marks located on the permanent substrate. X, Y, and theta alignment based on such marks may be useful in allowing probe die fabricated in different builds to be bonded to a single permanent substrate as any misalignment of probe tip locations (e.g. due to layer skewing) can be avoided (so long as skewing is not so great as to cause probe bases to not bond to permanent substrate bonding pads). In such alternative embodiments, probes may be held in position relative to the permanent substrate for X, Y, theta alignment as well as Z, tip, and tilt alignment and the alignments may be performed in a single reflow operation or during multiple reflow operations. In some alternative embodiments, the alignment marks on the back or upper surface of the probe die may be used visually or physically to aid in alignment. For example in some embodiments they may take the form of protruding elements, or indentations, which can fit into pre-existing holes, or which can receive pre-existing protrusions, respectively, on the alignment plate or alternatively may simply press into a compliant layer of material on the surface of the alignment plate.

In the specific embodiment illustrated in FIGS. 36A-36Q, in contrast to the embodiment of FIG. 35, since the top surfaces of the temporary substrate for each probe die are in contact with a flat plate, the flatness of the space transformer is not as important; rather the flatness, thickness tolerance, and front/back parallelism of the wafer or wafers used to fabricate the probes bonded to a given space transformer are the important factors in achieving co-planarity of the probe tips and a strong, consistent bond between the solder bumps and the bonding pads of the space transformer.

Figure 37A:
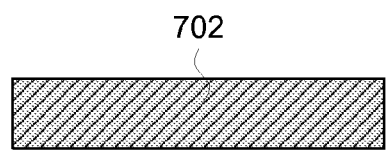
FIGS. 37A-37P depict schematic side views of various states of an example process where probe die are transferred to a permanent substrate and where the process includes use of three temporary substrates.
Figure 37B:
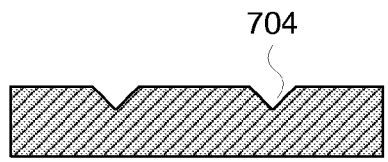
Figure 37C:
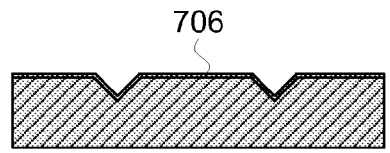
Figure 37D:
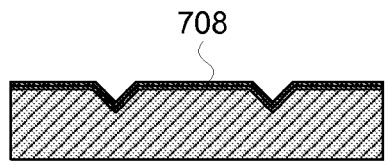
Figure 37E:
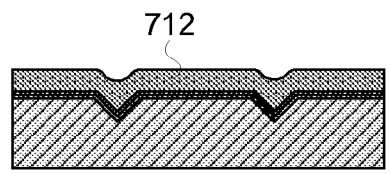
Figure 37F:
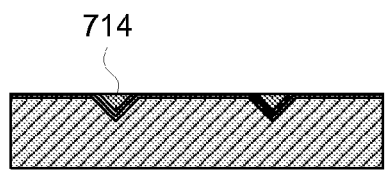
Figure 37G:
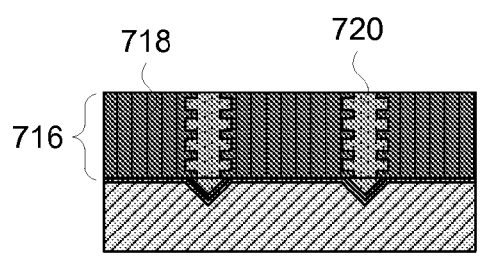
Figure 37H:
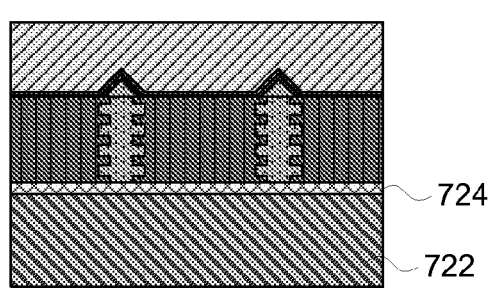
Figure 37I:
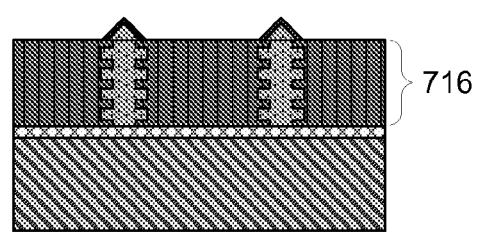
Figure 37J:
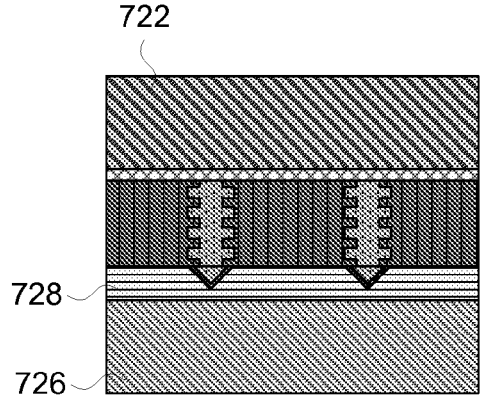
Figure 37K:
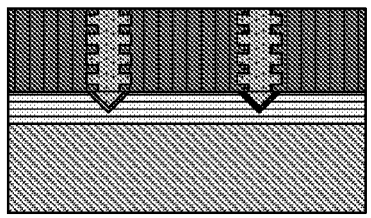
Figure 37L:
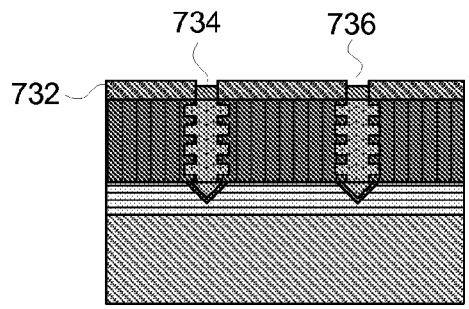
Figure 37M:
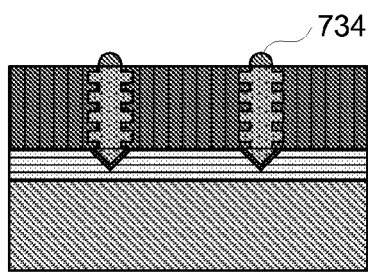
Figure 37N:
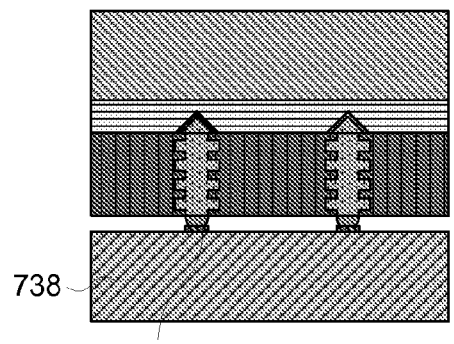
Figure 37O:
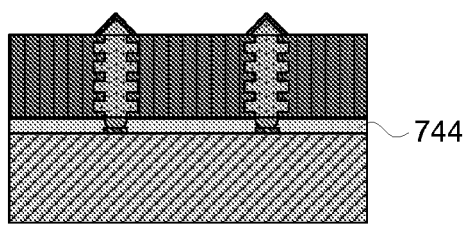
Figure 37P:
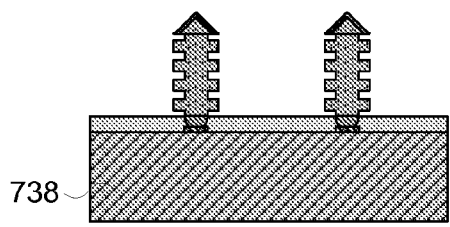

FIGS. 37A-37P depict schematic side views of various states of an example process where probe die are transferred to a permanent substrate and where the process includes use of three temporary substrates.

FIG. 37A the state of the process is shown after a first temporary substrate 702 (e.g., a Si wafer) has been supplied. Probe structures will be formed on this substrate.

In FIG. 37B, the state of the process is shown after substrate 702 has been selectively etched in locations 704 where probe tips are to be formed. In some alternative embodiments, a layer of material may be patterned on the substrate and then patterned to form indentations in which probe tips may be formed. If the first temporary substrate 702 is silicon, the etching can be performed by applying and patterning a photoresist and then performing an anisotropic etch using KOH, for example, and then removing the photoresist.

In FIG. 37C, the state of the process is shown after a seed layer 706 of a sacrificial material or release material (e.g. copper) has been deposited, for example, by sputtering or evaporation. In some variations of this embodiment, an adhesion layer (e.g. of Ti—W) may be applied prior to applying layer 706. In some alternative embodiments, the seed layer and adhesion layer may be eliminated (i.e. not formed) if the substrate 702 is formed of an adequate conductive material or if deposition of tip material is to occur in a manner which does not require a conductive/platable base layer. In some such alternative embodiments, the substrate may be formed from highly-doped silicon material (i.e. conductive material) or the tip material may, at least initially, be deposited by a non-electrolytic process. In some other embodiments, a conductive release layer (e.g. which may be somewhat or significantly thicker than a seed layer material) may be applied (e.g. by sputtering or the like) prior to applying the tip material FIG. 37D depicts the state of the process after a tip coating material 708 (e.g., Rh) has been applied (e.g., by plating or PVD).

FIG. 37E depicts the state of the process after a tip backfill material 712 (e.g. nickel or a nickel alloy) has been thickly plated or otherwise deposited.

In FIG. 37F, the state of the process is shown after the deposited materials have been planarized to a level that eliminates all the tip coating material that is not within initial openings 704 formed in substrate 702 (i.e. all probe tip material that does not form part of an actual probe tip 714 is removed). As illustrated in this example, the planarization leaves the seed layer intact, but this is not required. If the seed layer is removed and if a conductive coating is required for further deposition operations to occur an additional seed layer may be deposited in a blanket manner or in a selective manner. Selective deposition of a second seed layer, and particularly of a sacrificial seed layer material, may be applied in such a way so that it does not exist over the tip backing material.

In FIG. 37G, the state of the process is shown after a microprobe structure 716 has been fabricated from a plurality of layers formed of at least one structural material 720 and at least one sacrificial material 718. The formation process may proceed using any of the various electrochemical fabrication processes set forth herein or incorporated herein by reference or alternatively, in some embodiments, they may be formed using some other process or processes.

FIG. 37H depicts the state of the process after structure 716 has been temporarily bonded to a second temporary substrate 722 using a suitable adhesive material 724 that can later be removed (e.g., a polymer such as wax). If the second temporary substrate 722 is itself removable and capable of adhering to the top of the structure 716 (i.e. portion of structure 716 where the bases of the probes are located), adhesive layer 724 may be eliminated. The second temporary substrate may also be formed from plated material (e.g., Cu) with or without a release layer (e.g., In or Sn—Pb) deposited beneath it between it and the bases of the probe structures.

FIG. 37I depicts the state of the process after the first temporary substrate has been removed (e.g., by etching).

FIG. 37J depicts the state of the process after structure 316 is temporarily bonded to third temporary substrate 726 using a suitable adhesive material 728 that can later be removed (e.g., a polymer such as wax). Adhesive material 728 may be the same as adhesive material 724 or it may be different. Similarly substrate 726 may be formed from the same material as second temporary substrate 722 or it may be formed from a different material. If the third temporary substrate 726 is itself removable and capable of adhering to tip side of structure 716 (i.e. the top of the structure 716 as seen in FIG. 37I), the adhesive layer 728 may be eliminated. The third temporary substrate 726 may also consist of plated material (e.g., Cu) with or without a release layer (e.g., In or Sn—Pb) deposited beneath it. As shown, the adhesive layer is deep enough to accommodate the height of the probe tips without damage to them.

FIG. 37K depicts the state of the process after the second temporary substrate 722 and associated adhesive layer are removed (e.g., by etching the second temporary substrate or by dissolution or melting of the adhesive layer to which it is attached.

FIG. 37L depicts the state of the process after a photoresist 732 has been applied and patterned to have apertures 736 and a solder 734 or other suitable bonding material (e.g., Sn) has been deposited in the apertures 736. In some alternative embodiments, the selective plating of solder could have occurred subsequent to operations that lead to the state of the process shown in FIG. 37H.

FIG. 37M depicts the state of the process after solder 734 has been reflowed and after the photoresist has been stripped.

FIG. 37N depicts the state of the process shown in after the solder coated bases of the probes of structure 716 have been flipped and bonded to a permanent substrate 738 (e.g. a space transformer) provided with bonding pads 742.

FIG. 37O depicts the state of the process after the third temporary substrate 726 has been removed (e.g., by etching a third temporary substrate that is sacrificial or by dissolution or melting of the associated adhesive layer) and after an underfill 744 as been applied (e.g. to protect solder and/or bonding pads during release of sacrificial material). In some alternative embodiments, it may not be necessary or desirable to use an underfill material. In the present embodiment the underfill is permanent but in some alternative embodiments it may be temporary. In either case, the top surface of the underfill is constrained by the lower surface of the sacrificial material that surrounds the probes and forms part of structure 716.

FIG. 37P depicts the state of the process after the sacrificial material 718 has been removed, leaving probes attached to a permanent substrate 738 at their proximal end (i.e. base end) and having tips located on their distal ends.

In some embodiments, problems can arise relating to unintentional formation of conductive bridges between adjacent probes (e.g. formed from excess spreading of solder). During reflow or joining, solder may flow an excess amount and bridge gaps between adjacent pads or bumps. In some alternative embodiments to those presented above, some additional process steps may be taken and/or structural features added to the probes to help minimize the risk of unintentional solder spreading and bridging. One such embodiment described herein next and is illustrated using FIGS. 38A-38F which depict schematic side views of various states of an example process, and sample structures, that may be useful in limiting the unintentional spreading of solder during reflow.

Figure 38A:
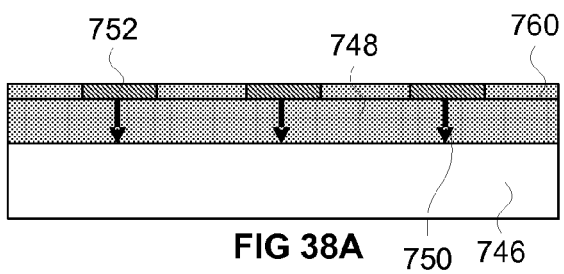
FIGS. 38A-38F depict schematic side views of various states of an example process, and sample structures, that may be useful in limiting the unintentional spreading of solder during reflow.

FIG. 38A depicts the state of the process after probe tips and the main portion of the probe structures (schematically illustrated by reference 750) have been formed along with a sacrificial material 748 on a temporary substrate 746. Probe bases (i.e. bonding pads) 752 are created in a planarized top layer which also includes a sacrificial material 760 which may or may not be different from sacrificial material 748. In some variations of this embodiment, the sacrificial material 760 may be a photoresist or other dielectric material.

Figure 38B:
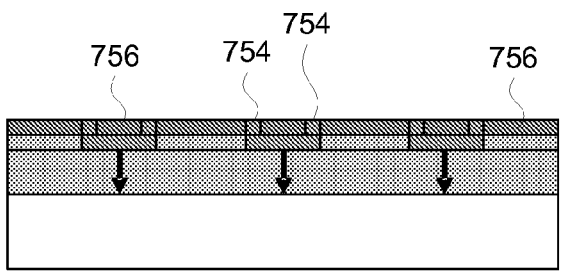

FIG. 38B depicts the state of the process after (1) a photoresist 756 is deposited (e.g. via spin coating) and patterned (e.g. photolithographically) to form ring-like openings above the probe bases 752, (2) a structural material (e.g. nickel or a nickel alloy) is deposited into the openings to form rings 754, and (3) the photoresist and structural material are planarized. In some alternative embodiments, planarization of the photoresist and structural material may not be necessary if the structural material is deposited with sufficient uniformity. In some alternative embodiments, the photoresist may be removed after deposition of the structural material, a harder sacrificial material inserted in its place, planarization performed, and then the harder sacrificial material removed (preferably, though not necessarily, without removing the sacrificial material 760 deposited in association with the previously formed layer). In still other embodiments, the patterning of the photoresist may form openings that have a pattern complementary to that indicated above, a sacrificial material may be deposited, the photoresist removed, structural material deposited and then the combination of sacrificial material and structural material planarized. Those of skill in the art will understand that various other alternative processes may be followed to achieve the states of the process depicted in FIGS. 38A and 38B.

Figure 38C:
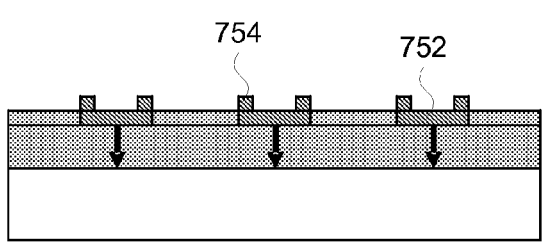

FIG. 38C depicts the state of the process, after the photoresist 756 is removed leaving behind thin rings 754 of structural material sitting on the bases 752 (e.g. the rings may be 10 µms tall and 10 µms wide).

Figure 38D:
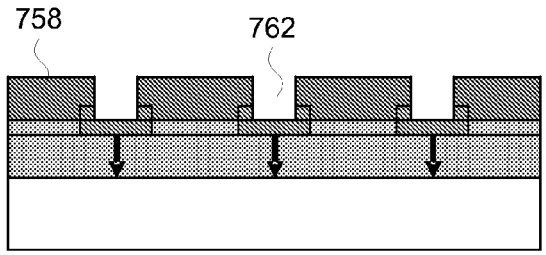

FIG. 38D depicts the state of the process, after a thick photoresist 758 has been deposited (e.g. via spin coating) on rings 754, bases 752, and sacrificial material 760 and patterned (e.g. via photolithography) to create openings 762 that extend down to the bases 752 but preferably not over rings 754. These openings 762 are created to allow deposition (e.g. via electroplating) of solder (e.g. Sn) onto the bases 752 and within the rings 754.

Figure 38E:
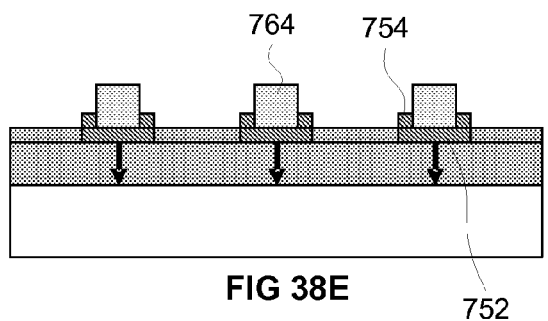

FIG. 38E depicts the state of the process after solder (e.g. Sn) has been plated into openings 762 and the photoresist removed to create solder bumps 764 sitting on top of Ni bases 752 with their bottom portions surround by short rings 754 of structural material.

Figure 38F:
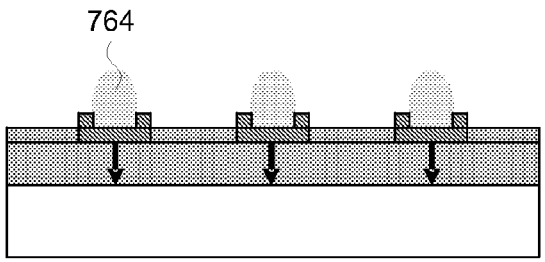

FIG. 38F depicts the state of the process after the solder bumps have been reflowed to shape and round them. It is believed that the shallow cup formed by bases 752 and rings 754 will help keep the solder from overflowing and bridging gaps between adjacent bumps. The resulting probe die may undergo transfer from their temporary substrates to permanent substrates using any of the various approaches set forth in the embodiments and their alternatives discussed herein before or those to be discussed herein after or their alternatives. In some alternative embodiments, instead of using sacrificial material 760, a non-sacrificial dielectric material may be used as a permanent or temporary part of any probe arrays formed particularly if the dielectric material resists wetting by the solder (i.e. acts as solder mask) or if any added structural strength offered by the dielectric is beneficial.

The process illustrated in FIGS. 38A-38F may be summarized as follows: (1) create probes including tips (if desired) and bonding pads in a desired manner such that sacrificial material surrounds the main body of the probes and either sacrificial material or a dielectric solder mask material surround the bases, (2) apply and pattern a photoresist to form ring-like openings over the probe bases, (3) deposit a desired structural material (e.g. nickel or a nickel alloy) into the openings, (4) optionally planarize the structural material and potentially the photoresist, (5) remove the photoresist, (6) apply another layer of photoresist, which may be taller than the previous layer of photoresist, and pattern it to form openings within the rings of structural material located on the probe bases, (7) deposit solder (e.g. tin) into the openings, (8) optionally planarize the deposited solder to ensure uniform volumes exist within each opening, (9) remove the photoresist, (10) optionally reflow the solder to form solder bumps with rounded surfaces. This process results in a probe array that is capable of being transferred to a permanent substrate that includes a bonding structure including the probe bases, the rings, and the solder deposited within the rings. In this embodiment, it is intended that the rings' heights be shorter than the final thickness of the solder bumps so that the rings will not interfere with the solder's ability to make contact with and wet the bonding pads of a permanent substrate. When the solder is reflowed, the ring aids in keeping the molten solder (e.g. tin) from spreading out and over the base and onto adjacent bumps. This effect is aided by the tendency for the molten solder to reflow into a more vertical shape instead of as a laterally spread-out sphere. This embodiment may advantageously provide taller solder bumps or bumps with a large height to width aspect ration than would otherwise be obtainable and as such may offer more tolerance to coefficient of thermal expansion (CTE) mismatches between unreleased probe die array and permanent substrates.

In some alternatives to the embodiment of FIGS. 38A-38F, the solder may not be initially applied to the probe bases within the rings but instead may be applied to the permanent substrate and contacted to the probe bases within the rings in anticipation of bonding. In still other alternative embodiments, instead of forming the rings on the probe bases and depositing the solder on the probe bases within the rings, the rings may be formed on contact pads on the permanent substrate and the solder located initially on either the probe bases or within the rings on the permanent substrate and thereafter contacted to the other of the permanent substrate or probe bases in anticipation of bonding. In still other alternative embodiments, rings may be formed on both the probe bases and the contact pads of the permanent substrate and the solder initially placed within rings on a selected one of the components to be bonded or on both of the components.

In other alternative embodiments, the rings may be formed from a different structural material than that used in forming the probes themselves. The ring or collar material may be a conductive material (e.g. W, Ti, Ta, or the like) or a dielectric material (e.g. a polymer). The ring material may be treated prior to reflowing of the solder to reduce its ability to be wetted by the solder. The ring material may be a secondary sacrificial material in that it may exist during solder reflow and bonding but may be removed thereafter (e.g. prior to putting the bonding structure into its intended use). The ring material may be rigid or semiflexible. In some embodiments the ring material around each solder bump may be isolated from similar material around adjacent bumps or it may be bridge the gaps between adjacent bumps.

The structures created and the process for creating them as set forth in FIGS. 38A-38F, and the alternatives presented thereto, may advantageously provide taller solder bumps than otherwise obtainable and as such may offer more tolerance to coefficient of thermal expansion (CTE) mismatches between unreleased probe die array and permanent substrates. Variations of the embodiment of FIGS. 38A-38F and its alternatives may be applied to the bonding of other components (i.e. components that do not have probes to be bonded). The solder bumps of enhanced height may result from locating solder within specially created retention rings on one or both substrates or components either initially or upon bonding or in anticipation of bonding. In other words, the technique for creating solder bumps of enhanced height may have application for bonding other components and particularly other components where coefficient of thermal expansion (CTE) mismatches tend to cause thermal cycling failure problems. Such components may include, for example, ICs and PCBs, ICs and MLCs, ICs and other electronic components, or PCBs and MLCs. These solder bumps of enhanced height may have application in bonding any substrates where flip chip-like bonding is being used currently or where it may have application.

Flip chip area array interconnection technology is a powerful method for simultaneously joining hundreds or even thousands of probes in probe array dies or chips to a space transformer substrate. This method, widely used in semiconductor packaging is adapted by the various teachings herein to the joining of probe array die or chips, fabricated by electrochemical and potentially other processes, to permanent substrates. As noted above and as addressed in the embodiment of FIGS. 38A-38F and its alternatives, enhanced processing and structure formation may be used to minimize or eliminate unintended solder bridges that could otherwise make some probe assemblies unusable. However, even if enhanced process and structure formation techniques are used, there remains a possibility that isolated solder bridges may persist despite efforts to prevent them. As such in some embodiments it may be desirable to implement processes that can repair structures where intended bridging remains. One such technique may involve the forcing of a current of sufficient magnitude through the unintended bridges to heat and melt them in a manner analogous to opening a fuse.

Figure 39:
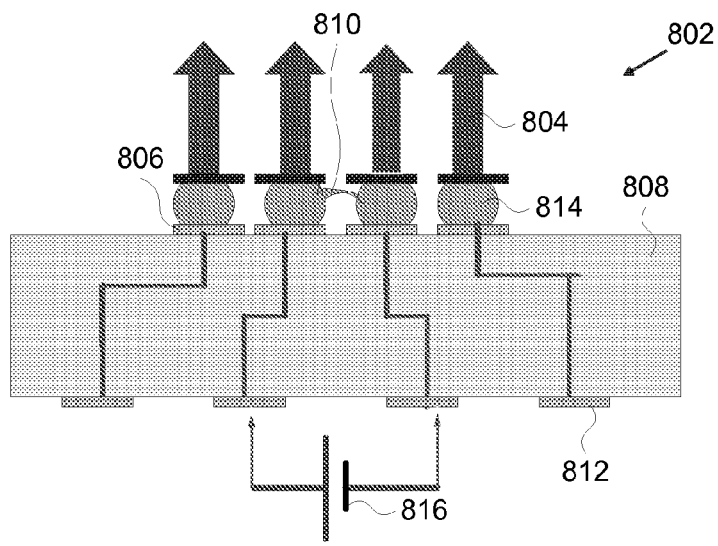
FIG. 39 provides a schematic illustration of a side view of a repair set up that may be used to destroy or open an unintended solder bridge.

FIG. 39 provides a schematic illustration of a side view of a repair set up 802 that may be used to destroy or open an unintended solder bridge 810. Probes 804 are connected to the pads 806 on the permanent substrate 808 (e.g. a space transformer) via solder balls 814. The space transformer in turn connects upper surface pads 806 to respective lower surface pads 812 which have a generally wider spacing then do upper surface pads 806. The bridging short between any two pads can be electrically accessed through associated pads 812. Once the correct pair of lower surface pads 812 associated with a solder bridge are identified, an electric current is sent through these contacts (e.g. by discharging a capacitor or current source 816. By progressively increasing the current, one can eventually reach a level suitable for melting or vaporizing the bridge. The existence of unintended bridges may be identified by checking resistivity between each pad and its immediate neighboring pads and similarly the destruction of unintended bridges may be verified in an analogous manner.

In a probe array, unlike in a semiconductor chip, the current sent can generally only pass through an intended solder bridge and not thorough any sensitive circuits that could sustain damage. Hence this testing scheme is believed to have reasonably general applicability.

In semiconductor packaging flip chip interconnection method has been in use for many years. Initially developed at IBM to form high density area array solder interconnections between silicon chips and ceramic substrates, it is now proliferating into so-called direct chip attach, (i.e. mounting of chips directly onto polymeric substrates and even onto printed circuit boards). Since polymeric substrates have much higher coefficients of expansion compared to ceramic substrates, the risk of solder joint failure due to thermal fatigue is very high in these assemblies. To mitigate this risk, the space between the chip and the substrate is back-filled with polymeric materials. Other methods to improve this fatigue life have included forming a polymer collar around each solder interconnection, because the fatigue failure generally starts at the chip-solder interface. Other methods may involve creation of elongated solder columns by joining preformed columns, or by elongating traditionally formed solder bonds (e.g. by reheating after bonding while pulling the chip from the opposing surface). In this approach, solder fatigue life improves because it is directly proportional to the square of the interconnection length. As the interconnection densities increase, these methods may encounter difficulties due to high cost or to lack of proper materials and/or control.

An embodiment to obtain elongated solder arrays for flip chip joining, as presented above in FIGS. 38A-38F and its alternatives, produces a high modulus metallic collar around the solder joints at the chip-solder interface. Combination of the extended length and the high modulus metallic collar at the point of general bump failure is expected to significantly improve thermal fatigue life of the solder interconnections. Another potentially significant advantage of the above described embodiment is that it can be carried out at wafer-level, by processes which are in line with those used in semiconductor processing. As such, there may be a high value added incentive for implementing this method and associated structural configurations in semiconductor fabrication processes and facilities, e.g. in some embodiments, this may free fabricators from the need and cost of doing 'under-filling' to improve thermal fatigue life. In some alternative embodiments, as noted above, the collar material may be of lower modulus and may undergo significant elastic or plastic deformation during temperature variations. In still other embodiments, the collars or rings may be discontinuous (e.g. 3-5 arcs with small separations between them which may provide more flexibility while still providing significant retention and height enhancement for the bumps.

FIGS. 40A-40D provide schematic side views of various states of an alternative process for forming solder balls having enhanced height and structures that constrain the lower portion of solder bumps.

Figure 40A:
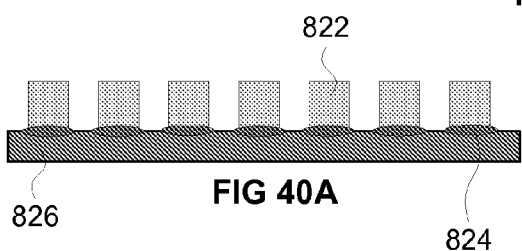
FIGS. 40A-40D provide schematic side views of various states of an alternative process for forming solder balls having enhanced height and structures that constrain the lower portion of solder bumps.

FIG. 40A depicts the state of the process after solder columns 822 are formed on terminal pads 824 of a permanent substrate 826 (e.g. a semiconductor wafer). The solder columns, for example, may be formed by electroplating the solder composition (Sn, lead-alloys, lead-tin alloys, tin alloys, and the like) through a patterned photoresist mask that was adhered to or contacted to the substrate and thereafter removed.

Figure 40B:
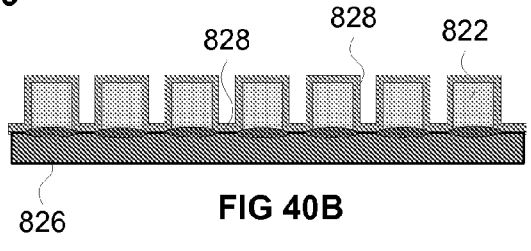

FIG. 40B depicts the state of the process after a ring material 828 (e.g. a thin layer (100-2000 angstroms) of TiW (titanium-tungsten) is deposited (e.g. via sputtering) over the exposed portions of the substrate, and over the tops and sides of the solder columns.

Figure 40C:
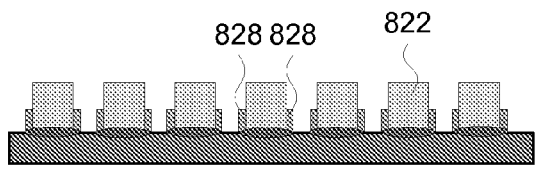

FIG. 40C depicts the state of the process after line of sight etching is performed to remove the ring material from the tops of the solder columns, from the upper portion of the material coating the sidewalls of the solder columns, and from the ring material lying between the solder columns but not against the solder columns. In other words, a predefined thickness of ring material is removed along the direction that is perpendicular to the surface of substrate 824. This leaves a collar of ring material around the base of each solder column 822 up to a predetermined height.

Figure 40D:
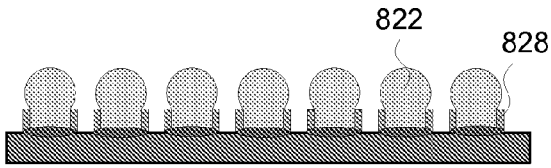

FIG. 40D depicts the state of the process after the solder is reflowed in a furnace or on a hot plate. The reflow may occur in the presence of passive or active solder flux and/or it may occur in a vacuum, neutral, or reducing atmosphere. During this reflow, the solder melts, but only the solder above the ring material collar 828 will take on a ball-like shape. The ring shape of the collar remains intact and acts as a shaping container for the lower portion of the solder column. The result is a reflowed solder column with a solder ball at its end and having a taller profile (i.e. height to width ratio) than would exist in the absence of the collar. The material forming the collar may be considered termed a retention material as it is intend to constraint the horizontal spread of the solder. The collar material may function as a solder mask material, particularly if it tends to resist wetting by the solder and thus limits the spread of solder to prohibited locations. Enhanced height of solder columns may make bonded electric components (e.g. first and second electric components) having different coefficients of thermal expansion less susceptible to thermal cycling failure.

Variations of the process set forth in FIGS. 40A-40D and the resulting structures are possible. For example different ratios of collar height and solder height may be formed, ring structures need not be circular but instead may be elliptical, rectangular, hexagonal, contain breaks, vertical or horizontal extending openings, or the like. Initial deposition of collar material between adjacent solder columns away from the column walls may be avoided by locating patterned photoresist or other masking or sacrificial material in those locations and removing the material after deposition. Similarly, deposition of collar material above solder columns may be avoided by locating a masking material at those locations at the time of deposition. If the collar, ring, or retention material does not provide significant solder masking effect, but only height retention, a solder mask material may be located between the rings of retention material Collar material may take on different forms. Metals (other than TiW) or non-metals may be suitable for use as collars. Examples of such materials include Ti, Al, Cr, silica, and the like. The chosen material is preferably easily deposited and patterned, preferably non-wetting to the molten solder, and preferably able to withstand the reflow and joining temperatures without cracking or peeling or undergoing other detrimental effects. For example, if the collar material is a dielectric it may not need to be removed from between the solder columns but instead can coat the substrate between the solder columns.

Solder masking is an important technique used in the packaging industry. It is often used to enhance the quality of the bonding that is carried out in marrying components at the systems packaging level. Solder masking may be implemented in a wide variety of methods and technologies. In some embodiments, it is preferable that the following attributes exist: (1) the solder mask material needs to be robust—it must be capable of surviving the various post-processing steps to which the devices may be subjected, including potentially dicing and slicing operations, as well as thermal cycling; (2) the solder mask material must be compatible with the various chemicals to which may be exposed during post-processing; (3). the solder masking method should be readily implemented and it should posses reasonable process latitude, and (4) ideally it should be capable of both die-level and wafer-level implementation; (5) in some embodiments, it may be beneficial if the solder mask could be removed after the release of devices. In various alternative embodiments, these attributes may exist only in part while in other embodiments each may be present.

In another embodiment for forming solder bumps of enhanced height, the following process may be used:
   (1) a solder mask material is diluted to form a low viscosity solution or mixture of a solder masking material and a solvent;
   (2) the solution is made to cover solder bumps located on a die, substrate, or on structures (i.e. parts) that are formed on a die that includes a substrate and other deposited materials;
   (3) the solvent is allowed to evaporate, thereby resulting in an approximately conformal coating of solder mask material over the solder bumps and surface of the die;
   (4) steps (2) and (3) may be, optionally repeated to ensure proper coverage;
   (5) optionally, the film of solder masking material may be baked to further drive off any residual solvent;
   (6) the part or parts containing the coated bumps are heat treated to reflow the solder bumps, this heat treating may occur in the presence of flux and/or an inert or reducing atmosphere, this heat treatment will result in a rounding of the solder bump tips and the potential removal of masking material from those tip regions;
   (7) optionally the reflowed bumps and solder mask material may be cleaned, for example so residual solder mask material from the tip regions may be swept away and a cleaner tip achieved;
   (8) the solder bumps and solder mask material may be inspected to determined the quality of the rounding, the exposure of the tips of the bumps, and the integrity of the solder mask material coating on the lower portions of the bumps and potentially between the bumps;
   (9) if the quality of the bumps and masking material is determined adequate, the process may proceed to step (12)
   (10) if the quality of the bumps and masking material is determined to be inadequate, the solder masking material may be stripped and then reapplied using the operations of steps (2)-(5)
   (11) the tips of the solder material may be revealed (i.e. the solder masking material may be removed from the tips), for example by: (a) physical abrasion, (b) controlled etching (particularly line of sight etching directed perpendicular to the surface of the substrate, or (c) lift-off like process where a photoresist or other suitable material could have been located between the bump tips and then the solder mask material lifted off in these selected regions;
   (12) the part is bonded to a receiving element (e.g. permanent substrate) and any embedded structures (e.g. probe arrays) released from any sacrificial material, and temporary substrate;
   (13) if needed an additional cleaning step or etching step may be used to remove any unwanted solder mask material.

Figure 41A:
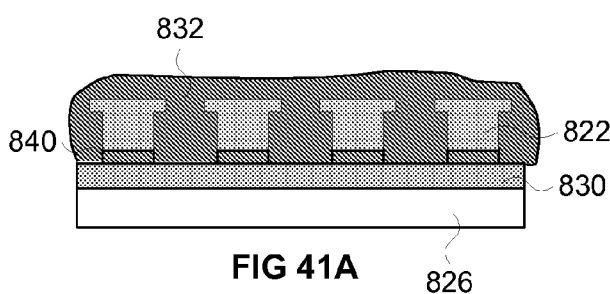
FIG. 41A-41H provide schematic side views of various states of an alternative process for forming solder balls having enhanced height wherein a solder mask material is applied via a solution containing a solvent.

An example of the above alternative process is illustrated in FIGS. 41A-41H. FIG. 41A depicts the state of the process after a part (e.g. a probe die or semiconductor die) including a substrate 826 (e.g. a temporary substrate), possibly previously deposited layers 830, bases or pads 840, and solder bumps 822 is immersed into a solution 832 containing a solder mask material 834 dissolved in a solvent. The shape of the solder bumps in this example is not particularly relevant. The indicated shape may, for example, be formed by overfilling a solder into a photoresist mask. In other embodiments, for example the solder may have a non-overhanging tip end (e.g. resulting from not overfilling a deposition mask).

Figure 41B:
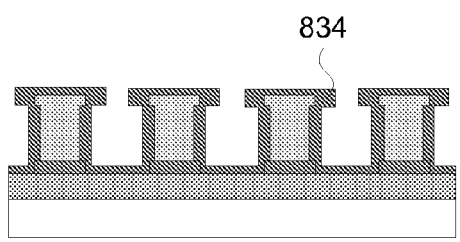

FIG. 41B depicts the state of the process after solvent from the solution is evaporated leaving behind a thin film of the solder mask material 834 that coats all surfaces. The coating of solder mask material may be approximately conformal over the surfaces of the solder bumps and over the upper surface of the previously deposited layers 830 (assuming they are present). The state depicted in FIG. 41B may have resulted from a plurality of coating and evaporation processes.

Figure 41C:
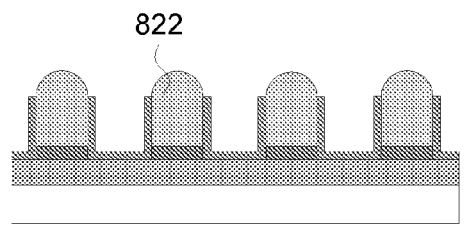

FIG. 41C depicts the state of the process after a heating operation is performed (e.g. to diffusion bond layers 830 of deposited material) which results in reflowing and reshaping of the of the tip ends of the solder to achieve, e.g., hemispherical tip ends. If the reflow results in a clean removal of solder mask material from the tip ends, it may be desirable to skip the operations leading to the states shown in FIGS. 41E-41G and move immediately to the bonding operation which results in the state of the process shown in FIG. 41H.

Figure 41D:
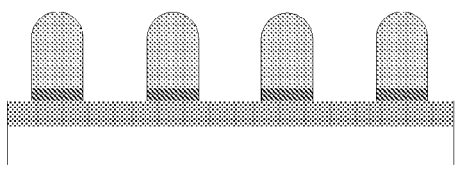
Figure 41E:
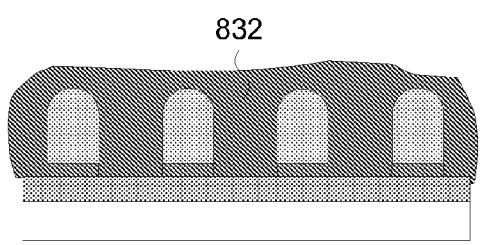
Figure 41F:
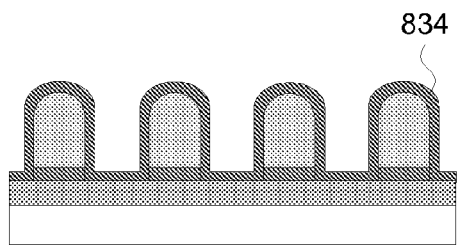

Assuming that the resulting solder mask is not adequate to perform bonding, the solder mask film may be removed as shown in FIG. 41D. Recoating with flowable solder material solution (as shown in FIG. 41E) may be performed and subsequent evaporation used to yield a new solder mask 834 of desired integrity.

Figure 41G:
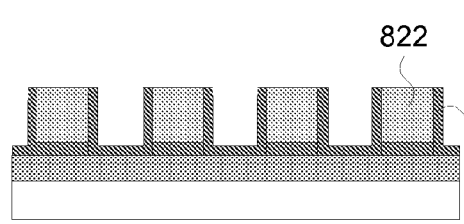

FIG. 41G depicts the state of the process after a light abrasion of the top of the solder bumps 822 has been performed to expose the solder material through the solder mask film 834. In an alternative embodiment, selective line of sight etching may be used to remove solder mask material from the tip regions and may be from between the solder bumps while leaving behind the film of solder mask material on the side walls of the bumps. In another alternative embodiment, for example, a shield may be applied to the bump tips prior to solder mask material coating and then lift off used to remove the solder masking material form the tips.

Figure 41H:
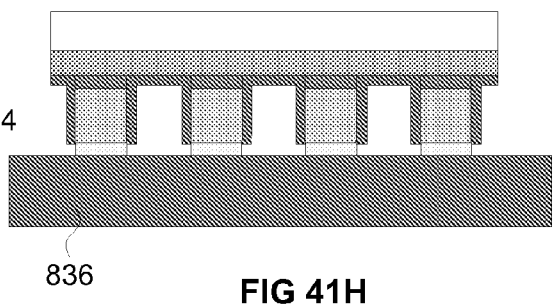

FIG. 41H depicts the state of the process after the part is bonded to a substrate 836 but prior to removal of the substrate 826, if it is a temporary substrate, and/or removal of any sacrificial material forming layers 830.

Various alternatives to the embodiment of FIGS. 41A-41H are possible. For example, in some alternative embodiments, the state of the process depicted in FIG. 41B may be followed by a planarization operation that removes solder masking material from the tip regions of the solder bumps, which in turn may be followed by a solder electroplating process that enhances the height of the bumps, then by a reflow process and finally by a bonding process as shown in FIG. 41H. In still other embodiments, the bases 840 may already exist in the layers of previously deposited material and thus do not need to be formed as part of a subsequent layer as shown.

FIGS. 42A-42E provide schematic side views of various states of an alternative process for forming solder balls separated by solder mask material and possibly having enhanced height wherein a solder mask material is applied as a photo-definable material. In this alternative process, the photo-definable material may be a photopolymer or photoresist 838 that has the required thermal and chemical properties (such as polyimide) and that can be lithographically patterned. The processing of this embodiment may occur at the diced stage of processing or at a pre-diced stage. The photoresist can be spin-cast on the surface of deposited layers of a material 830 located on substrate 826 (e.g. a temporary substrate or semiconductor device, or the like). It may then be exposed to a selected pattern of radiation and patterned to develop out openings 842 over the previously formed layers where mating between the previously formed layers and a permanent substrate is to occur (in other words in locations where solder bumps are to be formed). If desired, a second photopolymer or photoresist 844 may be applied and patterned to form openings aligned with the previous openings. In some alternative embodiments, the first photoresist may be of the negative type while the second photoresist may be of the positive type. In still other embodiments, the photoresist may be of the same type but subject to dissolution by different solvents or processes.

If necessary, base material, 840 can then be plated or otherwise deposited after which the solder material 822 may also be plated or otherwise deposited. In embodiments where a single photoresist is used, it is preferable that overplating of solder occur while in embodiments where two different photoresists are used, it may only be necessary to deposit solder to a height which extends above the height of the first photoresist 838 by a desired amount and which does not extend above the height of the second photoresist 844.

Once the electroplating of the solder is complete, it is reflowed thereby forming bumps with hemispherical tips. The first and/or second photoresist will serve to prevent the solder from wetting the surface of the previously deposited layers 830 and thus prevent any bridging or skirting of solder between bump positions. If two photoresists are used, it may be desirable to remove the second photoresist before or after reflow and thereafter to bond the structures created in the previously formed layers to permanent or second substrate 846. Thereafter, the structure or structures may be released from any sacrificial material and the previous substrate 826 if it is a temporary substrate. In some variations of this embodiment, the first and possibly the second photoresists may remain to enhance structural integrity of the bonds.

Figure 42A:
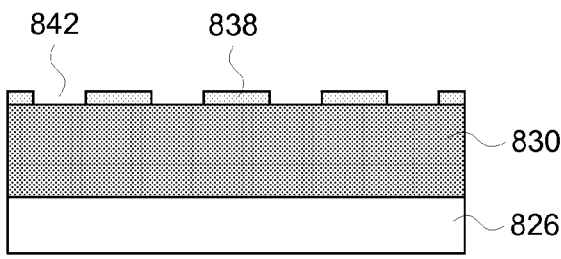
FIGS. 42A-42E provide schematic side views of various states of an alternative process for forming solder balls separated by solder mask material and possibly having enhanced height wherein a solder mask material is applied as a photo-definable material.

FIG. 42A depicts the state of the process after a polymer is spun on and patterned on to serve as a solder mask 838. Patterned holes 842 locate positions corresponding to bases and solder bumps that will be formed in a subsequent step.

Figure 42B:
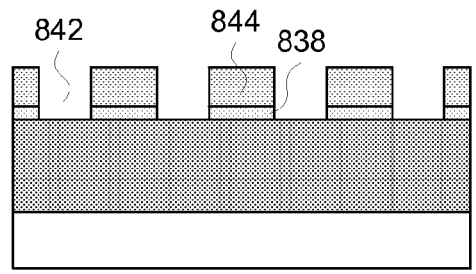

FIG. 42B depicts the state of the process after a photoresist 844 is spun on and patterned to increase the height of the dielectric material that defines the location of positions for bases and solder bumps that will be formed in a subsequent step.

Figure 42C:
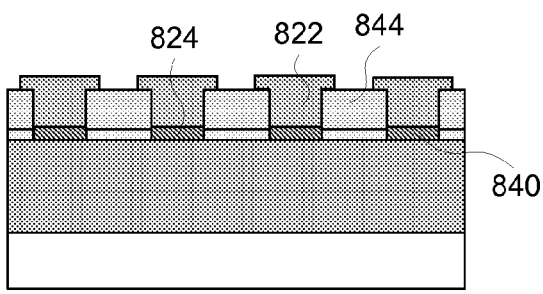

FIG. 42C depicts the state of the process after bases 824 and solder bumps 822 have been electroplated. In some alternative embodiments, for example, bases may be deposited in openings within the solder mask 842 and then the combination may be planarized after which photoresist 844 and solder 822 may be patterned and deposited respectively. In other alternative embodiments, deposition may occur by operations that are not electroplating operations.

Figure 42D:
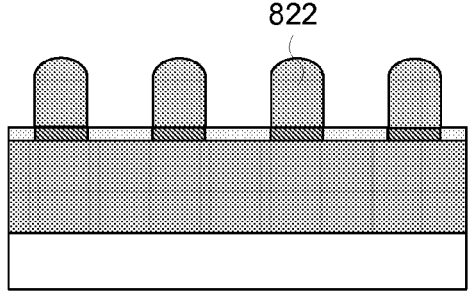

FIG. 42D depicts the state of the process after solder is reflowed and photoresist 844 is removed. In variations of the steps leading to this state, solder may be reflowed before or after removal of the photopolymer.

Figure 42E:
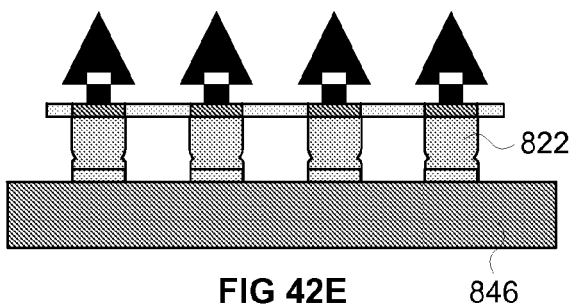

FIG. 42E depicts the state of the process after the layers of deposited material on substrate 826 are bonded to a substrate 846, the sacrificial material released, and the substrate 826 removed to reveal the structures (e.g. probes). The polymer solder mask material 824 remains behind with the bonded structures. In some alternative embodiments, the original substrate 826 may remain attached to the deposited layers and to substrate 846 after transfer. In other variations of this embodiment, the structures transferred and bonded using the enhanced solder bumps of this embodiment may be semiconductor devices, PCBs, space transformers or other electronic components and the receiving substrates 846 may be semiconductor devices, PCBs, space transformers, other electronic components, or the like.

FIGS. 43A-43F, 44A-44F, 45A-45H, and 46A-46F depict additional alternative embodiments where solder mask material is provided in the form of a passivating refractory material. Such solder mask materials may include, for example, conductive materials such as Ti or TiW or dielectrics such as $SiO_2$. For example, TiW can be deposited via PVD over the surface of the die so that it will coat the surface of the die to prevent any wetting by the solder.

The process illustrated in FIGS. 43A-43F includes steps to form a bonding base and solder bump (e.g. by depositing them into openings in a photoresist and then removing the photoresist); then protecting the solder bumps for lift-off (e.g. using a selectively patterned photoresist located on the tops of the bumps); then depositing the refractory material (e.g. by plating, PVD, or CVD); then performing lift-off to remove the protective material and the refractory material from the tip regions of the bumps, then reflowing the solder, and finally bonding. The process can take place at either die-level or wafer-level. In some alternative embodiments, it may not be strictly necessary to reflow the solder prior to bonding. In variations of this embodiment, the solder mask material may be retained after bonding (e.g. when it is a dielectric) or removed after bonding (e.g. when it is a conductive material and electrical isolation between solder balls is required). In variations of this embodiment, the original substrate may be removed or retained after bonding.

Figure 43A:
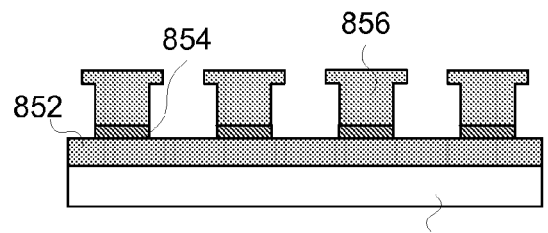
FIGS. 43A-43F provide schematic side views of various states of a first embodiment where solder mask material is supplied onto solder bumps in the form of a refractory material and is removed from solder bump ends via a lift off process.

FIG. 43A depicts the state of the process after deposition (e.g. via electroplating into a photoresist mask) of bonding bases 854 and solder bumps 856 on layers 852 of deposited material or materials which in turn are located on a substrate 850 and after removal of any masking material (e.g. a photoresist) which provided the pattern into which deposition was to occur. In some alternative embodiments layers of deposited material need not exist (e.g. when the substrate contains features that are to be retained after transfer).

Figure 43B:
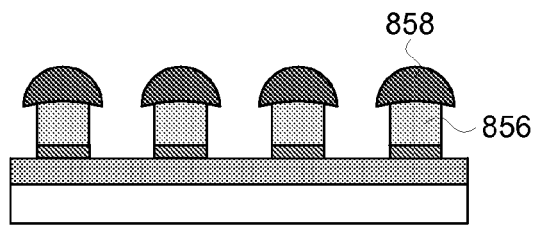

FIG. 43B depicts the state of the process after a protective shield material 858 (e.g. photoresist) is applied to the tops of the solder bumps.

Figure 43C:
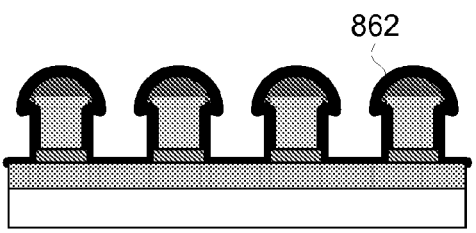

FIG. 43C depicts the state of the process after a refractory material 862 is made to coat the solder bumps and the regions between the solder bumps. The coating may be applied, for example, via plating, PVD, CVD, or the like. For example, TiW can be sputtered on the surface to form a conformal coating of refractory material.

Figure 43D:
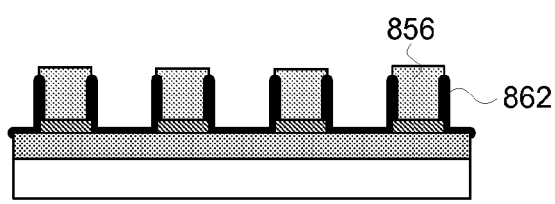

FIG. 43D depicts the state of the process after lift-off of the protective shield material and overlying refractory material from the top region of the solder bumps has occurred. This results in exposure of the tops of the solder bumps while refractory material (e.g. TiW) remains around the sides of the solder columns and on the regions between the solder bumps.

Figure 43E:
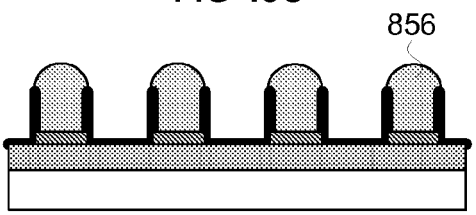

FIG. 43E depicts the state of the process after solder reflow has occurred which reshapes the bumps so that the portions not held within the cylinders of refractory material are reformed into rounded shapes (e.g. hemispherical shapes)

Figure 43F:
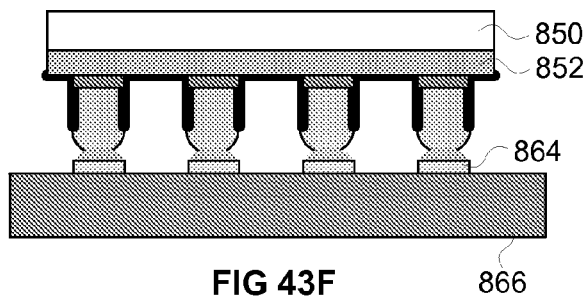

In FIG. 43F the state of the process is shown after flipping and bonding to bonding pads 864 on substrate 866 occurs. Extensions of the process may include one or more of: (1) releasing any structure in layers 852 from a sacrificial material, (2) removing the refractory material 862 (e.g. it may be removed by the same etching operations or process that removes the sacrificial material, and/or (3) removing the initial substrate 850. In variations of these processes the order of removal may be changed.

The process illustrated in FIGS. 44A-44F includes steps to form a solder mask from a refractory material prior to the formation of solder bumps. After formation of a planar surface, e.g. at the wafer level (i.e. before dicing), a refractory material is blanket deposited to form a film (e.g. via plating, PVD, CVD, or the like) but prior to the formation of the solder bumps. Once the film is deposited, patterned masking material is applied (e.g. via spin coating; exposing, and patterning a photoresist; or via selective deposition of a material by ink jet). The patterning is selected to locate openings above the solder mask where solder and possibly a bonding base are to be located. After application and patterning of the masking material, exposed regions of the refractory material are removed via etching. Once the openings in the masking material are clear of the refractory material, the base (if desired) and solder bumps are deposited (e.g. via plating) and the masking material is removed to reveal the refractory material left behind on the planar surface of the wafer (i.e. on the substrate or previously formed layers of material). Next, the solder is reflowed to give it a rounded top surface and then bonding occurs. As discussed above in association with the preceding embodiment, subsequent operations may remove sacrificial material from the previously formed layers, the remaining refractory material may be removed, and the original substrate to which the previously formed layers were attached may be removed.

Figure 44A:
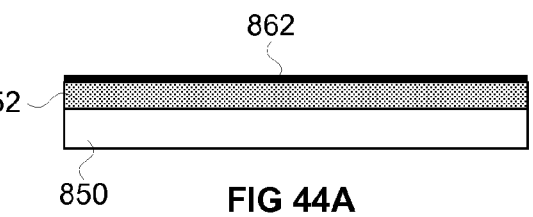
FIGS. 44A-44F schematic side views of various states of a second embodiment where solder mask material is supplied in the form of a refractory material which is deposited prior to the formation of solder bumps.

FIG. 44A depicts the state of the process after deposition of a refractory solder mask material 862 (e.g. TiW via PVD or the like) onto a planar surface of the previously deposited layers 852 which are located on substrate 850.

Figure 44B:
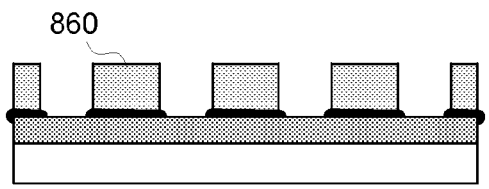

FIG. 44B depicts the state of the process after a photoresist 860, or other masking material, is deposited (e.g. via spin coating) and patterned (e.g. via selective exposure and development) to form a mask or mold having openings for allowing selective etching of the refractory material and for receiving bonding base material (if desired) and solder.

Figure 44C:
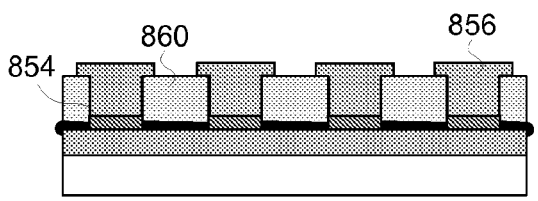

FIG. 44C depicts the state of the process after the refractory solder mask material, such as TiW, has been etched and bonding bases 854 and solder mask material 856 has been deposited (e.g. via electroplating).

Figure 44D:
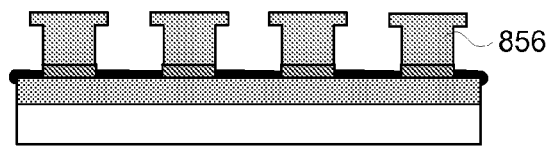

FIG. 44D depicts the state of the process after the photoresist has been stripped.

Figure 44E:
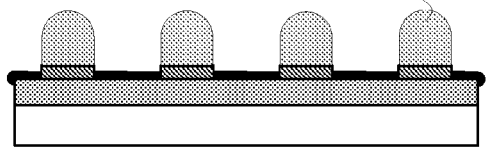

FIG. 44E depicts the state of the process after solder reflow has been performed to round the tops of the solder bumps (e.g. into hemispheres). The reflow may occur during a diffusion bonding process that is used to improve adhesion between layers of a structural material that form part of the previously formed layers 852. The solder mask material, e.g. TiW, will serve to prevent excess spreading of the solder during flow and help prevent possible bridging of solder between adjacent bumps.

Figure 44F:
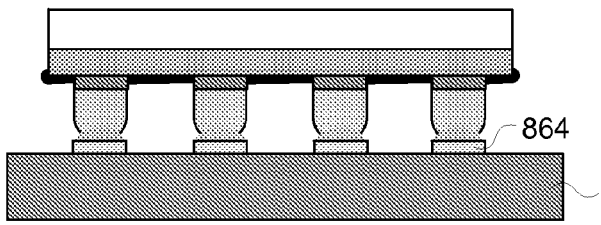

FIG. 44F depicts the state of the process after flipping and bonding to bonding pads 864 on substrate 866 occurs. In subsequent operations (not shown), the remaining solder mask material may be removed (particularly when it is conductive and electrical isolation between bumps is required), any sacrificial material which is part of the previously formed layers 852 may be removed, and if desired the substrate 850 may be removed.

The process illustrated in FIGS. 45A-45H includes steps to form a solder mask from a refractory material and lifting off selected portions of the solder mask material prior to the formation of solder bumps. In this process a planar surface is created (e.g. of previously formed layers, including structural and sacrificial material located on an initial substrate). A photoresist pattern is created such that they form bumps in locations where bonding bases and solder will be located. Next the refractory material is deposited after which lift-off of the photoresist and overlying refractory material is performed. This results in openings in the refractory film at the locations where bonding bases and solder are to be located. Next a photoresist or other masking material is supplied and patterned to form openings aligned with previous openings in the solder mask material. Next bonding base material (if desired) and solder mask material are deposited into the openings after which the photoresist is removed and solder reflow is made to occur. In some alternative embodiments, solder reflow may occur prior to removal of the photoresist. Next bonding to bonding pads on a second substrate occurs via the solder bumps. Sacrificial material may be removed, remaining portions of solder mask material may be removed, and the initial substrate may be removed. In variations of this embodiment the bonding and removal processes may be performed in a variety of orders.

Figure 45A:
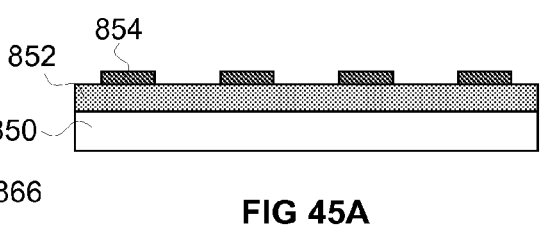
FIGS. 45A-45H schematic side views of various states of a third embodiment where solder mask material is supplied in the form of a refractory material and where lift off of selected portions of the solder mask material occur prior to the formation of solder bumps.

FIG. 45A depicts the state of the process after a photoresist is deposited (e.g. via spin coating) and patterned to create sacrificial plugs 854 where the solder bumps will eventually be formed on the surface of previously formed layers 852 of a structure which are located on a substrate 850.

Figure 45B:
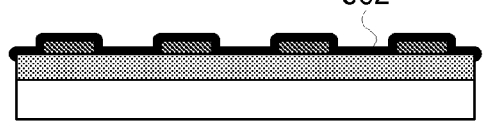

FIG. 45B depicts the state of the process after a refractory solder mask material 862 (e.g. TiW) is deposited (e.g. via PVD) by sputtering to form a thin film coating over the entire surface which includes portions of the uppermost previously formed layers 852 and the upper surface of the patterned sacrificial plugs 854.

Figure 45C:
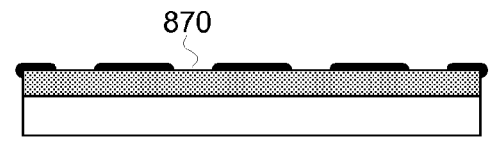

FIG. 45C depicts the state of the process after a lift off of the sacrificial plugs 854 and overlying refractory material is performed which produces openings 870 in the refractory material.

Figure 45D:
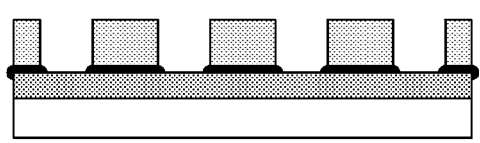

FIG. 45D depicts the state of the process after a photoresist is applied and patterned to produce opening overlying openings 870 into which bonding base material and solder may be deposited.

Figure 45E:
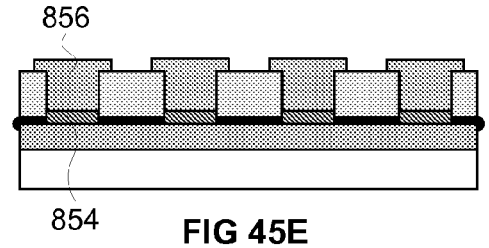

FIG. 45E depicts the state of the process after deposition of bonding base material 854 and solder 856 is deposited (e.g. via electroplating). As indicated, in this embodiment, the solder is made to overfill the openings in the solder mask. As with various other embodiments, presented herein, in alternative embodiments, the solder may be deposited so that it does not overfill the photoresist.

Figure 45F:
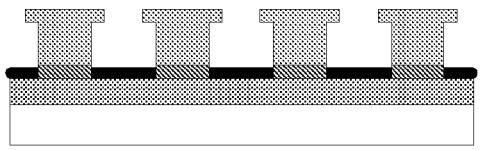

FIG. 45F depicts the state of the process after the photoresist is stripped.

Figure 45G:
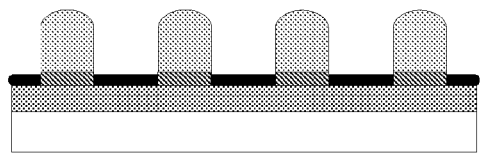

FIG. 45G depicts the state of the process after a heating operation causes reflow of the solder bumps and a rounding of their upper surfaces. In some alternative embodiments, the reflowing may occur prior to removal of the photoresist or possibly during the removal. In some variations of the embodiment, the heat treatment used to reflow the solder may also be used to cause diffusion bonding of the structural material located in layers 852. During this heating operation, the solder may be subjected to, for example, an atmosphere of inert gas, reducing gas, or vacuum. In some embodiments it may be acceptable to have the solder exposed to normal atmosphere during reflow. The presence of the refractory material will inhibit flow of solder between adjacent bumps and thereby help present bridging and associated electrical shorts.

Figure 45H:
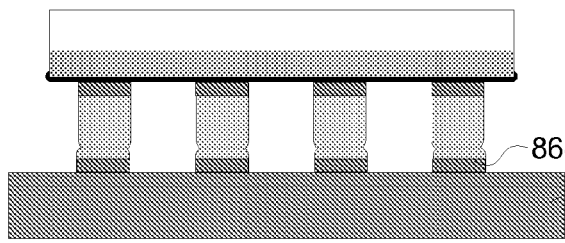

FIG. 45H depicts the state of the process after flipping and bonding to pads 864 on substrate 866 has occurred. In subsequent operations, not shown, removal of sacrificial material may occur, removal of the original substrate 850, and the removal of the refractory material may also occur.

The process illustrated in FIGS. 46A-46F includes steps to form a solder mask from a refractory material that functions as an adhesion layer for a seed layer which will underlie the bonding pads and solder bumps. In this process, a film of a refractory material 862 (e.g. TiW) is applied to the upper surface of a stack of previously formed layers 852 which includes a structural material having a desired configuration along with a sacrificial material. The layers of material are located on an initial substrate 850. A seed layer 868 (e.g. formed of copper or gold) is formed over the refractory material 862. The film can be deposited after the planarization of the upper surface of the previously formed layers but prior to solder deposition. Next a photoresist 860 is deposited, patterned to have openings in locations where a bonding material (if desired) and solder bumps are to be formed. Next the photoresist is removed and a brief etch is performed to remove exposed portions of the thin seed layer material (e.g. copper or gold). This leaves an exposed region of refractory material, such as TiW, on the previously deposited layers between the solder bumps. This refractory material serves as a solder mask for subsequent steps.

In some embodiments, it is desirable to choose a refractory material that can perform one or more additional functions in the fabrication process as opposed to only acting as a solder mask. For example, a preferred refractory material may also function as an adhesion layer over some materials that may be part of the previously formed layers or part of the substrate (in embodiments where previously formed layers do not exist). In still other embodiments, the refractory material may be removable using a common etchant and/or process used to remove sacrificial material. In embodiments where the sacrificial material is copper and the refractory material is TiW, it has the added advantage that is can serve as an adhesion layer to any seed layers that are deposited above it and it can be etched away using the a preferred ammonia based copper etchant (as disclosed in U.S. patent application Ser. No. 10/840,998, filed May 7, 2004 by Gang Zhang and entitled "Electrochemical Fabrication Methods With Enhanced Post Deposition Processing" which is hereby incorporated herein by reference).

Figure 46A:
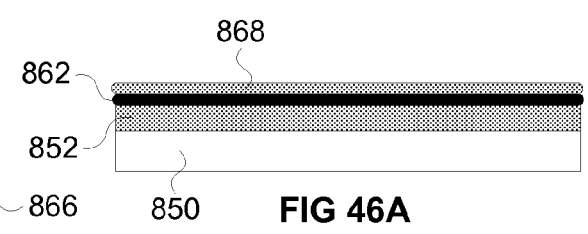
FIGS. 46A-46F schematic side views of various states of a fourth embodiment where solder mask material is supplied in the form of a refractory material.

FIG. 46A depicts the state of the process after deposition of a refractory material 852 (e.g. TiW) and deposition of a seed layer 862 (e.g. copper or gold) thereon.

Figure 46B:
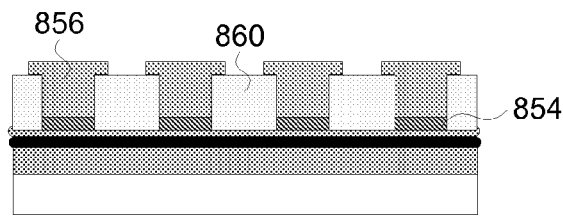

FIG. 46B depicts the state of the process after depositing and patterning a photoresist to have openings corresponding to locations where bonding pads and solder bumps are to be deposited, and after such deposits (e.g. via electroplating) are made. As illustrated, the deposition of solder material overfills the openings in the photoresist. In alternative embodiments, such overfilling may be avoided.

Figure 46C:
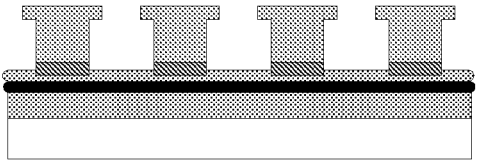

FIG. 46C depicts the state of the process after the photoresist is stripped and those portions of the seed layer material located between the solder bumps are exposed.

Figure 46D:
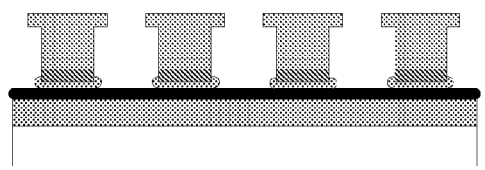

FIG. 46D depicts the state of the process after one or more etching operations removes the exposed portions of the seed layer while leaving behind the underlying portions of the refractory material. In some embodiments, differential etching rates between the seed layer and refractory material, by the etchant, may be useful in ensuring that the seed layer is removed while leaving behind the refractory material while in other embodiments, it may be possible to precisely control the etching so that the seed layer may be removed while not completely removing the adhesion layer. Since the seed layer is thin, excessive undercutting below the solder bumps is believed to be avoidable. The remaining refractory material located between the solder bumps can serves as a solder mask in subsequent operations.

Figure 46E:
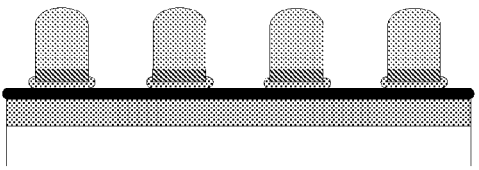

FIG. 46E depicts the state of the process after the solder is reflowed so as to yield solder bumps with rounded (e.g. hemispherical) ends. As the solder reflows, the refractory material prevents bridging of solder material between adjacent solder bumps.

Figure 46F:
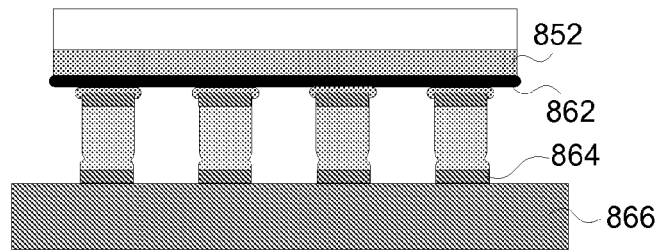

FIG. 46F depicts the state of the process after bonding the previously formed layers 852 to bonding pads 864 on a substrate 866 via the solder bumps 860. In subsequent operations, sacrificial material, the initial substrate 850, and exposed portions of the refractory material 862 may be removed. In some alternative embodiments, the bonding and the various removal operations may be performed in a variety of orders.

As noted above, in some embodiments, where two substrates (none, one, or both of which may carry previously formed layers that include a desired structure) are to be bonded via a series of bump interfaces, differential thermal expansion may induce stress on the connecting bumps that may tend to weaken and even sever the bonds. In some of the above embodiments, the height of the bumps was increased to improve thermal compliance. In other embodiments, thermal compliance may be improved without increasing bump height, or in conjunction with increasing height, by providing bumps in the form of shapes having greater compliance than that offered by straight vertical columns or by providing interface structures of enhanced compliance that join the solder bumps to other portions of structures. Such compliant shapes may, for example, take the form of horizontal extending zig-zag spring structures of a substantially two dimensional or three-dimensional configuration. In other embodiments, spiral connections may provide desired compliance and may also, in some circumstances, provide desired amounts of inductance.

In some embodiments, in addition to inclusion of structures that allow compliant connectivity, it may be desirable to have one or more closely spaced connections made via rigid structures (i.e. non-compliant solder bumps and intermediate structures if they exist) so as to ensure a desired mechanical reference position of the bonded structures.

FIGS. 47A-47G depict various side, perspective, and top views of an embodiment of the invention which provides a compound probe array formed from a plurality of multi-probe carrying substrates which are mounted to a larger substrate via a compliant frame structure which allows individual probe carrying substrates to adjust their positions relative to one another to ensure appropriate planarity in the overall probe array.

Figure 47A:
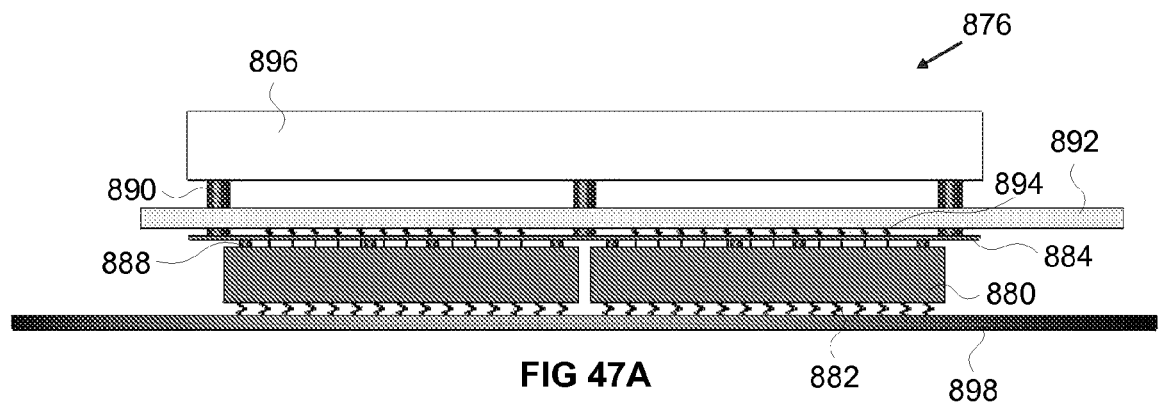
FIGS. 47A-47G depict various side, perspective, and top views of an embodiment of the invention which provides a compound probe array formed from a plurality of multi-probe carrying substrates which are mounted to a larger substrate via a compliant frame structure which allows individual probe carrying substrates to adjust their positions relative to one another to ensure appropriate planarity in the overall probe array.

FIG. 47A provides a side view of an example compound probe array 876 according to the present embodiment which can be used to make temporary or permanent electrical contact with a wafer 898 to be tested or other electrical component. Two probe tiles 880 carrying probes 882 are visible. These probe tiles are mounted against or to a flexure 884 which contains tile attachment regions 888 located on compliant (i.e. spring-like) fingers that extend from a frame of the flexure. In this embodiment, probes may be formed on the individual probe tiles or they may be transferred to the individual tiles either as a whole or in a plurality of sequential transfer operations. The individual tiles may have space transformation properties or they may simply provide straight through vias that allow electrical connection from the probes 888 to a PCB (in this example) or to another electrical component in other embodiments (e.g. to a space transformer, a secondary space transformer, to an interposer, or the like. In some alternative embodiments, electrical connections may be provided that connect individual probe tiles to other probe tiles.

The flexure 884 has openings that allow pins 894 (e.g. compliant or rigid) to make electrical connections from the back side (i.e. non-probe side) of the tiles to a PCB 892 or other electrical component. As illustrated, the flexure 884 may be mounted on a stiffening frame or substrate 896 via legs 890. In some alternative embodiments, it may be possible to mount the flexure directly to the PCB or other electrical component.

The fabrication method of the present embodiment and associated structures allow practical expansion of effective probe array size (e.g. to a 300 mm wafer size) due to the tip-tilt compliance provided by the flexure to each probe tile in the probe assembly allowing relaxation of planarity that would otherwise be required of a single probe substrate to which all probes would be attached so that simultaneous and reliable contact will be made between the probes and a wafer or other device to be contacted.

Figure 47B:
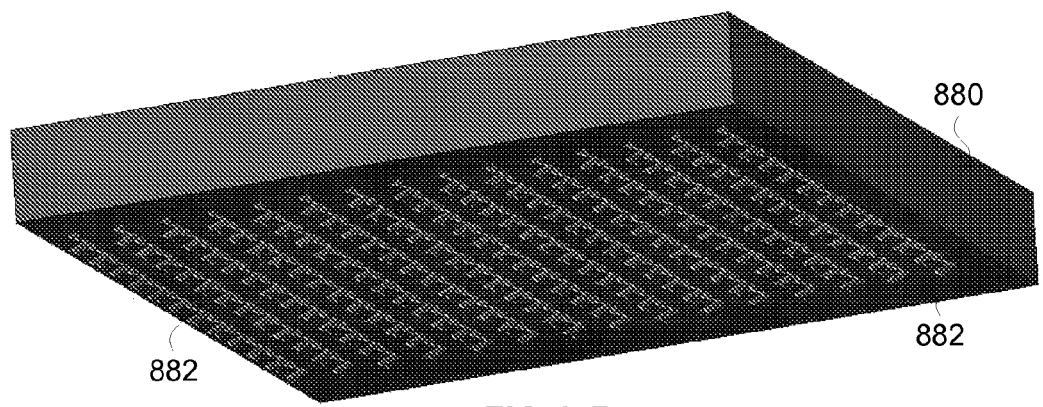

FIG. 47B provides a perspective view of the bottom of a single probe tile 880 such that a plurality of individual probes 882 may be seen. As noted above, electrochemical fabrication techniques as discussed herein may be used to fabricate individual probe tiles. Each tile may be configured, for example, to probe a portion of a single DUT (device under test), portions of multiple DUTs, an entire single DUT, or the entirety of a plurality of DUTs. For example, each tile could be configured to probe 2×2 devices (4 DUTs). Vias may extend straight through the tile or they may take a path that changes the pitch (i.e. spacing) from one side of the tile substrate to the other side of the tile substrate. The tile substrate may not be a monolithic device but instead may contain layers of conductive and dielectric material on one or both surfaces that provide some amount of space transformation.

Figure 47C:
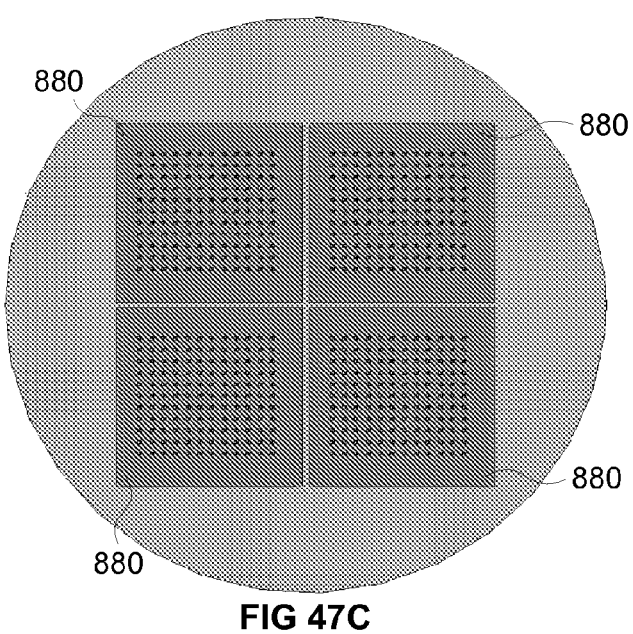

FIG. 47C provides a top view of an example of a four probe tile compound probe array positioned over a wafer 898. Of course in other embodiments, fewer or a greater number of tiles (e.g. 10-100 or more) may make up the compound probe array and the compound array and individual tiles may take on configurations that are not square or even rectangular.

Figure 47D:
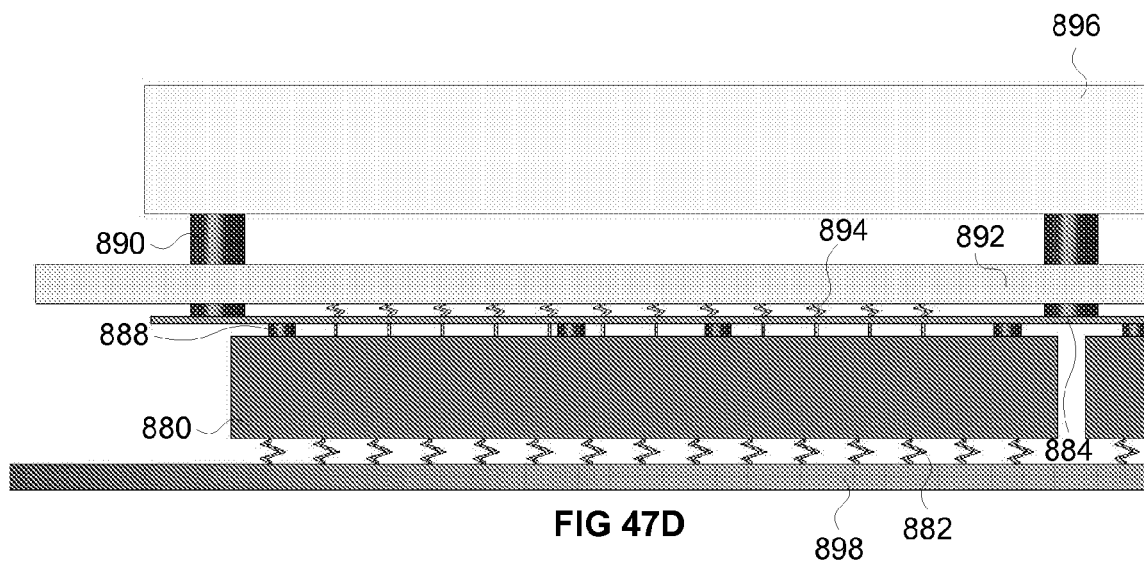

FIG. 47D provides an expanded side view of the left half of the compound probe array shown in FIG. 47A. Columns 890 connect the flexure to the stiffening frame while tile attachment columns 888 connect the flexure to the tiles themselves.

Figure 47E:
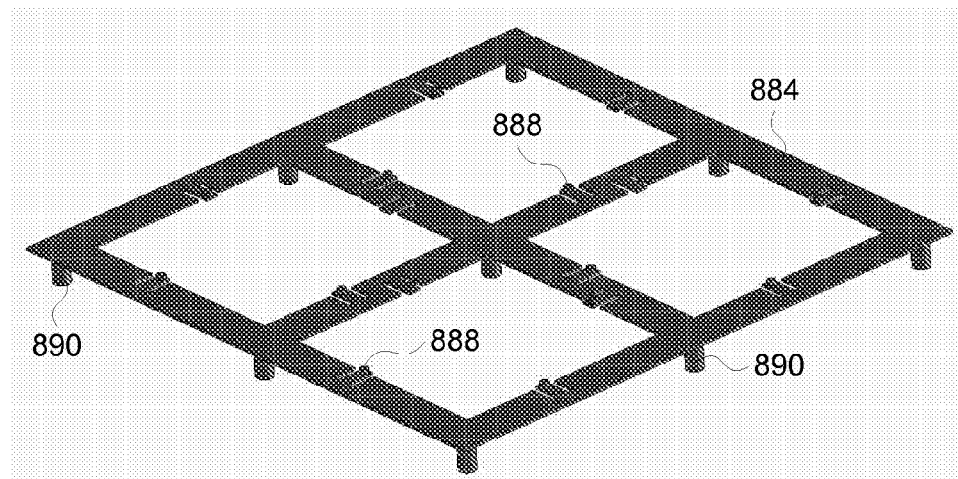
Figure 47F:
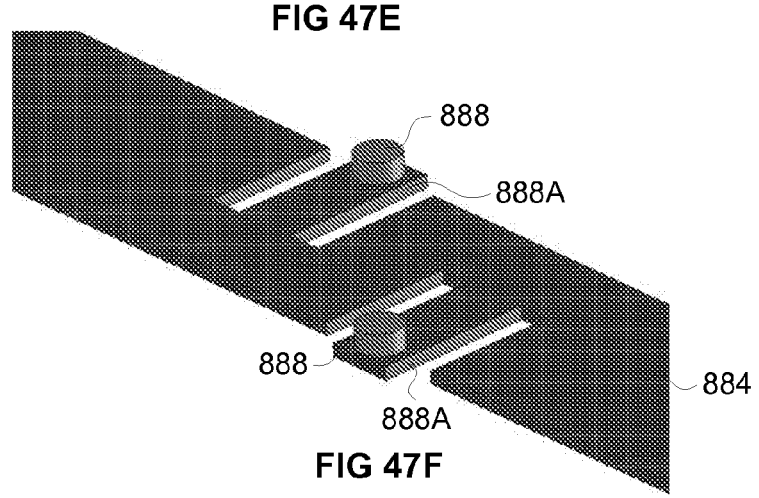

FIGS. 47E and 47F provide expanded perspective views of flexure 884 where tile attachment regions 888, fingers 888A, and columns 890 can be more readily seen. The flexure may be constructed from a sheet of spring steel that is chemically milled or otherwise shaped to provide, for example, four leaf spring attachments per probe tile. In other embodiments a fewer or greater number of tile attachment regions may be provided, a fewer or greater number of columns 890 may be provided. In still other embodiments, it may be possible (based on required spacing between probes) for the tile attachment regions to be flush with the frame portion of the flexure when it is possible for the fingers to extend beyond the frame itself. The spring-like fingers that connect the tile attachment regions to the frame of the flexure itself may provide significant lateral stiffness (i.e. non-compliance in the plane of the tiles, e.g. the X-Y plane) while allowing tip-tilt compliance (i.e. compliance in the Z direction).

In variations of this embodiment, the attachment regions may be soldered to the tile or otherwise attached to it, they may simply butt against the tile and other mechanical structures may cause attachment. In still other alternative embodiments, the fingers may have extensions or other features that allow the sides of the tiles to be grabbed. Bonding of the flexure to the tile may occur after alignment.

Figure 47G:
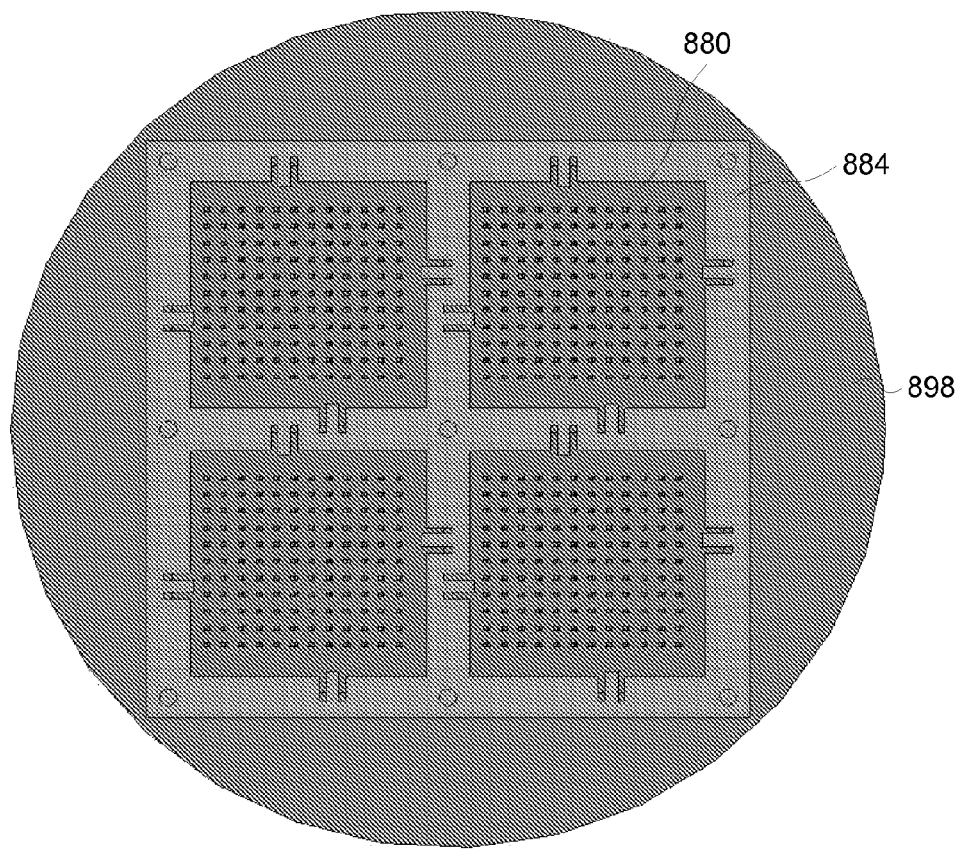

FIG. 47G depicts a top view of a four tile flexure overlaying four tiles which in turn overlay a wafer.

FIG. 48A-48I provide side views of various states in a process for attaching multiple probe die (each containing multiple probes) over a larger area substrate wherein the die are fabricated and singulated (allowing selection of the best die or of compatible die), followed by pre-assembly into a desired array which is aligned to a permanent substrate, and finally bonded to form a combined array.

Figure 48A:
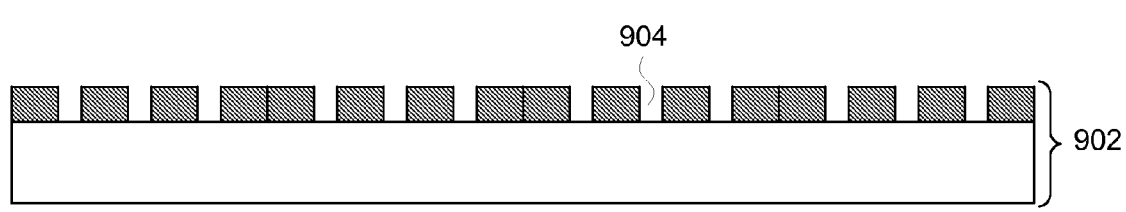
FIG. 48A-48I provide side views of various states in a process for attaching multiple probe die (each containing multiple probes) over a larger area substrate wherein the die are fabricated and singulated (allowing selection of the best die or of compatible die), followed by pre-assembly into a desired array using a fixture which is aligned to a permanent substrate, and finally bonded to form a combined array.

FIG. 48A depicts the state of the process after creation of a template-like fixture 902 of a size capable of receiving all probe die that are to be bonded and which includes openings 904 corresponding to bump locations which exist on probe die that are to be transferred. This template may, for example be created by the electrochemical fabrication of a metal mold. In this embodiment, the metal mold will have openings corresponding to the desired bump locations. The openings in the array are preferably a little wider and a little deeper than the bumps that are located on the individual probe die. In some alternative embodiments, the template may be made of a dielectric material (e.g. photoresist) patterned on a desired substrate. In still other embodiments, the template itself may be made using a transfer process.

Figure 48B:
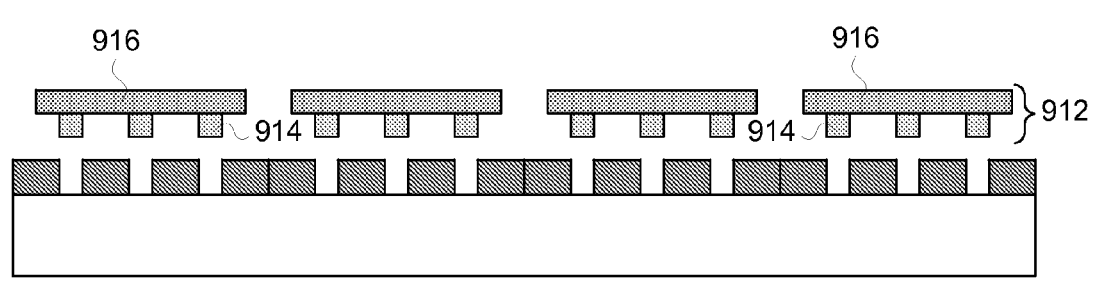

FIG. 48B depicts the state of the process after probe die 912 are aligned over the template. This alignment process may occur by picking and placing one die at a time or by picking and placing a plurality of die together. For simplicity of presentation, each die is shown as containing bumps 914 and a bridging mass 916 which may include individual probes and possibly a sacrificial material and/or a temporary substrate.

Figure 48C:
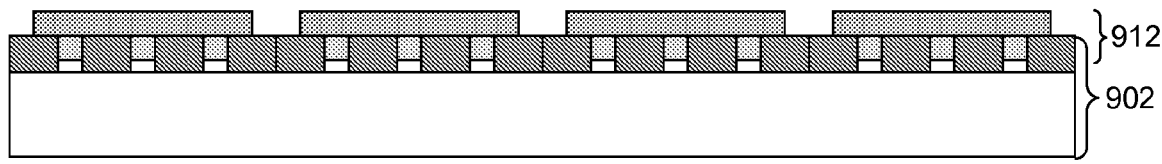

FIG. 48C depicts the state of the process after each of the die is aligned, and then placed into its location on the fixture 902. Because the holes are deeper than the bumps, each bump will fit into its hole without making contact with the bottom of the opening. The dies may be held in place via mechanical interaction between the probe die and the substrate. In some alternative embodiments, the holding in place may occur by other methods, vacuum, magnetic attraction, electrostatic attraction, weak or otherwise releasable adhesive, by gravity, or the like.

Figure 48D:
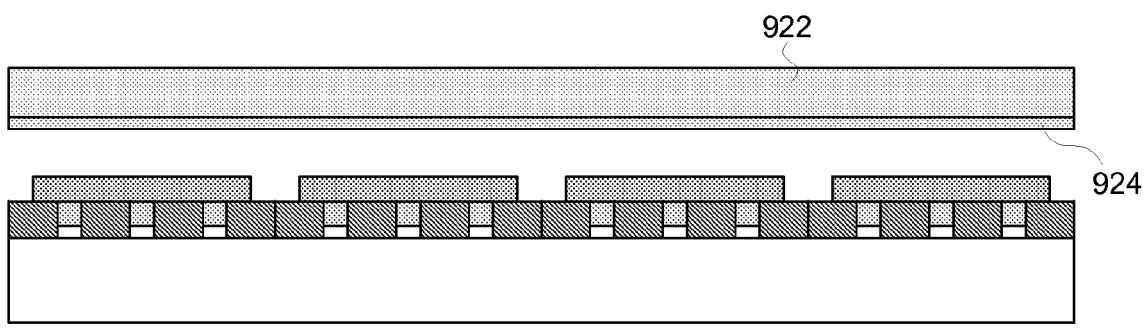

FIG. 48D depicts the state of the process after all dice are aligned and placed, and a backbone carrier is located above the back surface of the dice. A thin layer of adhesive 924 may exist on the backbone carrier to aid in fixing the dies to the carrier. In some alternative embodiments, the adhesive may be located on the back surface of the die while in other embodiments, vacuum, magnetic, electrostatic attraction, or the like may be used. In still other alternative embodiments the dice may be formed with patterning on their back surfaces and/or a backbone carrier may have patterning that interact with the edges of the probe die so that direct picking and placing of the die onto desired locations of the backbone carrier may occur so as to obviate the steps of forming and locating the die on the fixture 902 in the first place.

Figure 48E:
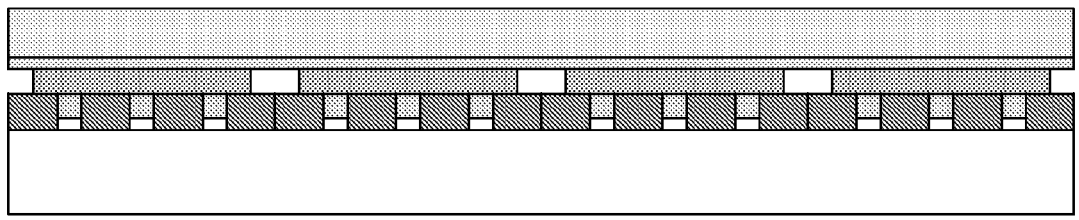

FIG. 48E depicts the state of the process after the backbone carrier is firmly placed onto the backs of the dies and the adhesive is allowed to set. This adhesive can be, for example, a thermoset or a fast curing epoxy, but whatever the exact chemical composition, in this embodiment, it must be resistant to high temperatures and be selectively removable after use. In some alternative embodiments, high temperature resistive of the adhesive may not be necessary.

Figure 48F:
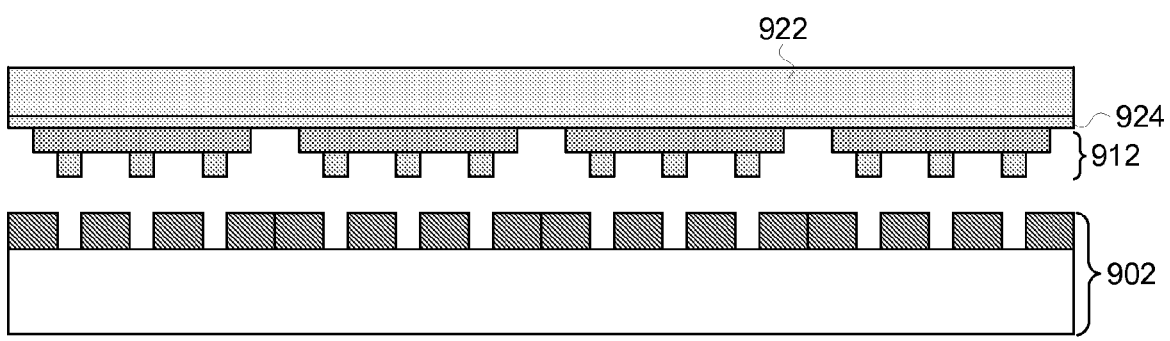

FIG. 48F depicts the state of the process after the backbone carrier 902 and attached probe die 912 are lifted from the fixture 902. The dice as attached to the carrier are located in their aligned and final configuration.

Figure 48G:
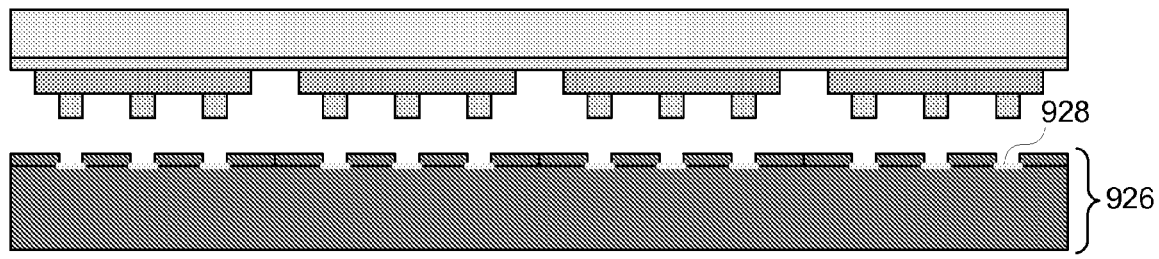

FIG. 48G depicts the state of the process after the dice 912 and the carrier 922, which form a single block of pre-aligned probe dice, is positioned over a permanent substrate 926 (e.g. space transformer, substrate of an interposer, semiconductor device, or the like) such that the bumps are located over pads 928 on the permanent substrate.

Figure 48H:
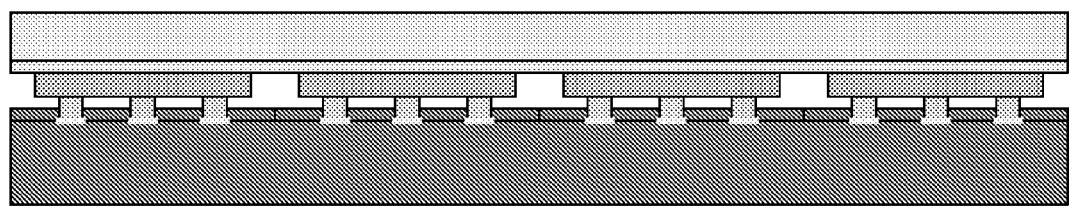

FIG. 48H depicts the state of the process after the single-block is placed on the permanent substrate and then thermally cycled to heat and melt the solder bumps to bond the permanent substrate and probes to one another. In this embodiment, the carrier remains attached to the dice during bonding while in other embodiments, the carrier may be released before or after bonding occurs or is completed.

Figure 48I:
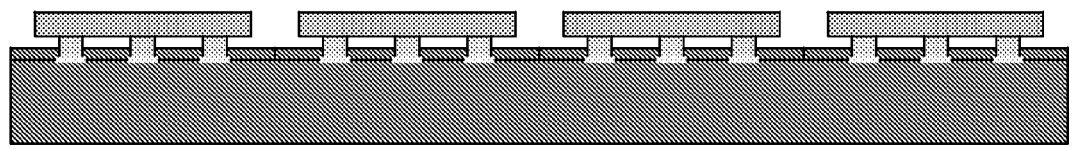

FIG. 48I depicts the state of the process after the dice and the carrier are separated as a result of removing the adhesive. In this embodiment, separation may occur by etching or the like. In some other embodiments, separation may occur in other ways. In a subsequent operation or operations, the probes within individual die are released from any sacrificial material and/or temporary substrate to which they were attached at the time of transfer (not shown).

Figure 49:
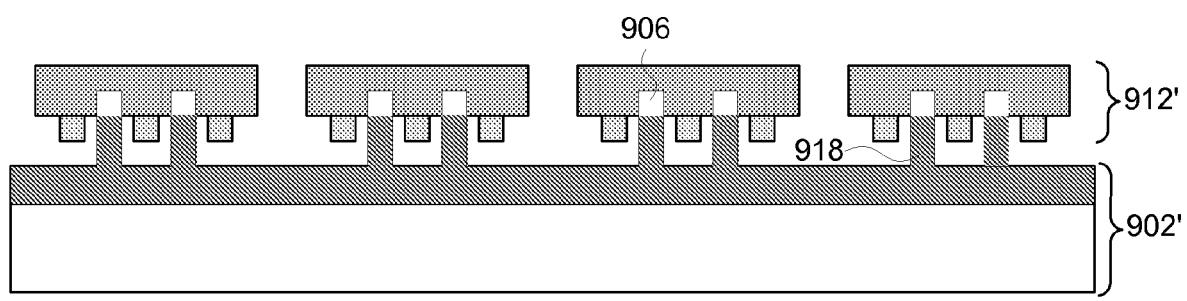
FIG. 49 provides a schematic side view of a plurality of probe die which aligned to an alternative fixture compared to that shown in the embodiment of FIGS. 48A-48I where the fixture includes protrusions that align to openings in the probe die.

In some alternatives to the above embodiment, instead of forming openings in the fixture for receiving solder bumps, opening may be formed in the individual die 912' for receiving protrusions (e.g. posts, pyramids, hemispheres or the like) 918 which may be formed on the fixture 902' as shown in FIG. 49.

FIGS. 50A-50D, provide schematic side views of another embodiment of the invention where probes are formed along with a final substrate and both the probes and the final substrate are transferred and bonded to a second final substrate. This process may result in the need for successfully bonding fewer pads and/or in bonding pads that have a larger spacing or pitch.

Figure 50A:
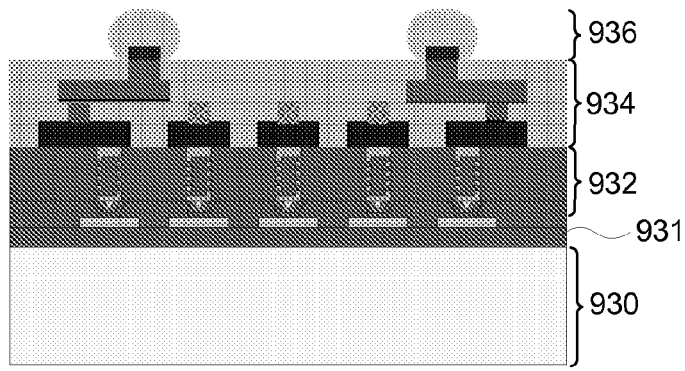
FIGS. 50A-50D, provide schematic side views of another embodiment of the invention where probes are formed along with a final substrate and both the probe and the final substrate are transferred and bonded to a second final substrate.

FIG. 50A depicts the state of the process after upside down probes 932 are formed on a temporary substrate 930 and final substrate 934 (e.g. a space transformer) having a desired wiring pattern is in turn formed on the probes and solder bumps 936 are formed on the final substrate. In some alternative embodiments, the order of forming the final substrate and probes could be reversed. In still other alternative embodiments, the solder bumps may be replaced with another bonding material. In still other embodiments, the solder bumps may not be initially located on the final substrate but instead they may be located on a second final substrate.

Figure 50B:
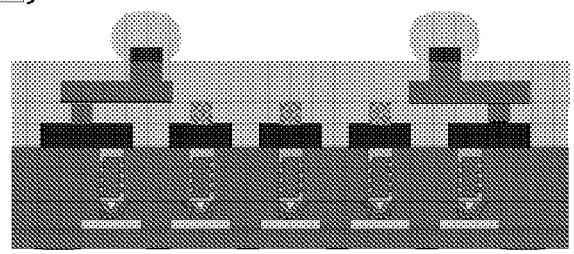

FIG. 50B depicts the state of the process after the temporary substrate is removed, e.g. by etching, melting or otherwise removing release layer 931 (which may form part of the substrate). In other embodiments, the temporary substrate itself may be destructively removed, e.g. via etching, planarization (e.g. lapping, diamond fly cutting, grinding, CMP, or the like).

Figure 50C:
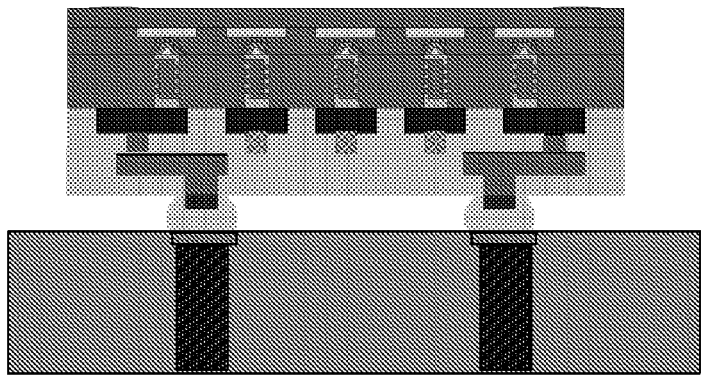

FIG. 50C depicts the state of the process after the combined permanent substrate and probes are bonded to a second permanent substrate (e.g. a via substrate, secondary space transformer, interposer, or the like). In some alternative embodiments, the separation of the probes and permanent substrate from the temporary substrate may occur after the bonding operation of FIG. 50C.

Figure 50D:
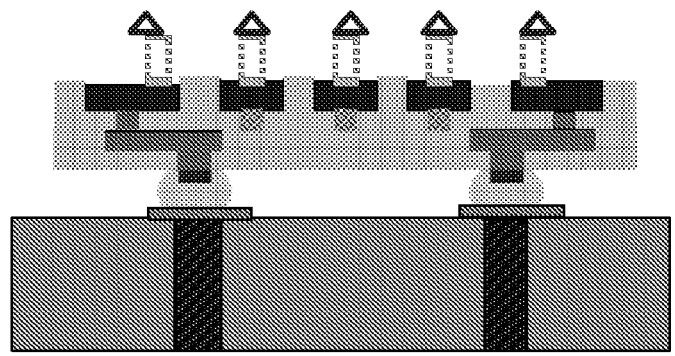

FIG. 50D depicts the state of the process after the probes are released from a sacrificial material that encapsulates them. In still other alternative embodiments, the probes may be released from any encapsulating sacrificial material before or after removal of the temporary substrate and/or before or after bonding of the permanent substrate to the second permanent substrate.

FIGS. 51A-51I provide perspective side views of various states of a process (as applied to a specific example structure) for forming probes on a temporary substrate that will be transferred to a permanent substrate where vertical positioning of the probes relative to the permanent substrate will be aided by the use of shims or standoffs that are formed along with the probes.

Figure 51A:
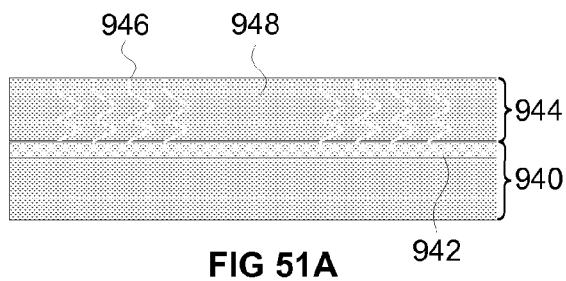
FIGS. 51A-51I provide perspective side views of various states of a process (as applied to a specific example structure) for forming probes on a temporary substrate that will be transferred to a permanent substrate where vertical positioning of the probes relative to the permanent substrate will be aided by the use of shims or standoffs that are formed along with the probes.

FIG. 51A depicts the state of the process after completion of fabrication of layers 944 containing probes 946 and sacrificial material 948 on a release layer 942 of a temporary substrate 940.

Figure 51B:
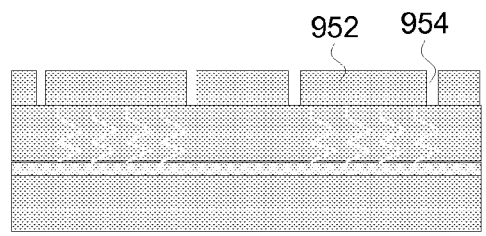

FIG. 51B depicts the state of the process after a photoresist 952 is applied and patterned to have openings 954 in locations where shims are to be formed.

Figure 51C:
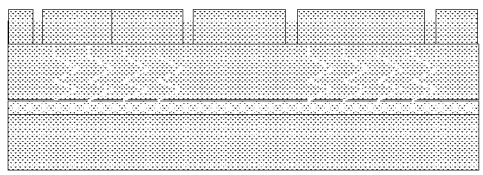

FIG. 51C depicts the state of the process after shims 956 have been formed via deposition of a material which may be the same as the sacrificial material (e.g. copper)

Figure 51D:
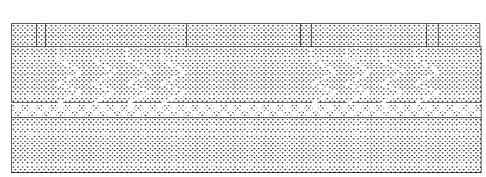

FIG. 51D depicts the state of the process after planarization (e.g. lapping, diamond fly cutting, grinding, or other machining) of the photoresist and shim material has occurred.

Figure 51E:
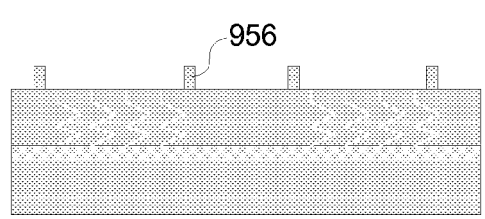

FIG. 51E depicts the state of the process after the photoresist has been stripped and shims 956 have been released.

Figure 51F:
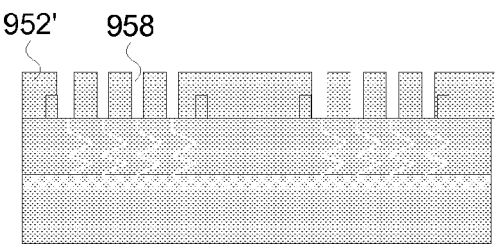

FIG. 51F depicts the state of the process after application of a second photoresist 952' and patterning of the resist to form openings 958 where solder bumps or other bonding material is to be deposited.

Figure 51G:
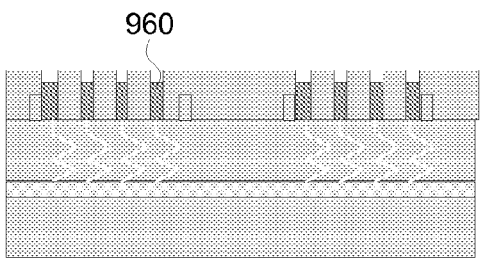

FIG. 51G depicts the state of the process after deposition of solder bump material 960 has occurred.

Figure 51H:
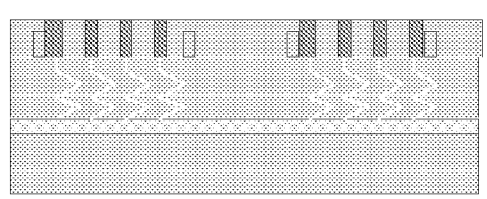

FIG. 51H depicts the state of the process after planarization of the photoresist and solder material has occurred. In some alternative embodiments, this planarization operation may be optional.

Figure 51I:
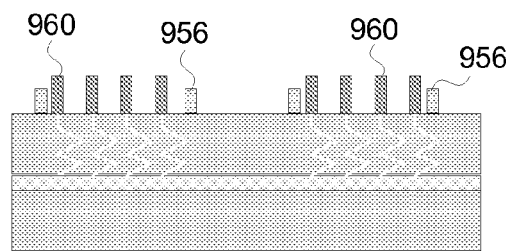

FIG. 51I depicts the state of the process after removal of the photoresist which reveals solder bumps 960 and shims 956. In subsequent operations (not shown) the resulting probe die may be diced, transferred and bonded to a permanent substrate. In variations of this embodiment, release of probes from the temporary substrate may occur before or after transfer and release of the probes from encapsulating sacrificial material, and/or it may occur before or after transfer and/or before or after removal of the temporary substrate. A process of flipping and bonding a structure (e.g. probe array) including shims is shown in FIGS. 52A-52D.

Figure 52A:
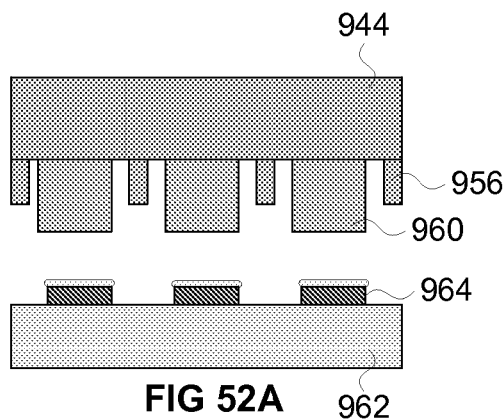
FIGS. 52A-52D schematically depict side views of various states of a process of flipping and bonding a structure where shims (similar to those created in the process of FIGS. 51A-51I were created.

FIG. 52A depicts the state of the process after formation of a die including solder bumps 960 and shims 956 is formed and located above a permanent substrate 962 containing pads 964.

Figure 52B:
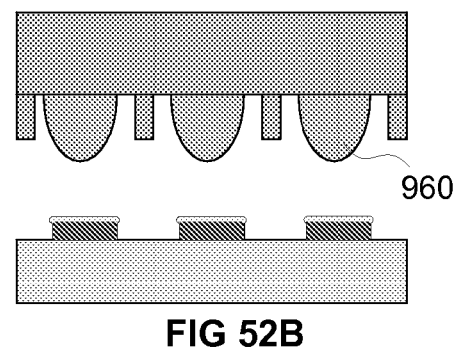

FIG. 52B depicts the state of the process after solder bumps 960 have been reflowed.

Figure 52C:
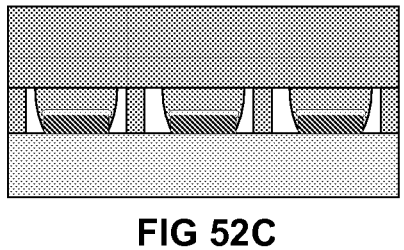

FIG. 52C depicts the state of the process after bonding has occurred by contacting the solder bumps 960 and pads 964, heating, and pressing the permanent substrate and probe containing layers 944 together until the shims 956 contact the permanent substrate 962.

Figure 52D:
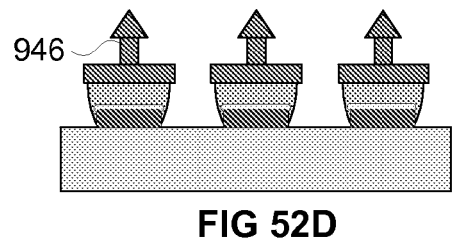

FIG. 52D depicts the state of the process after the probes 946 have been released from encapsulating sacrificial material. The probes should now be planar and parallel to each other, and the dice that have been bonded in the same manner should also reveal devices that are planar and parallel to each other across the dice.

In some alternatives to the above embodiment, the stand-offs or shims may be formed as part of the permanent substrate. In still other alternatives, the shims may be formed, in part, from both the layers on the temporary substrate and from the permanent substrate. In still other alternative embodiments, the standards may be made of a structural material that remains in place after removal of the sacrificial material.

In some alternatives to the embodiment of FIGS. 51A-51I, and 52A-52D (which used stand-off structures that existed outside probe arrays and adjacent to the solder bumps to act as shims during bonding), shims may be formed inside solder bumps, i.e. they may be physically integrated with the solder material. In these alternatives, valuable real estate on the die surface is not lost. It is possible that in some of these alternative embodiments, improved structural strength of bonds will occur. In some variations of these alternatives, the shim material may be similar to that of the structural material used in forming the probes or alternatively may be sacrificial material that is essentially encapsulated and becomes a structural material. Three examples of these alternative embodiments are shown in FIGS. 53A-53D, 54A-54C and 55A-55B.

FIG. 53A-53D depict schematic side views of various states of a process that integrates stand-offs or shims into the solder bumps themselves. After the main bodies of the probes are built from a plurality of layers 972 formed on a sacrificial substrate 970, a photoresist is applied and patterned to form openings where sacrificial material shims (e.g. copper) are to be located, the shims 974 are formed, the photoresist 976 is further patterned, or stripped and reapplied and patterned, to define openings around the shims where solder is to be applied, solder (e.g. tin, tin lead, silver, or the like) 978 is deposited, and the result planarized (e.g. via lapping or fly cutting). In some alternative embodiments, solder may be applied in a first opening in a photoresist, the photoresist and solder planarized, a second level of photoresist applied and patterned to define locations where shims are to be located, etching used to form openings in the solder where shim material is to be deposited and then shim material deposited, after which planarization may occur. In some alternative embodiments, the shim material need not be sacrificial material but instead may be structural material (in any event it will be retained as part of the final probe array)

Figure 53A:
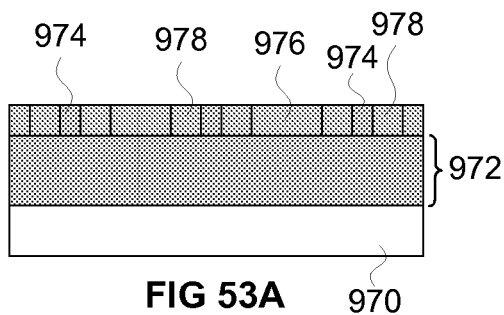
FIG. 53A-53D depict schematic side views of various states of a process that integrates stand-offs or shims into the solder bumps formed on the bases of probes.
Figure 53B:
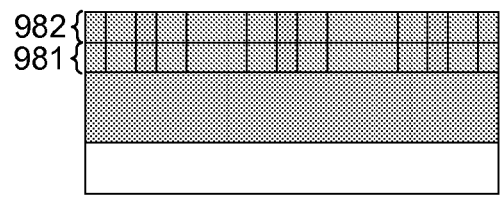

In order to create relatively tall structures, this process of creating concentric structures of differing materials can be repeated one or more times to stack several layers one above the other as illustrated in FIG. 53B where a second level 982 is located above first level 981.

Figure 53C:
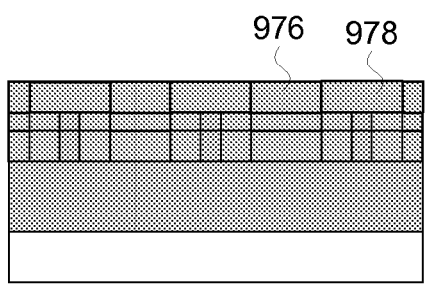
Figure 53D:
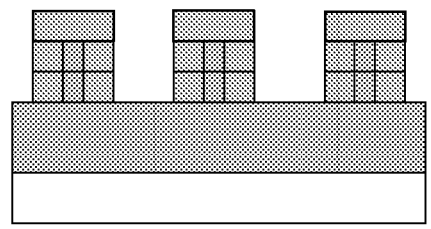

Next, another layer of photoresist 976 may be applied and patterned to reveal openings where solder is to be deposited. Once deposited the solder will form a cap over the shims. The state of the process after performance of these operations (including deposition of solder 978) is depicted in the example of FIG. 53C. In some alternative embodiments, this capping step may be skipped Next, photoresist 976 is stripped off to reveal columns where the center core provides a shim which is composed of sacrificial material or structural material (e.g. Cu posts) surrounded by an outer sheath and cap of solder. The state of the process after performance of these operations is shown in FIG. 53D.

Figure 54A:
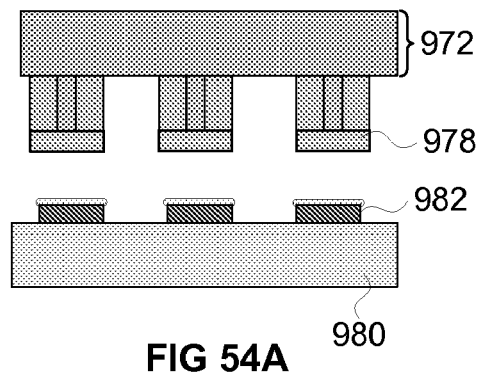
FIGS. 54A-54C depict schematic side views of various states of a process that results in the transfer of probes, having shims incorporated into solder bumps, to a permanent substrate.
Figure 54B:
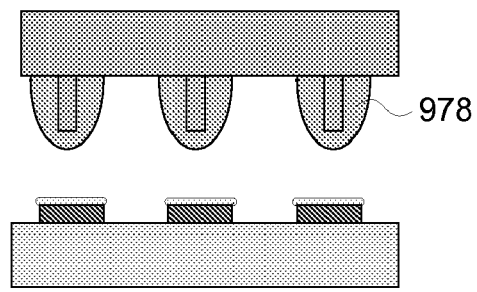
Figure 54C:
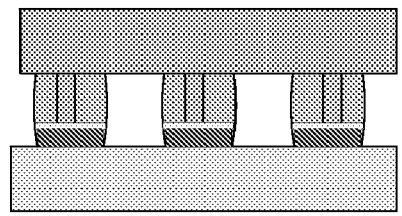

The die with the concentric shims and solder bumps may next be prepared for transfer to a permanent substrate. This preparation may take the form of dicing the individual die, slicing of the temporary substrate to thin it or to completely remove it (e.g. via lapping, fly cutting, sawing, removal of a release layer via etching, or the like). As illustrated in FIG. 54A, the temporary substrate is removed and the probe array, or arrays (not shown) are located above the permanent substrate 980 having bonding pads 982. FIG. 54B depicts the state of the process after a heat treatment reflows the solder. FIG. 54C depicts the state of the process after mating and bonding occurs where the shims are pressed against the bonding pads of the permanent substrate (in actually practice a thin layer of solder may remain between the bonding pads 982 and the shims). Due to the presence of the shims all the probes take on the same spacing relative to the permanent substrate that is mandated by the shims. In some variations of this embodiment, not all solder bumps need to have a core of shim material. In some other alternative embodiments the shims and solder balls may be formed on the permanent substrate as opposed or in addition to forming them on the bases of probes.

Figure 55A:
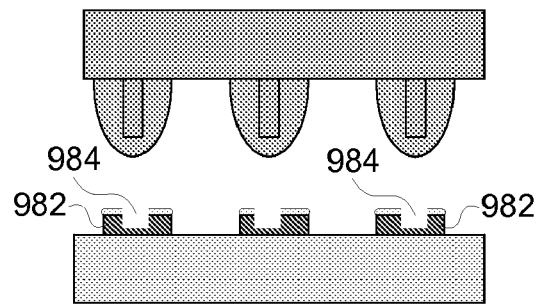
FIGS. 55A and 55B provide a schematic side views of pre-bonded and bonded states of a transfer process where a permanent substrate include recesses in contact pads for receiving shims.
Figure 55B:
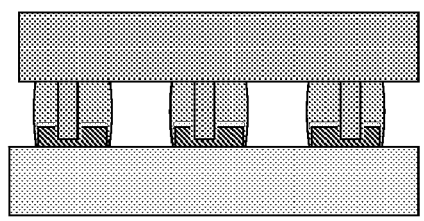

FIGS. 55A and 55B provide a schematic side views of pre-bonded and bonded states of a transfer process where a permanent substrate includes recesses in contact pads for receiving shims. In some variations of this embodiment, the recesses and or shims may have tapered side walls. In other variations the recesses may be significantly wider than the width of the shims which may not help significantly with XY alignment of the substrates and probes but may add significant lateral retention strength once solder is resolidified after bonding. FIG. 55A depicts the state of the process in a manner analogous to that of FIG. 54B with the exception that pads 982' contain recesses 984. The dies may be formed in any of a variety of ways previously discussed. The substrates can be either designed and created with the recesses in mind, or pre-existing substrates can be modified to create the recesses (e.g. via lithographic patterning of photoresists and subsequent depositions to build up side walls, via etching operations to directly form the recesses, or via ink jet deposition of side wall material). Etching operations may be useful in forming recesses with slanting side walls as a natural consequence of isotropic etching may result in more XY etching to those areas which have had more exposure to the etchant.

As illustrated in FIG. 55B when the die is brought into contact with the substrate, the solder bumps will touch the target pads and the shims will fit into the recesses in the pads. In some embodiments, the shims might not only aid in setting Z-height (i.e. height perpendicular to the surface of the permanent substrate) but it may also aid in establishing XY alignment as well aiding in the mechanical interlocking and securing of the die to the substrate.

In some embodiments, even though the probes may be vertically positioned with high precision (i.e. the probe tips made to lie in a common plane), the probe tips may not remain in such a highly aligned state after they undergo some amount of initial flexing. In some cases, initial flexing may lead to varying amounts of plastic deformation of the probes. Such plastic deformation may result in an unacceptable amount of non-planarity in the array of probe tips.

Figure 56A:
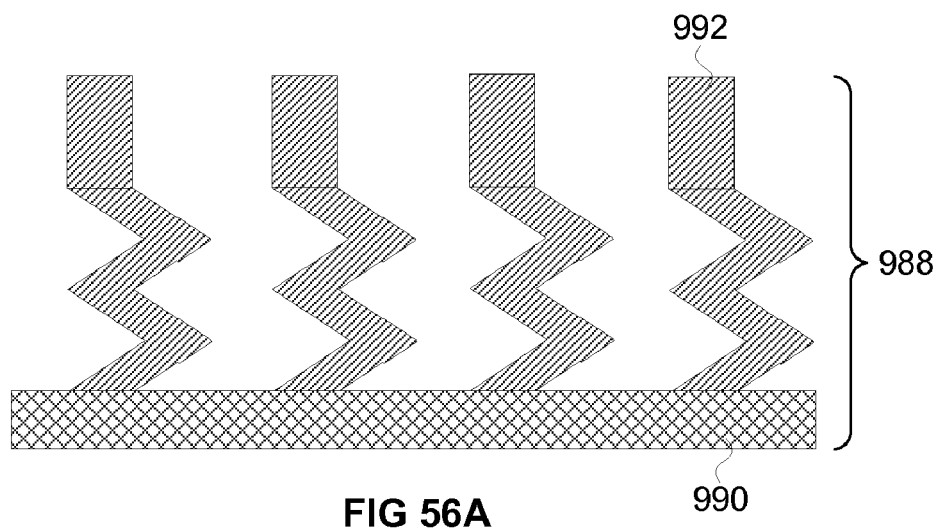

FIGS. 56A-56F depict various states of a process for re-establishing planarity of probe tip locations after initial work in. FIG. 56A depicts the state of the process after probes 988 have been formed on a permanent substrate 990 or have been transferred to a permanent substrate 990 after formation and they have been released from a sacrificial material. As indicated the probes include tip regions 992 which are relatively long and of uniform cross-sectional dimension. Also as indicated due to alignment efforts the tips of the probes lie in a common plane.

Figure 56B:
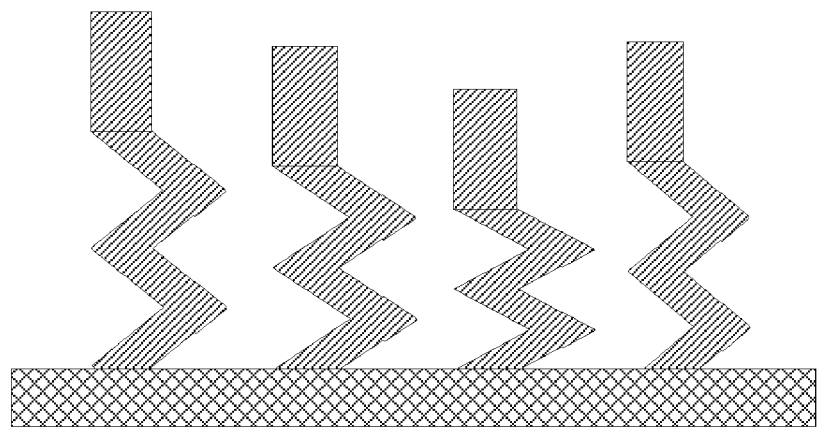

FIG. 56B depicts the state of the process after the probes have been worked in. This working in has resulted in the probes no longer having the same height or in other words the probe tips no longer lying in a common plane.

Figure 56C:
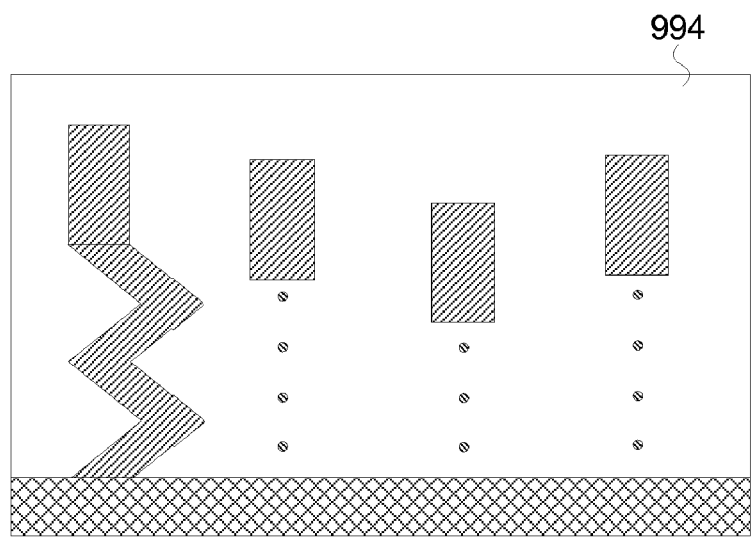

FIG. 56C depicts the state of the process after a first step is taken to re-establish planarity of the probe tips. This first step involves encasing the probes in a casting material 994 (e.g. polymer or metal which may be separated from the probes in a subsequent operation). In some alternative embodiments, this step of encasing may not be required as it may be possible to perform the planarization operation as required in the next step without the presence of an encapsulant.

Figure 56D:
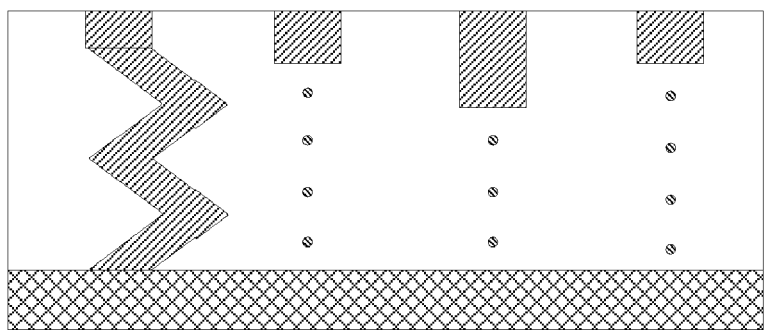

FIG. 56D depicts the state of the process after a planarization operation (e.g. lapping, fly cutting, or other machining operation) is performed which resets the probe ends/tips to a common plane. The height of the tip regions was initially created to be taller than the maximum differential in height that the probes would have after working in is completed.

Figure 56E:
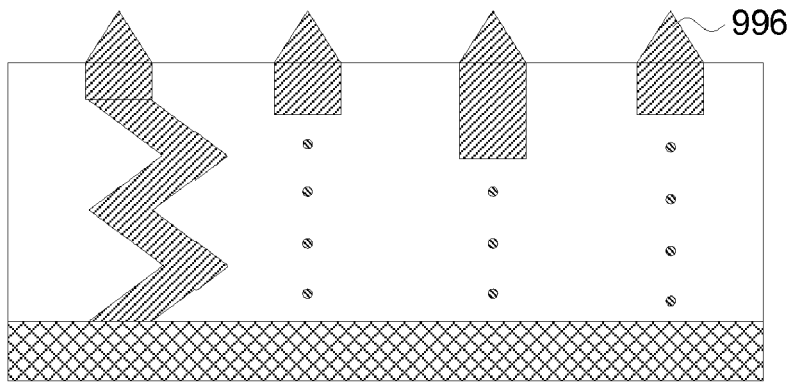

FIG. 56E depicts the state of the process after an optional step of forming contact tips 996, or bonding contact tips 996, to the probes has occurred. In some alternative embodiments, the original probe tips regions may be used as contact tips. It may be acceptable for the original tips regions to have some amount of taper to their side walls (not shown).

Figure 56F:
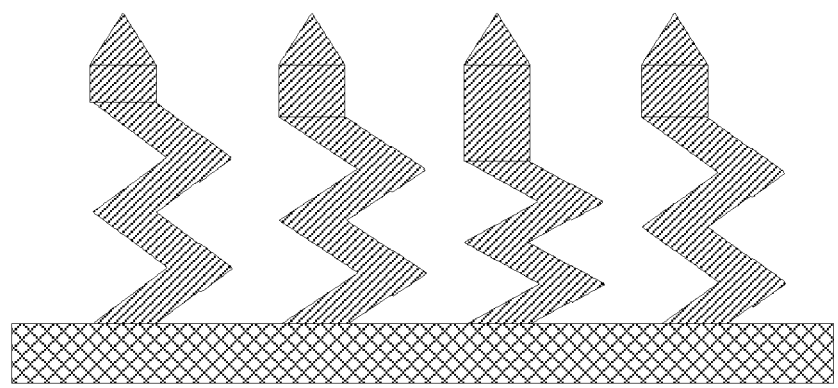

FIG. 56F depicts the state of the process after the casting material 994 has been removed to reveal probes that have been worked in and that have tips lying within a desired tolerance of a common plane.

Figure 57A:
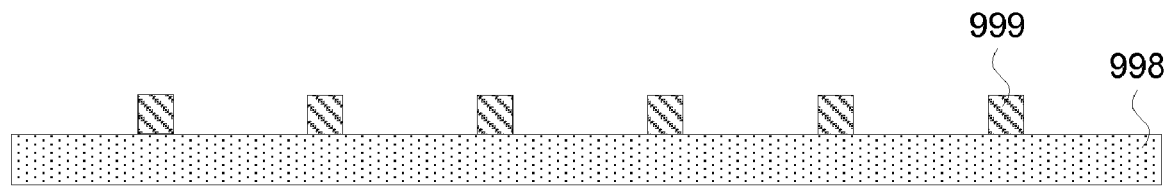
FIGS. 57A-57C illustrate how a standard array of probe element locations (e.g. as defined by a series of photomasks) may give rise to custom arrays of the probes without needing to prepare an entirely new set of masks.
Figure 57B:
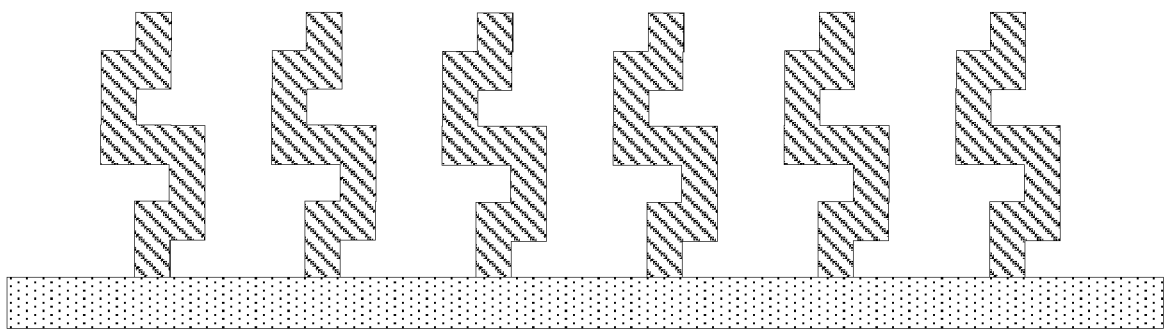
Figure 57C:
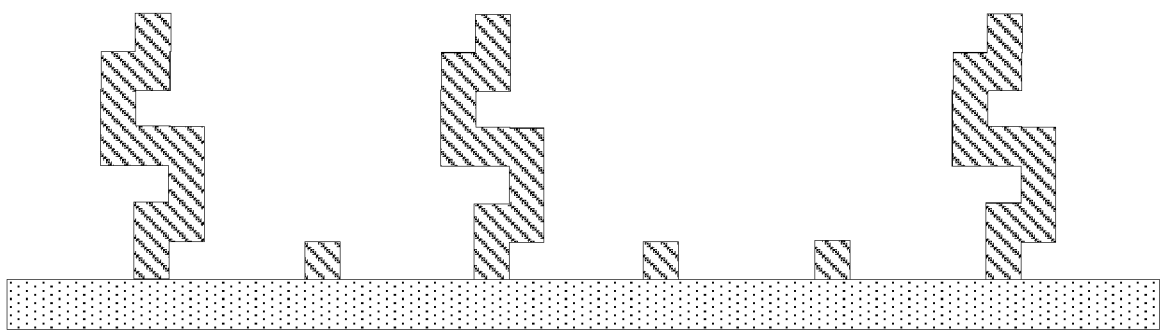

FIGS. 57A-57C illustrate how a standard array of probe element locations (i.e. as defined by a series of photomasks) may give rise to custom arrays of the probes without needing to prepare an entirely new set of masks. In FIG. 57A a standard set of probe locations is defined by the bumps 999 on a permanent substrate 998. FIG. 57B depicts the formation of all probes as called for by the array of bumps 999. FIG. 57C depicts a customized probe array configuration that was formed without need of forming all new masks. In its simplest form, only one new mask is required. The new mask preferably represents the first, or at least one, of the early layers of the structure to be formed where selected probe locations (i.e. undesired probe elements) are defined so that no structural material will be formed on at least the one layer. Even though all other layers may be formed, with the single missing layer the selected probe elements will not be attached to the permanent substrate and the portions of them that are formed will be removed during sacrificial material etching. In some alternative embodiments more than one layer of structural material may be removed (e.g. periodic layers may be removed so that no elements of structural material get too large. In still other embodiments where the photomasks are used to expose a negative photoresist or the like, a single mask with blocked regions (corresponding to regions where structures are not to be formed) may be doubled up with the masks defining the entire array during each exposure. In still other embodiments, instead of interpreting probe formation during the one or more of the early layers, one or more of the final layers may be eliminated (e.g. the last layer, the base layer, and/or the adhesion material layer or layers may be eliminated) on probes that are not to be transferred. In some embodiments, instead of disrupting the formation of one or more layers of the probes, these layers may be formed normally and then made to under go a selective etching operation that removes material from one or more layers of those probe elements that are not to be formed or transferred.

In some embodiments, constrained bonding in one or more directions (e.g. in the Z-direction which is substantially perpendicular to the plane of the permanent substrate and/or probe tips, and/or in the X and/or Y directions which are perpendicular to reach other but substantially parallel to the plane of the permanent substrate and/or the plane of the probe tips) may be preferred. In other embodiments, unconstrained bonding may allow solder reflow to help to center probe elements relative to bond pads.

To achieve uniform and controllable bonding it may be desired to attempt to achieve uniform volumes of solder in each bump that is formed. Such uniformity may be obtained directly from deposition or it may be achieved in otherways. For example after depositing solder and before or after removal of a masking material (e.g. photoresist) having opening in which the solder was deposited, the solder may be planarized so that each bump contains a relatively uniform amount of solder and thus will have a more uniform response to subsequent heating and bonding operations. The planarization may be performed by lapping or by diamond fly cutting (assuming the solder or other bonding material and any surrounding material is compatible with fly cutting). In alternative embodiments, if solder is not already surrounded by a material and if necessary, a casting material may be made to surround the solder so that planarization may occur in the most consistent manner possible. Solder volumes in each bump are preferably within 50% of each other, more preferably within 25% of each other, and most preferably within 10% of each other.

In heating solder to cause reflow and/or bonding, it may be desirable to control the uniformity of temperature and/or heating across an entire array, or across multiple arrays, when present so as to get optimal uniformity in bonding from probe to probe. This may be particularly important in embodiments where unconstrained bonding will occur. Another consideration may be the speed of ramp up and ramp down during thermal cycling as, slower ramps (i.e. more time at elevated temperatures) may produce more intermetallic compounds which may be a benefit or detriment depending on the embodiment while faster ramp ups may lead to less uniformity in heating. For example, it may be beneficial to minimize the time spent above a critical temperature (e.g. 250° C., e.g. 20 seconds may give significantly different results than 1 minute) and more particularly to ensure uniformity of time spent at high temperatures so as to enhanced uniformity of resulting bond characteristics. It is within the level of skill in the art to experimentally determine and optimize desirable ramp and dwell time parameters. Depending on the size of the probes, surface tension effects during reflow may or may not be sufficient to cause significant repositioning of probes. In some embodiments, alignment of probe bases in X and Y directions (i.e. directions parallel to the plane of the permanent substrate bonding pads) may be desirable while in other embodiments, it may be more beneficial, though more challenging, to align X and Y positions of probe tips (or alignment marks from probe tip layers) to bonding pad locations. Alignment based on tip positions may aid in allowing probes from different builds (with potentially different skew amounts and/or directions) to be used in conjunction with a common permanent substrate. In some embodiments, the heat flow between solder and heating elements may be as critical as the temperature and as such uniform coupling of heat to all portions of a substrate may be desirable. In some embodiments, it may be desirable to place the permanent substrate (e.g. space transformer) directly against a hot plate while in other embodiments, it may be more beneficial to space the substrate from a hot plate by a selected amount (e.g. via shims). In some embodiments it may be beneficial to take into consideration the warpage of the permanent substrate when considering the type of coupling to use. In some embodiments, it may be beneficial to heat solder from the permanent substrate side while in other embodiments, heating may occur from the temporary substrate or probe tip side of the probes. Coupling strategies may involve different media (e.g. conductive, non-conductive, liquid, or gaseous) and heating may occur, for example, via a convection oven, a hot plate, infrared radiation bombardment, or the like.

Metals such as nickel and alloys such as nickel-cobalt, and nickel phosphorus are commonly chosen for fabricating metallic micro-mechanical structures because of their excellent mechanical properties, ease of plating, and low cost. Nickel and nickel alloys are also the metals of choice for structural member fabrication of wafer probe structures where copper is chosen as a sacrificial metal. However, in this and certain other RF applications, their higher electrical resistivity is a serious shortcoming because the surface electrical conductivity of the metallic member largely determines the impedance of the circuit. Also, in applications such as wafer probes, the high contact resistance of nickel and its alloys may be a drawback. To overcome these issues, as discussed in some embodiments above, one can conformably coat the nickel structures with gold, for example, by well known electrolytic or electroless plating methods. In other embodiments, other high conductive coating may be appropriate. However, the as-deposited gold may not adhere well to the underlying nickel. The gold also tends to be very soft which, in applications such as wafer contact probes, may lead to gradually increasing contact resistance if gold is located on the contact tips of the probes and it wears off. Each of the embodiments discussed herein above, if not already explicitly set forth above, may be enhanced by inclusion of a conformable coating of a more highly conductive material on the surface of the probes. The coatings may be applied after formation of the probes and their release from sacrificial material or it may be applied during the formation of each layer form which the probes are formed.

The embodiments that include a coating of a higher conductivity material (e.g. gold), may be further enhanced by heat treating the coated structures in a hydrogen-containing atmosphere at relatively low temperatures for relatively short periods of time (e.g. between 150° C.-350° C. for 30 minutes to 2 hours). This may offer one more of the following benefits: (1) any nickel oxides present at the gold-nickel interface may be reduced to nickel; (2) some diffusion between the structural material and the coating material may occur which may promote enhanced adhesion between the structural material and the coating and even between structural material layers; and (3) alloying of the coating material and the structural material (e.g. gold with few atomic percent nickel) may significantly increase the hardness of gold and greatly improve its wear resistance. Such hardened coatings (e.g. gold with nickel or gold with cobalt) may be known as hard platings. It is well known in the electronics industry to form hard gold platings by co-depositing very small amounts of nickel (or cobalt) with gold, however, a significant draw back to forming hard gold plating in this manner involves the fact that the plating baths invariably use cyanide-based solutions which pose a significant environmental hazard. The heat treatment method of the present embodiment also negates the need for coating probe tips with exotic metals such as rhenium or rhodium as the hardened coating material may serve this function. The low temperature diffusion (150°-350° C.) of the present embodiment provides the desired low amount of structural material (e.g. nickel) diffusion into the coating material (e.g. gold). Excess diffusion could lead to significant increases in electrical resistivity of the probe. Also, at these lower temperatures the softening of the structural material is minimized.

In some embodiments of the invention (e.g. in the embodiments presented herein above, in variations of those embodiments, or in enhancements to those embodiments, one or more fluxes may be used during the solder bump reflow and/or bonding operations. When such fluxes are used, cleaning operations may be used to ensure the removal of any flux residues. These cleaning operations may be in addition to other cleaning operations that would be performed even if a flux were not used. Such cleaning operations may preferentially involve the use of megasonic cleaning as opposed to ultrasonic cleaning which may damage some delicate parts. During megasonic cleaning the parts being cleaned may be, for example, immersed in a solution containing a surfactant such as a 1% solution of Triton-X (from Genomic Soutions, Inc. of Ann Arbor Mich.). The enhanced cleaning operations may involve applying megasonic vibrations for extended periods of time (e.g. 60-180 minutes) and may involve varying the temperature of the solution during cleaning (e.g. a two step variation, continuous variation or discrete variations, variations that increase temperature with time, and the like), for example, and initial cleaning may occur for 90 minutes at room temperature followed by another 45 minutes of cleaning at an elevated temperature (e.g. 50° C.).

Various other embodiments of the present invention exist. Some of these embodiments may be based on a combination of the teachings herein with various teachings incorporated herein by reference. Some embodiments may not use any blanket deposition process and/or they may not use any mechanical planarization processes. Some embodiments may involve the selective deposition of a plurality of different materials on a single layer or on different layers. Some embodiments may use selective deposition processes or blanket deposition processes that are not electrodeposition processes. Some embodiments may use nickel or nickel alloys as a structural material while other embodiments may use different materials (e.g. gold, copper, aluminum, alloys of these materials, and the like). Some embodiments may use copper as the structural material with or without a sacrificial material. Some embodiments may remove all sacrificial material while other embodiments may not remove any sacrificial material or only a portion of a sacrificial material. Some embodiments may employ mask based selective etching operations in conjunction with blanket deposition operations. Some embodiments may form structures on a layer-by-layer basis but deviate from a strict planar layer on planar layer build up process in favor of a process that interlaces material between the layers. Such alternative build processes are disclosed in U.S. patent application Ser. No. 10/434,519, filed on May 7, 2003, entitled Methods of and Apparatus for Electrochemically Fabricating Structures Via Interlaced Layers or Via Selective Etching and Filling of Voids which is herein incorporated by reference as if set forth in full.

Furthermore, U.S. Application Nos. 60/533,975, filed Dec. 31, 2003; Ser. No. 11/434,493, filed May 7, 2003; and 60/533,948, filed Dec. 31, 2003; 60/540,510, filed Jan. 29, 2004; Ser. No. 11/028,945, filed Jan. 3, 2005; Ser. No. 10/772,943, filed Feb. 4, 2004; 60/445,186, filed Feb. 4, 2003; 60/506,015, filed Sep. 24, 2003; Ser. No. 10/434,493, filed May 7, 2003, and 60/379,177 filed May 7, 2002; 60/442,656, filed Jan. 23, 2003; 60/574,737, filed May 26, 2004; 60/582,689, filed Jun. 23, 2004; 60/582,690, filed Jun. 23, 2004; 60/609,719, filed Sep. 13, 2004; and 60/611,789, filed Sep. 20, 2004 are incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for bonding a first electric component to a second electric component, comprising:
   forming a plurality of solder bumps on the first electric component, wherein the solder bumps are surrounded, at least in part by rings of a retention material;
   bringing the solder bumps on the first electric component into contact with bonding locations on the second electric component;
   heating the solder bumps to cause melting and then cooling the melted solder to bond the first and second electric components together, wherein the separation between the first and second components is set larger than would have been achieved in similar circumstances in absence of the rings of the retention material,
   wherein one of the electric components comprises a plurality of compliant spring probes.

2. A method for bonding a first electric component to a second electric component, comprising:
   forming a plurality of solder bumps on the first electric component, wherein the solder bumps are surrounded, at least in part by rings of a retention material;
   reflowing the solder bumps such that the height of the reflowed solder is greater than it would be in absence of the rings of retention material;
   bringing the reflowed solder bumps on the first component into contact with bonding locations on a second electric component; and
   heating the reflowed solder bumps to cause melting and then cooling the reflowed solder bump to bond the first and second components together.

3. The method of claim 1 wherein the one of the electric components is divided into a plurality of separate compliant spring probes after bonding.

4. The method of claim 1 wherein the spring probes, after bonding, have a configuration and spacing appropriate for contacting pads on a semiconductor wafer containing integrated circuit components to be tested.

5. The method of claim 4 wherein the retention material comprises a solder mask that resists wetting by melted solder.

6. The method of claim 5 wherein the solder mask is comprised of a dielectric material.

7. The method of claim 6 wherein the dielectric material comprises a photoresist.

8. The method of claim 5 wherein the solder mask comprises a refractory material.

9. The method of claim 8 wherein the solder mask comprises a material selected from the group consisting of (1) titanium, (2) a titanium tungsten (TiW) alloy, and (3) silicon dioxide.

10. The method of claim 2 wherein one of the electric components comprises a plurality of compliant spring probes.

11. The method of claim 10 wherein the one of the electric components is divided into a plurality of separate compliant spring probes after bonding.

12. The method of claim 10 wherein the spring probes, after bonding, have a configuration and spacing appropriate for contacting pads on a semiconductor wafer containing integrated circuit components to be tested.

13. The method of claim 12 wherein the retention material comprises a solder mask that resists wetting by melted solder.

14. The method of claim 13 wherein the solder mask is comprised of a dielectric material.

15. The method of claim 14 wherein the dielectric material comprises a photoresist.

16. The method of claim 13 wherein the solder mask comprises a refractory material.

17. The method of claim 16 wherein the solder mask comprises a material selected from the group consisting of (1) titanium, (2) a titanium tungsten (TiW) alloy, and (3) silicon dioxide.

* * * * *